(12) United States Patent
Downs et al.

(10) Patent No.: US 12,046,981 B2
(45) Date of Patent: Jul. 23, 2024

(54) ELECTRIC DRIVE UNIT WITH ENCAPSULATED FIELD WINDINGS AND SEAL MEMBER

(71) Applicant: AMERICAN AXLE & MANUFACTURING, INC., Detroit, MI (US)

(72) Inventors: James P. Downs, South Lyon, MI (US); Paul J. Valente, Berkley, MI (US)

(73) Assignee: AMERICAN AXLE & MANUFACTURING, INC., Detroit, MI (US)

(*) Notice: Subject to any disclaimer, the term of this patent is extended or adjusted under 35 U.S.C. 154(b) by 0 days.

(21) Appl. No.: 17/878,459

(22) Filed: Aug. 1, 2022

(65) Prior Publication Data

US 2022/0393522 A1 Dec. 8, 2022

Related U.S. Application Data

(63) Continuation of application No. PCT/US2022/019900, filed on Mar. 11, 2022.
(Continued)

(51) Int. Cl.
*H02K 1/16* (2006.01)
*H02K 1/20* (2006.01)
(Continued)

(52) U.S. Cl.
CPC ............. *H02K 5/225* (2013.01); *H02K 5/18* (2013.01); *H02K 11/30* (2016.01); *H02K 11/33* (2016.01);
(Continued)

(58) Field of Classification Search
CPC ............. H02K 1/16; H02K 1/20; H02K 5/124
See application file for complete search history.

(56) References Cited

U.S. PATENT DOCUMENTS 4,184,090 A * 1/1980 Taiani .................. B63G 1/00
310/104
5,587,882 A 12/1996 Patel
(Continued)

FOREIGN PATENT DOCUMENTS

CN 108599470 9/2018
CN 110401397 A 11/2019
(Continued)

OTHER PUBLICATIONS

PCT International Search Report dated Jun. 27, 2022 for corresponding PCT application No. PCT/US2022/019900, filed Mar. 11, 2022.
(Continued)

*Primary Examiner* — Tulsidas C Patel
*Assistant Examiner* — Robert E Mates
(74) *Attorney, Agent, or Firm* — Reising Ethington P.C.

(57) ABSTRACT

An electric drive unit having an electric motor, which has a rotor and a stator that includes a stator core and field windings, a housing assembly into which the electric motor is received, and a seal member. The stator core defines a plurality of stator cooling passages that extend longitudinally through the stator core. Each of the field windings has a protruding portion that extends from an axial end of the stator core. The protruding portions are encapsulated in a plastic material. The housing assembly has an annular wall member that defines a seal groove. The seal member is received in the seal groove and forms a seal between the annular wall member and the plastic encapsulation on the protruding portion of the field windings. A coolant is circulated through the stator cooling channels, and the seal member inhibits ingress of the coolant between the stator and the rotor.

8 Claims, 44 Drawing Sheets

Related U.S. Application Data

(60) Provisional application No. 63/209,588, filed on Jun. 11, 2021, provisional application No. 63/161,164, filed on Mar. 15, 2021.

(51) Int. Cl.
  *H02K 5/124* (2006.01)
  *H02K 5/18* (2006.01)
  *H02K 5/22* (2006.01)
  *H02K 11/30* (2016.01)
  *H02K 11/33* (2016.01)
  *H01L 23/367* (2006.01)
  *H02K 19/10* (2006.01)
  *H02M 7/00* (2006.01)
  *H02P 27/06* (2006.01)

(52) U.S. Cl.
  CPC .............. *H01L 23/367* (2013.01); *H02K 1/16* (2013.01); *H02K 1/20* (2013.01); *H02K 5/124* (2013.01); *H02K 19/10* (2013.01); *H02M 7/003* (2013.01); *H02P 27/06* (2013.01)

(56) References Cited

U.S. PATENT DOCUMENTS

| | | | |
|---|---|---|---|
| 6,930,417 | B2 | 8/2005 | Kaneko et al. |
| 7,525,224 | B2 | 4/2009 | Takenaka et al. |
| 7,641,490 | B2 | 1/2010 | Korich et al. |
| 7,775,060 | B2 | 8/2010 | Nakajima et al. |
| 8,937,414 | B2 | 1/2015 | Song et al. |
| 9,030,063 | B2 | 5/2015 | Rawlinson et al. |
| 9,692,277 | B2 | 6/2017 | Pearce, Jr. et al. |
| 10,236,791 | B1 | 3/2019 | Chung et al. |
| 10,411,574 | B2 | 9/2019 | Nakashima et al. |
| 10,464,439 | B2 | 11/2019 | Liu et al. |
| 10,615,707 | B2 | 4/2020 | Iwagami et al. |
| 10,696,149 | B2 | 6/2020 | Pearce, Jr. et al. |
| 11,098,733 | B2 | 8/2021 | Guntermann et al. |
| 11,303,183 | B2 | 4/2022 | Downs et al. |
| 2003/0200761 | A1 | 10/2003 | Funahashi et al. |
| 2005/0211490 | A1 | 9/2005 | Shimizu et al. |
| 2008/0309091 | A1* | 12/2008 | Hahlbeck ............... H02K 7/116 290/55 |
| 2012/0040795 | A1 | 2/2012 | Platt et al. |
| 2012/0098391 | A1 | 4/2012 | Yamasaki et al. |
| 2013/0278090 | A1 | 10/2013 | Matsuo |
| 2013/0285485 | A1* | 10/2013 | Song ..................... B60L 3/0061 310/53 |
| 2014/0265659 | A1 | 9/2014 | Chamberlin et al. |
| 2016/0105081 | A1 | 4/2016 | Bradfield |
| 2016/0172939 | A1 | 6/2016 | Owen |
| 2016/0276895 | A1 | 9/2016 | Aizawa et al. |
| 2016/0285335 | A1 | 9/2016 | Watanabe et al. |
| 2017/0077779 | A1 | 3/2017 | Hanioka et al. |
| 2017/0331356 | A1 | 11/2017 | Nakashima |
| 2019/0331132 | A1 | 10/2019 | Guntermann |
| 2020/0149624 | A1 | 5/2020 | Hata et al. |
| 2020/0227334 | A1 | 7/2020 | Hart et al. |
| 2020/0331343 | A1 | 10/2020 | Takahashi et al. |
| 2020/0388941 | A1* | 12/2020 | Siddiqui ................ H01R 9/223 |
| 2021/0066157 | A1 | 3/2021 | Manninen et al. |
| 2022/0037954 | A1 | 2/2022 | Downs et al. |
| 2022/0190655 | A1* | 6/2022 | Wehlen .................. H02K 1/185 |

FOREIGN PATENT DOCUMENTS

| | | | |
|---|---|---|---|
| CN | 110406349 A | 11/2019 | |
| DE | 102017214490 | 2/2019 | |
| DE | 102018111624 | 11/2019 | |
| DE | 102019205762 A1 * | 10/2020 | ............ H02K 1/185 |
| GB | 2574018 | 11/2019 | |
| GB | 2574019 | 11/2019 | |
| GB | 2574020 | 11/2019 | |
| JP | 2001060750 | 3/2001 | |
| JP | 2008184111 | 8/2008 | |
| JP | 2012074440 | 4/2012 | |
| JP | 2016144382 | 8/2016 | |
| KR | 1020140057032 | 5/2014 | |
| TW | 201722040 A | 6/2017 | |
| WO | WO20200160785 | 8/2020 | |
| WO | WO-2020219955 A1 * | 10/2020 | ....... H01L 23/49568 |
| WO | WO20200209324 | 10/2020 | |
| WO | WO20200219955 | 10/2020 | |

OTHER PUBLICATIONS

On SEMICONDUCTOR®, NTB5860NL, NTP5860NL, NVB5860NL, N-Channel Power MOSFET Information pages, Semiconductor Components Industries, LLC, Aug. 2012, 9 pages.

CN Office Action for CN Application No. 202280034841.7 dated May 11, 2024 (6 pages).

* cited by examiner

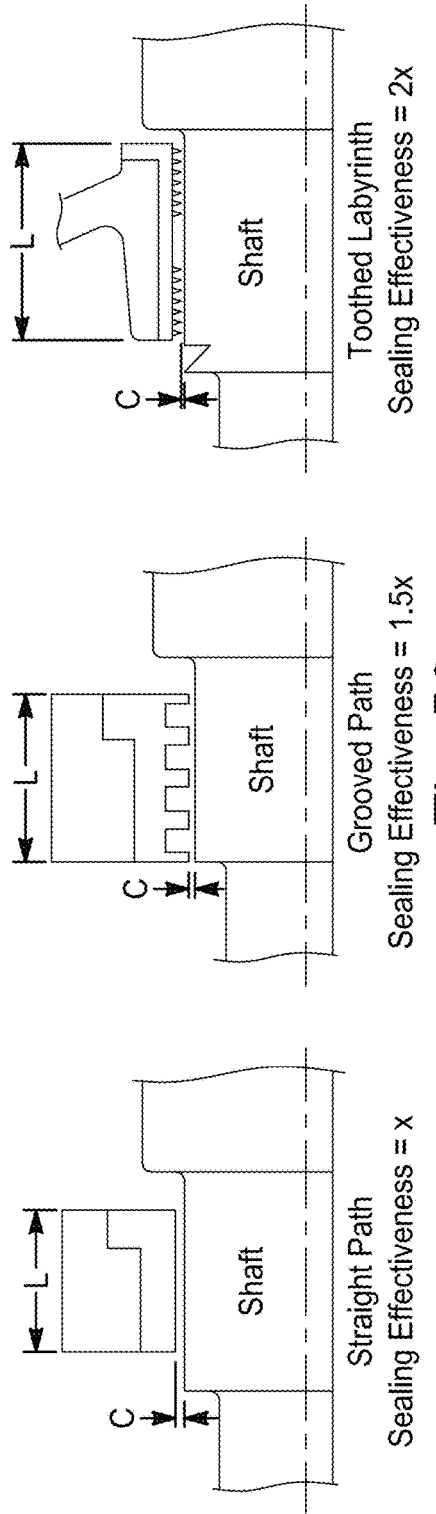
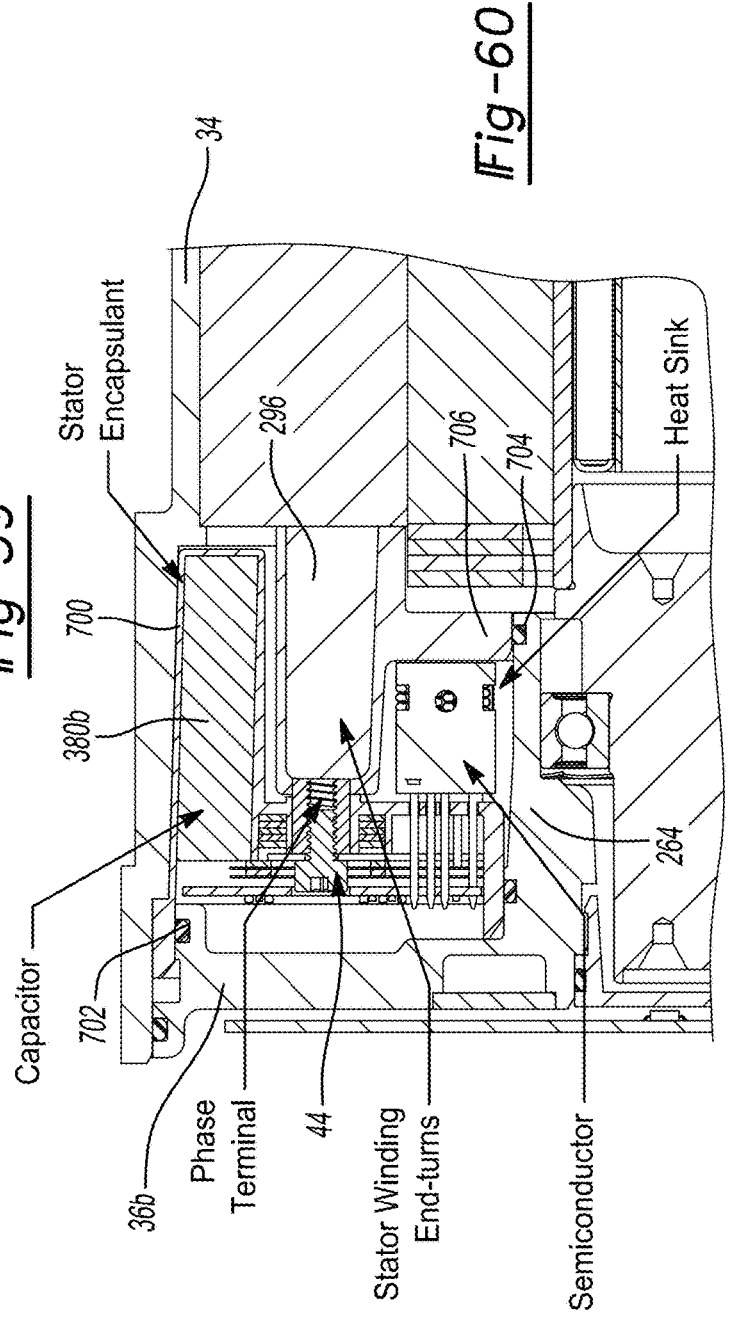

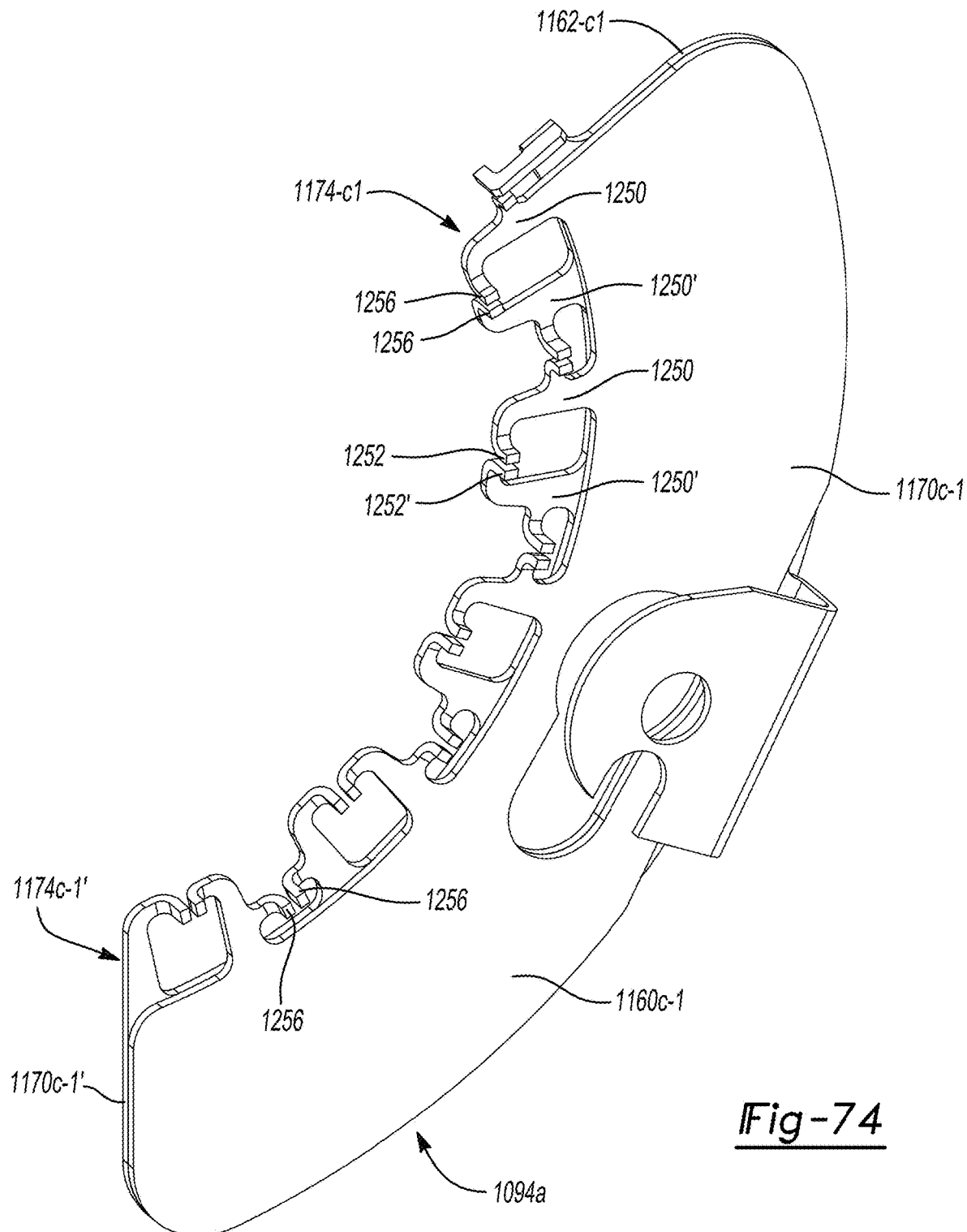

ELECTRIC DRIVE UNIT WITH ENCAPSULATED FIELD WINDINGS AND SEAL MEMBER

CROSS-REFERENCE TO RELATED APPLICATIONS

This application is a bypass continuation of International Patent Application No. PCT/US2022/019900 filed Mar. 11, 2022, which claims the benefit of U.S. Provisional Application No. 63/161,164 filed Mar. 15, 2021 and U.S. Provisional Patent Application No. 63/209,588 filed Jun. 11, 2021. Each of the disclosures of the above-mentioned patent applications is incorporated by reference as if fully set forth in detail herein.

FIELD

The present disclosure relates to an electric drive unit.

BACKGROUND

This section provides background information related to the present disclosure which is not necessarily prior art.

While there is increasing interest in the electrification of vehicle drivelines, there are significant issues that must be overcome before vehicles with electrified drivelines substantially displace vehicle drivelines that are powered solely by internal combustion engines. Some of these issues include the cost of the electrified driveline, the volume of the electrified driveline and its ability to be packaged into available space within a vehicle, as well as the robustness of the electronics that are employed to operate and control the electrified driveline.

SUMMARY

This section provides a general summary of the disclosure, and is not a comprehensive disclosure of its full scope or all of its features.

In one form, the present disclosure provides an electric drive unit that includes a multi-phase electric motor and an inverter. The multi-phase electric motor has a stator, which includes a stator core and a plurality of field windings, and a rotor. Each of the field windings is associated with a corresponding phase of electrical power. The rotor is rotatable relative to the stator about a motor axis. The inverter has a plurality of power semiconductors, an inverter mount, and a plurality of busbars. Each of the power semiconductors has a plurality of terminals. The inverter mount has a base. The power semiconductors are mounted to the base of the inverter mount such that the terminals extend through the base and the power semiconductors are arranged in an annular manner. Each of the busbars has a first busbar portion and a second busbar portion. The first busbar portion has a first body and a set of first fingers that are fixedly coupled to the first body. The second busbar portion has a second body and a set of second fingers that are fixedly coupled to the second body. Each of the fingers in the set of first fingers and a corresponding one of the fingers in the set of second fingers of each of the busbars is mechanically and electrically coupled to opposite sides of a corresponding one of the terminals of the power semiconductors. The busbars include a positive busbar, a ground busbar, and a plurality of phase busbars. Each of the phase busbars is mechanically and electrically coupled to an associated one of the field windings.

In another form, the present disclosure provides an electric drive unit that includes a housing assembly, a motor, a transmission, a first output shaft and a bearing. The housing assembly defines a first output shaft bore and a sump. The motor and the transmission are received in the housing assembly and the transmission is driven by the motor. The first output shaft is driven by the transmission and extends through the first output shaft bore. The bearing is received in the first output shaft bore and supports the first output shaft for rotation relative to the housing assembly about an axis. A lubricant supply gallery is formed through the housing and intersects the first output shaft bore. The first output shaft bore is tapered in a direction along the axis to promote draining of lubricant in the first output shaft bore to the sump.

In yet another form, the present disclosure provides an electric drive unit that includes a housing assembly, a motor, a transmission, a first output shaft and an inverter. The housing assembly defines a capacitor cavity and a first output shaft bore. The motor is received in the housing assembly. The transmission received in the housing assembly and is driven by the motor. The first output shaft is driven by the transmission and extends through the output shaft bore. The inverter is housed in the housing assembly and is electrically coupled to the motor. The inverter includes a field capacitor that is received in the capacitor cavity. The housing assembly includes a heat sink that is disposed in the capacitor cavity. The heat sink is configured to receive heat that is rejected from the field capacitor.

In still another form, the present disclosure provides an electric drive unit that includes a housing assembly, a motor, a bearing holder and a motor output shaft bearing. The housing assembly has a motor housing, which defines a motor cavity, and a motor housing cover that is coupled to the motor housing to close an open end of the motor cavity. The motor is received in the motor cavity and includes a stator and a rotor. The rotor includes a motor output shaft. The bearing holder is fixedly coupled to the motor housing cover and is disposed about an axial end of the motor output shaft. The motor output shaft bearing is engaged to the bearing holder and the motor output shaft.

In another form, the present disclosure provides an electric drive unit that includes a housing assembly, an electric motor, a transmission, a differential assembly, a differential bearing, a differential bearing cover, a spacer and an output shaft. The housing assembly has a motor housing, which defines a motor cavity, a gearbox and a gearbox cover. The gearbox is coupled to the motor housing, while the gearbox cover is coupled to the gearbox. The gearbox and the gearbox cover cooperate to form a gearbox cavity. The electric motor is received in the motor housing and includes a stator, which is fixedly coupled to the motor housing, and a rotor that is rotatable relative to the stator. The rotor includes a motor output shaft. The transmission is at least partly disposed in the gearbox cavity and includes a transmission input gear, which is coupled to the motor output shaft for rotation therewith, and a transmission output gear that is rotatable about an output axis. The differential assembly is disposed in the gearbox cavity and includes a differential input member, which is coupled to the transmission output gear for rotation therewith about the output axis, and a pair of differential output members. The differential bearing is received between the gearbox cover and the differential input member and supports the differential input member for rotation about the output axis relative to the gearbox cover. The differential bearing cover has a flange, which is mounted to an exterior side of the gearbox cover, and a piloting portion having an annular shape and being fixedly coupled to the flange. The spacer is disposed along the output axis between an outer bearing race of the differential bearing and an axial end of the piloting portion that is opposite the flange. The output shaft is received through the piloting portion and the spacer and is drivingly coupled to one of the differential output members.

In yet another form, the present disclosure provides an electric drive unit that includes a housing assembly, an electric motor, a transmission, a pair of first intermediate gear bearings, a pair of retaining rings and a bearing cover. The housing assembly has a housing member with an external surface. A pair of shaft bores are formed through the external surface, and a pair of counterbores are formed in the external surface. Each of the counterbores is concentric with a corresponding one of the shaft bores and forms an annular shoulder. The electric motor received in the housing assembly. The transmission is received in the housing member and includes a transmission input gear, which is driven by the electric motor, a transmission output gear, and a plurality of intermediate gears in a drive train between the transmission input gear and the transmission output gear. The plurality of intermediate gears include a pair of compound gears, each of which having first and second intermediate gears that are fixedly coupled to an intermediate gear shaft. Each of the first intermediate gears is meshingly engaged to the transmission input gear. Each of the first intermediate gear bearings is received in a corresponding one of the shaft bores and supports an associated one of the intermediate gear shafts for rotation about a respective axis relative to the housing member. Each of the first intermediate gear bearings has an outer bearing race. A retaining ring groove is formed into an outer circumferential surface of each of the outer bearing races. Each of the retaining rings is received in the retaining ring groove in a corresponding one of the outer bearing races and abuts a corresponding one of the shoulders. The bearing cover is mounted to the housing member to close the counterbores. The bearing cover defines two sets of pads. Each set of pads is abutted against an axial end face of an associated one of the intermediate gear bearings and is configured to limit movement of the associated one of the intermediate gear bearings in a direction away from the housing member.

In still another form, the present disclosure provides an electric drive unit that includes a housing assembly, an electric motor, a transmission, a differential assembly, a differential bearing and a trough. The housing assembly has a motor housing, which defines a motor cavity, a gearbox and a gearbox cover. The gearbox is coupled to the motor housing, while the gearbox cover is coupled to the gearbox. The gearbox and the gearbox cover cooperate to form a gearbox cavity. A portion of the gearbox cavity is employed as a sump for holding a liquid lubricant. The electric motor is received in the motor housing and includes a stator, which is fixedly coupled to the motor housing, and a rotor that is rotatable relative to the stator. The rotor includes a motor output shaft. The transmission is at least partly disposed in the gearbox cavity and includes a transmission input gear, which is coupled to the motor output shaft for rotation therewith, and a transmission output gear that is rotatable about an output axis. A portion of the transmission output gear extends into the sump. The differential assembly is disposed in the gearbox cavity and includes a differential input member, which is coupled to the transmission output gear for rotation therewith about the output axis, and a pair of differential output members. The differential bearing is received between the gearbox cover and the differential input member. The differential bearing supports the differential input member for rotation about the output axis relative to the gearbox cover. The trough is mounted to at least one of the gearbox and the gearbox cover. The trough is received about the portion of the transmission output gear that extends into the sump.

In another form, the present disclosure provides an electric drive unit that includes an electric motor, a housing assembly and a seal member. The electric motor is received in the housing assembly and has a stator and a rotor. The stator includes a stator core and a plurality of field windings. The stator core defines a plurality of stator cooling passages that extend longitudinally through the stator core. Each of the field windings is associated with a corresponding phase of electrical power. The field windings has a protruding portion that extend from an axial end of the stator core. The protruding portion is encapsulated in a plastic material. The rotor is rotatable relative to the stator about a motor axis. The housing assembly has an annular wall member that defines a seal groove. The seal member is received in the seal groove and forms a seal between the annular wall member and the plastic encapsulation on the protruding portion of the field windings. A liquid coolant is circulated through the stator cooling channels. The seal member inhibits ingress of the liquid coolant between the stator and the rotor.

In another form, the present disclosure provides an electric drive unit that includes a housing assembly, an electric motor, a transmission, and a first output shaft. The housing assembly has a motor housing and a gearbox. The motor housing defines a stator bore that is disposed concentrically about a motor axis. The stator bore is defined by a radius. The gearbox being coupled to the motor housing. The housing assembly defines an output shaft bore that extends through the gearbox and the motor housing along an output axis that is offset from and parallel to the motor axis. The electric motor has a stator and a rotor that is rotatable relative to the stator. The stator is received into the stator bore and is engaged to the motor housing. The rotor includes a motor output shaft. The transmission is at least partly disposed in the gearbox and includes a transmission input gear, which is coupled to the motor output shaft for rotation therewith, and a transmission output gear that is rotatable about the output axis. The first output shaft is driven by the transmission and is disposed in the output shaft bore. A distance between the motor axis and the output shaft bore is less than the radius of the stator bore.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 23 is a view similar to that of FIG. 23 but with the end cover removed to illustrate the motor housing cover in more detail;

FIG. 59 are section views of exemplary, commercially-available non-contact seals;

FIGS. 60 and 61 are section views of portions of another electric drive unit constructed in accordance with the teachings of the present disclosure, the views illustrating portions of an electric motor, an inverter and an annular field capacitor;

FIG. 74 is a perspective view of the phase busbar of FIG. 73.

Corresponding reference numerals indicate corresponding parts throughout the several views of the drawings.

DETAILED DESCRIPTION

The patent application file contains at least one drawing executed in color. Copies of the patent application with color drawings will be provided by the office upon request and payment of the necessary fee.

Figure 1:
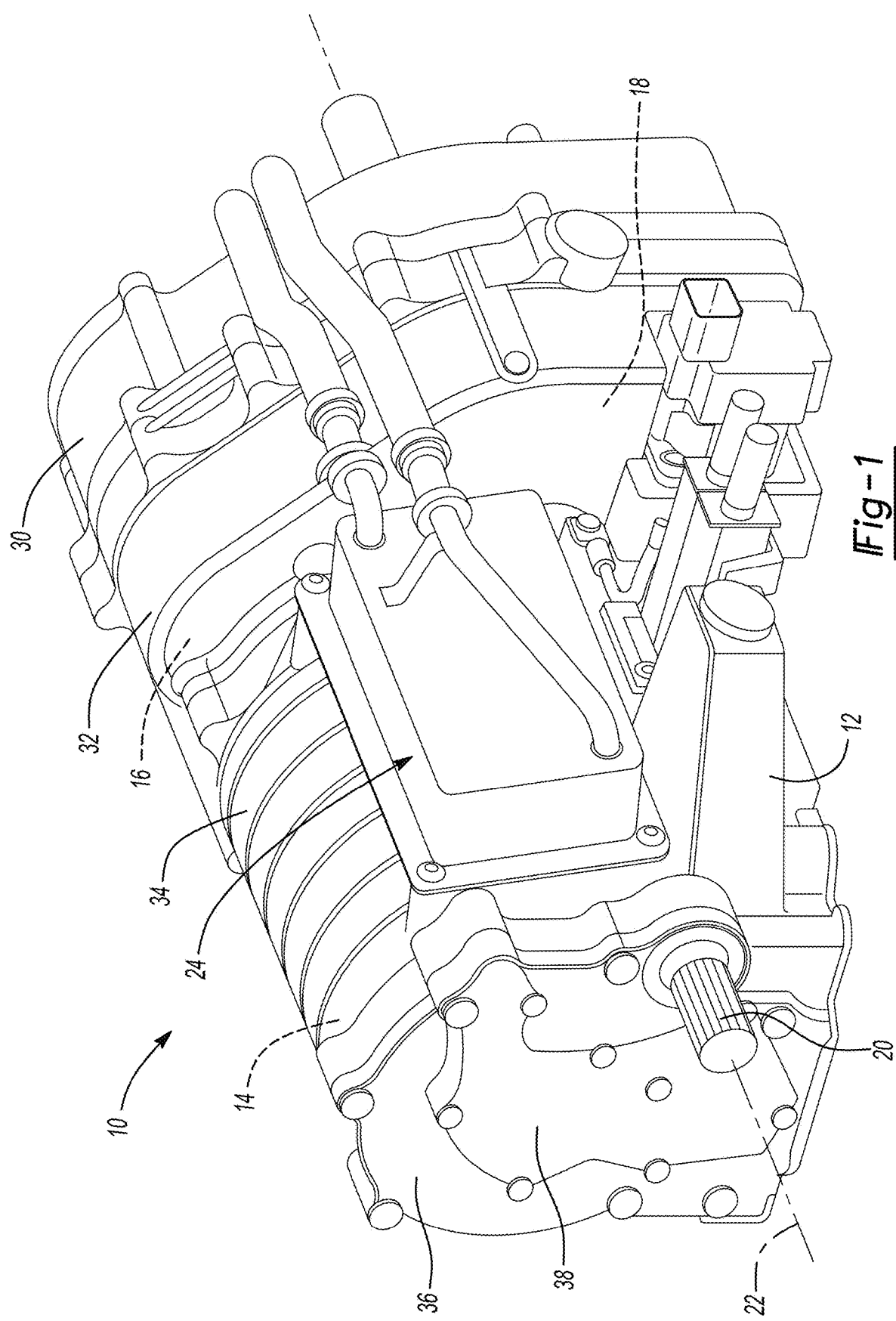
FIG. 1 is a perspective view of an exemplary electric drive unit constructed in accordance with the teachings of the present disclosure.
Figure 2:
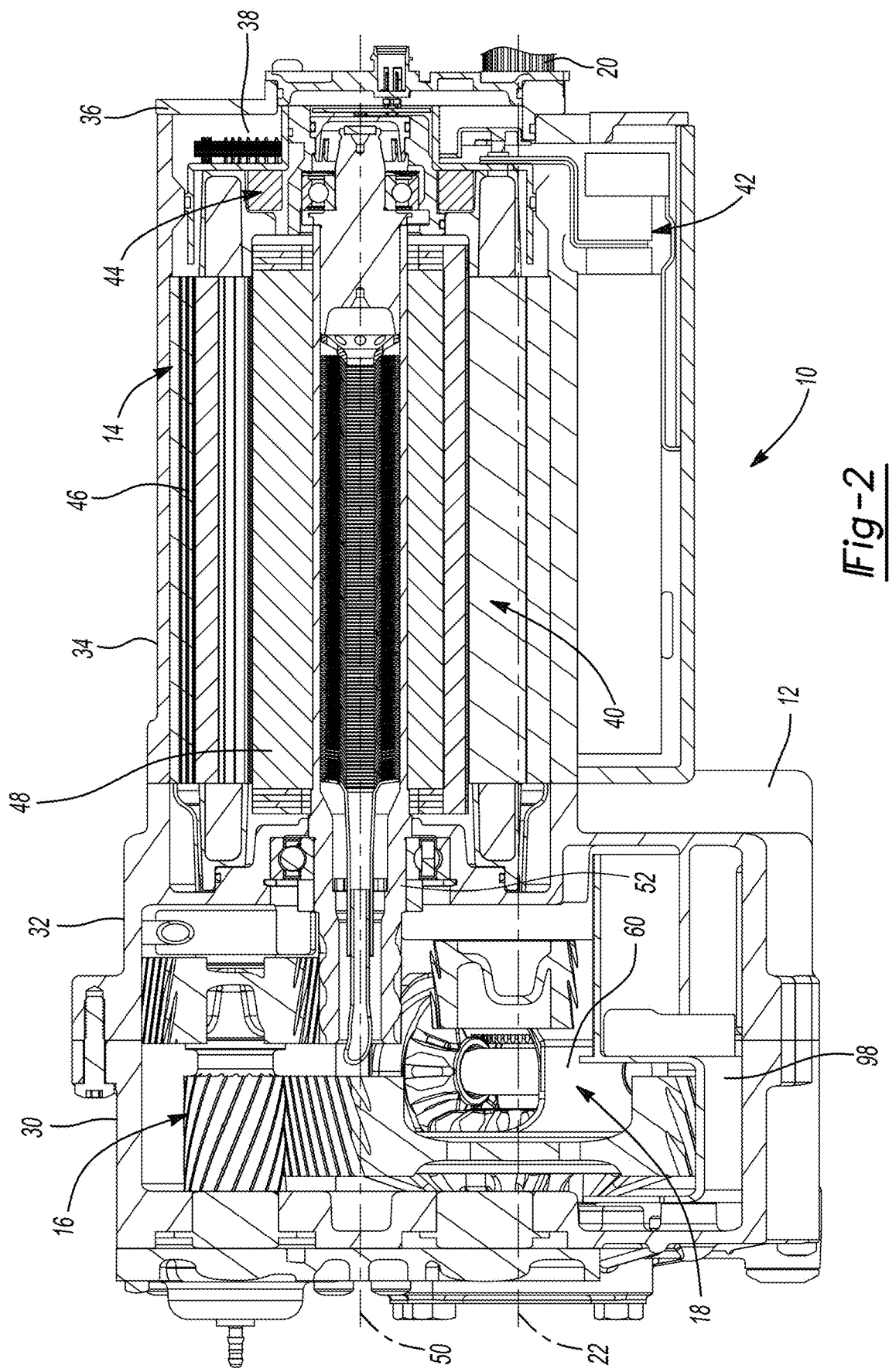
FIG. 2 is a longitudinal section view of the electric drive unit of FIG. 1 taken along a rotational axis of an electric motor.

In FIGS. 1 and 2, an exemplary electric drive unit constructed in accordance with the teachings of the present disclosure is generally indicated by reference numeral 10. Components, aspects, features and functions of the electric drive unit 10 that are not expressly described herein or shown (partly or fully) in the accompanying drawings, could be configured or function in a manner that is similar to the components, aspects, features and/or functions of electric drive units that are described in co-pending U.S. patent application Ser. No. 16/751,596 filed Jan. 24, 2020, U.S. patent application Ser. No. 16/865,912 filed May 4, 2020, U.S. patent application Ser. No. 17/128,288 filed Dec. 21, 2020, International Patent Application No. PCT/US2020/029925 filed Apr. 24, 2020, International Patent Application No. PCT/US2020/062541 filed Nov. 30, 2020, and/or U.S. Provisional Patent Application No. 63/159,511 filed Mar. 11, 2021, the disclosures of which are incorporated by reference as if fully set forth in detail herein. In brief, the electric drive unit 10 includes a housing assembly 12, a motor assembly 14, a transmission 16, a differential assembly 18, a pair of output shafts 20, which are rotatable about an output axis 22, and a lubrication and cooling system 24.

The housing assembly 12 can define one or more cavities (not specifically shown) in which the motor assembly 14, the transmission 16, the differential assembly 18, and the output shafts 20 can be at least partly housed. In the example shown, the housing assembly 12 includes a gearbox cover 30, a gearbox 32, a motor housing 34, a motor housing cover 36 and an end cover 38. The gearbox cover 30 and the gearbox 32 abut one another and form a cavity into which the transmission 16 and the differential assembly 18 are received, while the gearbox 32, the motor housing 34 and the motor housing cover 36 abut one another to form a cavity into which the motor assembly 14 is received.

With specific reference to FIG. 2, the motor assembly 14 comprises an electric motor 40, and a motor control unit 42 that includes an inverter 44. The electric motor 40 can be a multi-phase electric motor and includes a stator 46 and a rotor 48 that is rotatable about a motor output axis 50. The stator has a stator core and a plurality of field windings that are wound about the stator core. Each of the field windings is associated with a corresponding phase of electrical power. The rotor 48 includes a motor output shaft 52.

Figure 3:
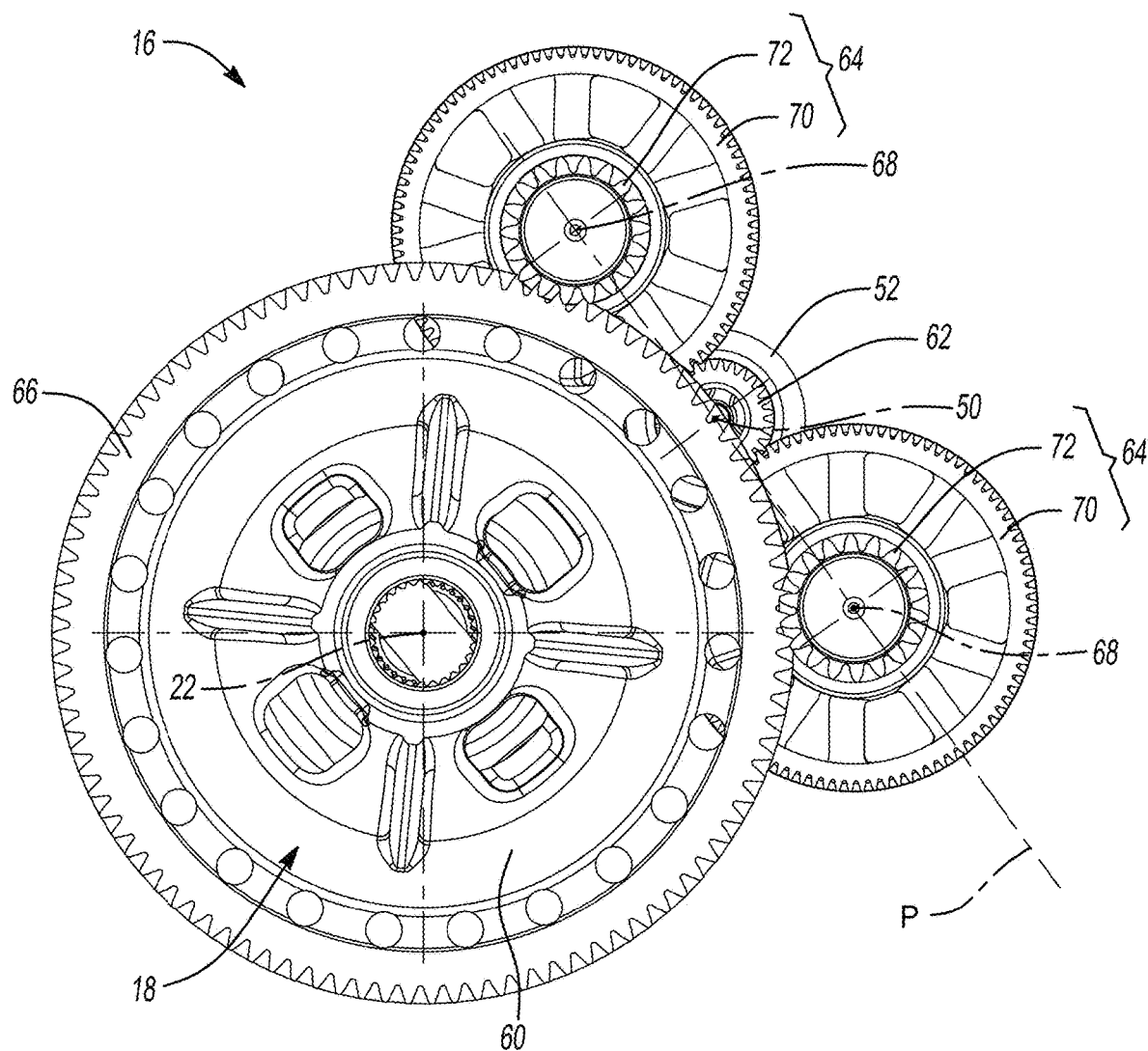
FIGS. 3 and 4 are elevation and perspective views, respectively, of portions of the electric drive unit of FIG. 1 illustrating a transmission and a differential assembly in more detail.

With reference to FIGS. 2 and 3, the transmission 16 can be configured in any desired manner to transmit rotary power between the motor output shaft 52 and a differential input member 60 of the differential assembly 18. The transmission 16 could comprise one or more fixed reductions of any desired type, or could be configured as a multi-speed transmission having two or more alternately engagable reductions (and optionally one or more fixed reductions). The fixed or multi-speed reductions could be configured in any desired manner to permit the rotational axis of the motor output shaft to be oriented relative to the output axis 22 in a desired manner (e.g., parallel and offset, coincident, transverse, perpendicular, skewed).

Figure 4:
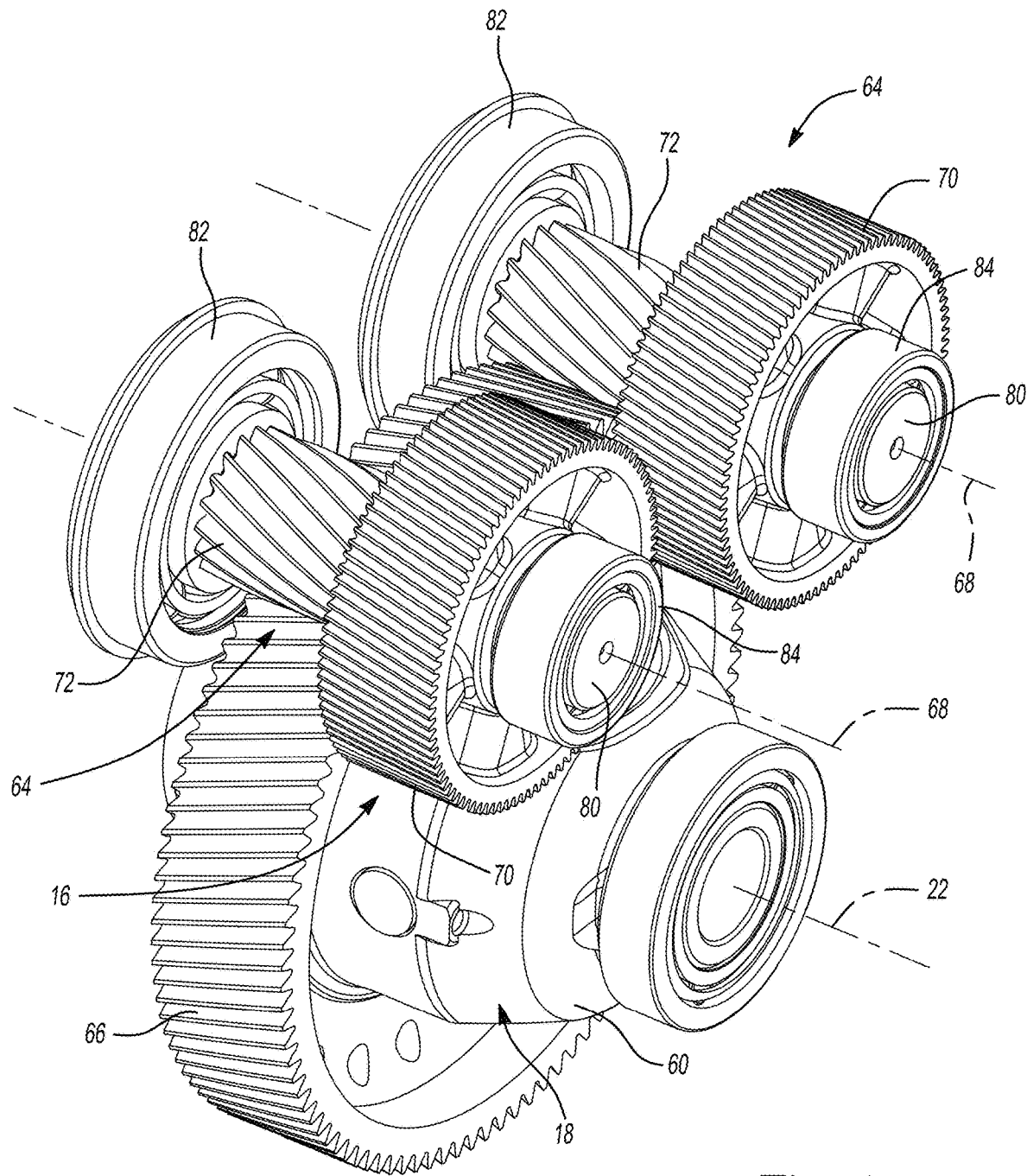

In the example illustrated in FIGS. 3 and 4, the transmission 16 is a single-speed, multi-stage transmission employing a plurality of helical gears. The transmission 16 comprises a transmission input gear 62, which is coupled for rotation with the motor output shaft 52, a pair of compound gears 64 and a transmission output gear 66. Each of the compound gears 64 is rotatable about an axis 68 that is parallel to and offset from the motor output axis 50 and can include a first reduction gear 70, which can be meshingly engaged to the transmission input gear 62, and a second reduction gear 72 that is coupled to the first reduction gear 70 for rotation therewith and meshingly engaged to the transmission output gear 66.

Figure 5:
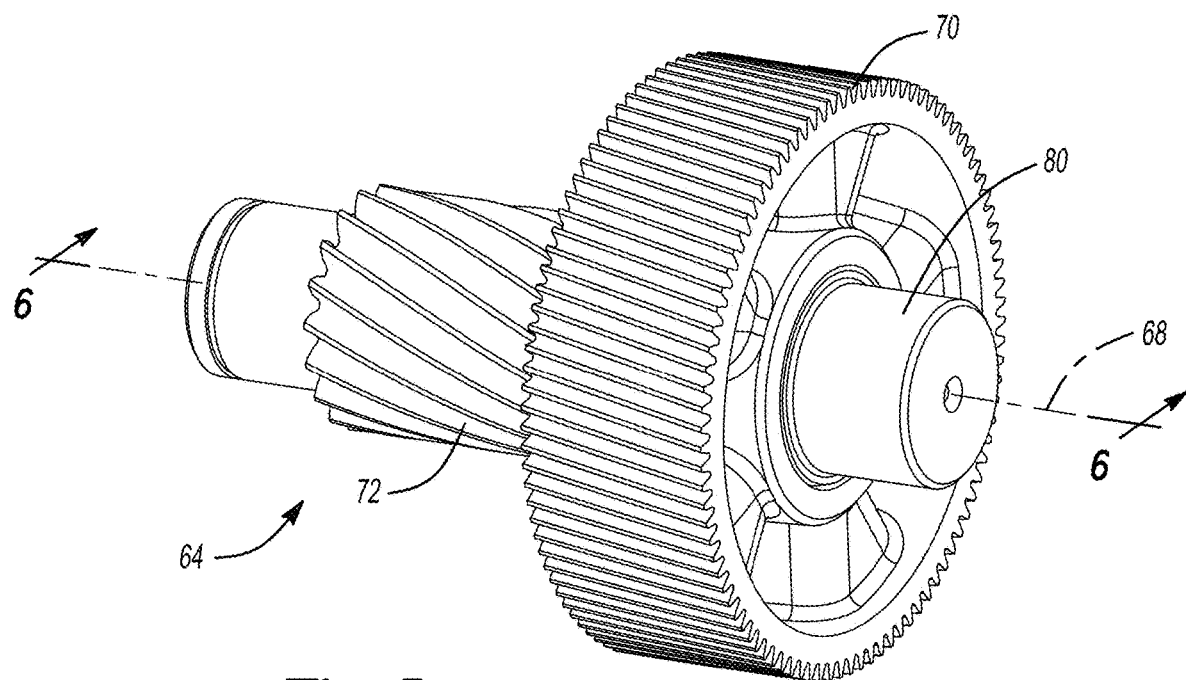
FIG. 5 is a perspective view of a portion of the transmission, illustrating a compound gear in more detail.
Figure 6:
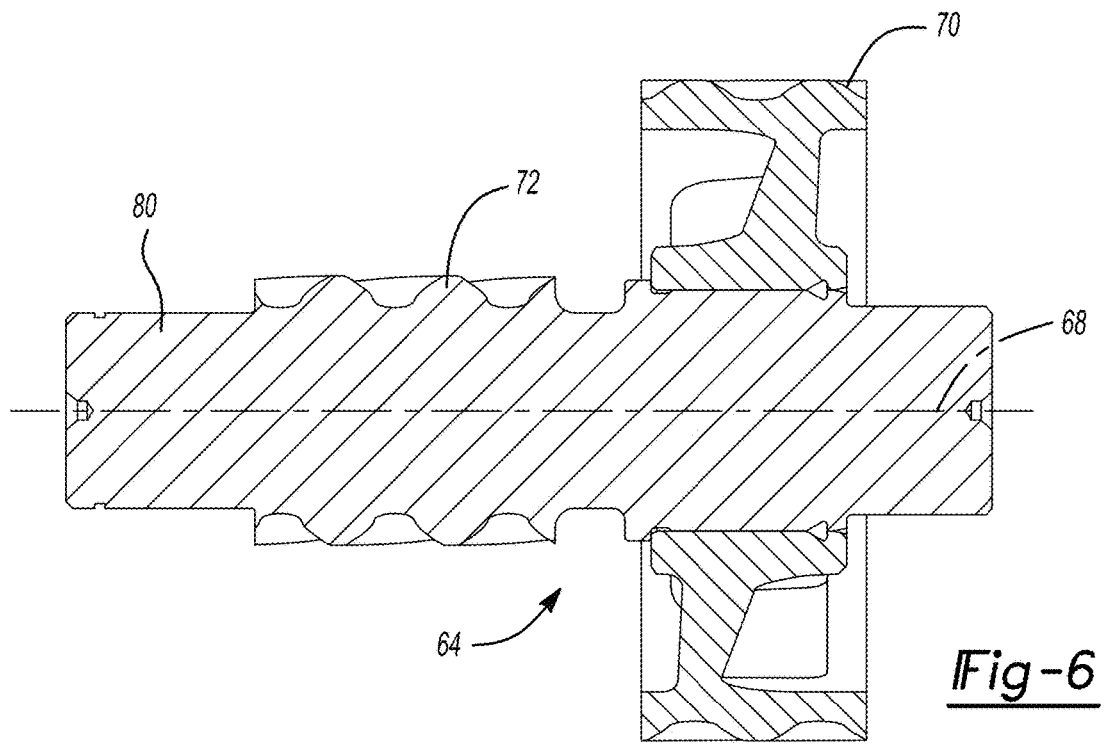
FIG. 6 is a section view taken along the line 6-6 of FIG. 5.

With reference to FIGS. 5 and 6, each of the compound gears 64 can be configured such that the second reduction gear 72 is integrally and unitarily formed with a shaft member 80 and the first reduction gear 70 is rotationally coupled to the shaft member 80 in a desired manner, such as by laser welding. It will be appreciated, however, that the shaft member 80 could be integrally and unitarily formed with the first reduction gear 70 or could be a discrete component to which both the first and second reduction gears 70 and 72 are rotationally coupled. The shaft member 80 can extend axially outwardly from each of the first and second reduction gears 70 and 72. In the particular example provided, the shaft member 80 and the second reduction gear 72 are identical components in each of the compound gears 64. It will be appreciated, however, that the shaft member 80 and the second reduction gear 72 could be unique for each of the compound gears 64, or that the compound gears 64 (i.e., the first and second reduction gears 70 and 72 and the shaft member 80 in the example provided) could be identical.

Returning to FIGS. 3 and 4, the first reduction gears 70 can be disposed in counterphase with respect to one another. In this regard, one of the first reduction gears 70 can be positioned such that one of its teeth is received between and centered between two adjacent teeth on the transmission input gear 62, and one of the teeth of the transmission input gear 62 is disposed between two adjacent teeth on the other one of the first reduction gears 70. It will be appreciated, however, that the other phasing could be employed, and that the teeth of both of the first reduction gears 70 could be in-phase with one another. The second reduction gears 72 can be disposed in-phase with one another. In this regard, one of the teeth on a first one of the second reduction gears 72 is received and centered between a first pair of adjacent teeth on the transmission output gear 66, while at the same time one of teeth on the second one of the second reduction gears 72 is received and centered between a second pair of adjacent teeth on the transmission output gear 66. It will be appreciated, however, that other phasing could be employed, that the teeth of the second reduction gears 72 could be in a counter-phase orientation with one another, and that the phasing of the second reduction gears 72 can be the same or different from the phasing of the first reduction gears 70.

Figure 7:
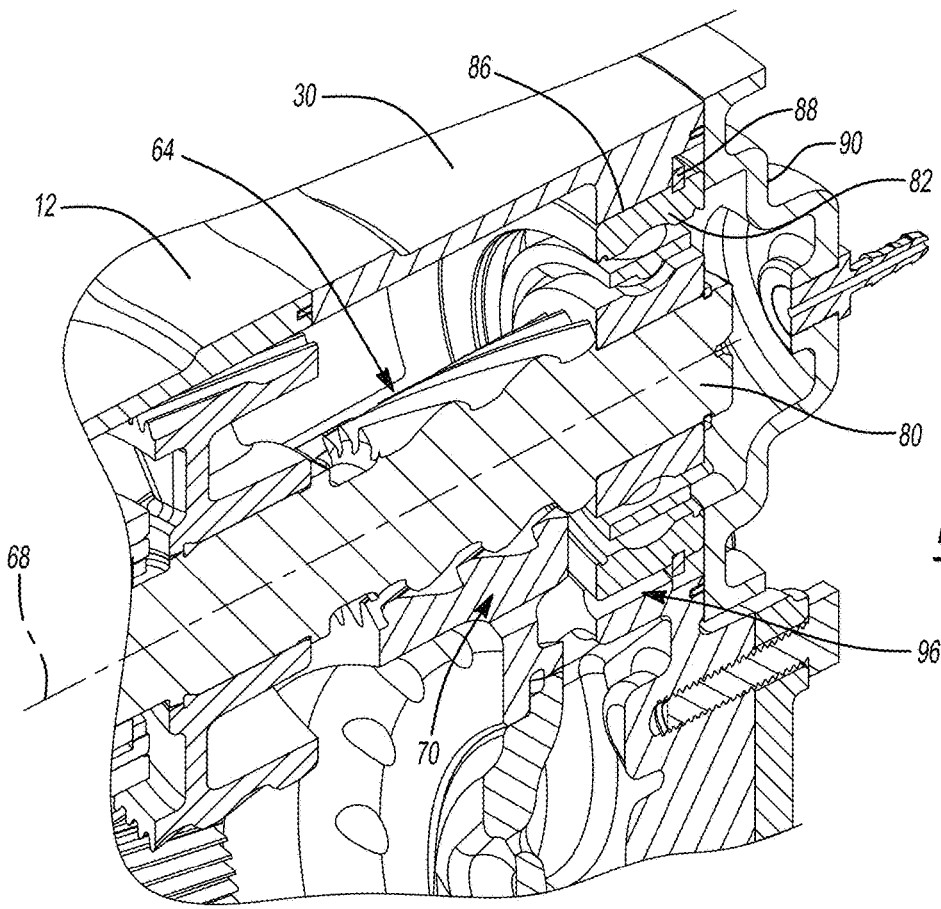
FIGS. 7 and 8 are section views of portions of the electric drive unit of FIG. 1, illustrating the compound gear mounted in a housing assembly.
Figure 8:
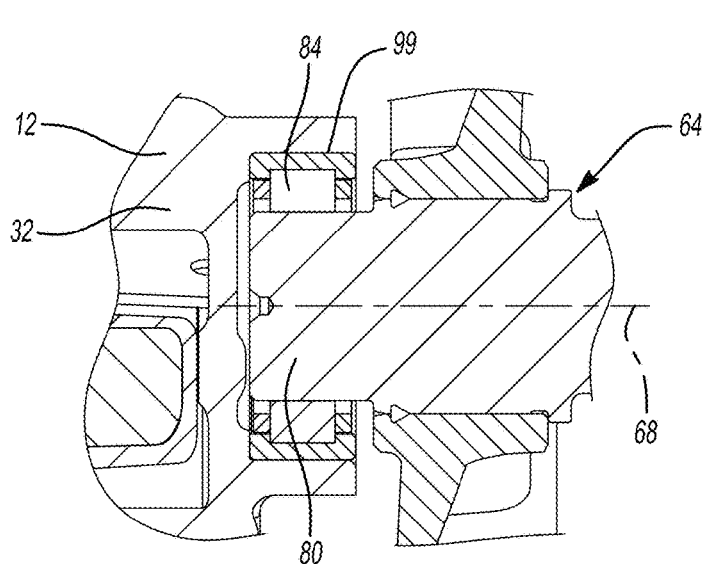
Figure 9:
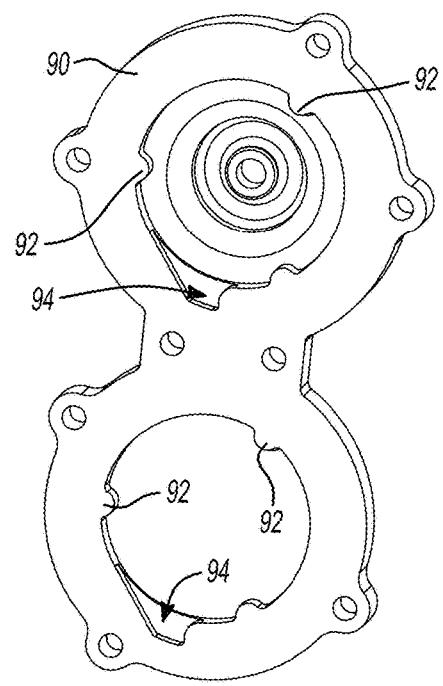
FIG. 9 is a perspective view of a portion of the electric drive unit of FIG. 1, illustrating an internal side of an end cover.

With reference to FIGS. 4, 7 and 8, each compound gear 64 can be supported for rotation relative to the housing assembly 12 by a first bearing 82 and a second bearing 84. In addition to the capability of handling and transmitting radially-directed forces between the compound gear 64 and the housing assembly 12, the first bearing 82 can be a type of ball bearing that is configured to handle and transmit forces that are directed axially along the rotational axis 68 of the compound gear 64 when rotary power is transmitted through the transmission 16. For example, the first bearing 82 could be a type of angular contact bearing or a deep groove ball bearing. The first bearing 82 can be received in a bore 86 formed in the gearbox cover 30 and a snap ring 88 or other type of engagement could be received into a counterbore, which is concentric with the bore 86, and secured to the outer bearing race of the first bearing 82. The snap ring 88 can abut a shoulder formed in an axial end of the counterbore in the gearbox cover 30 to inhibit axial movement of the first bearing 82 in a first axial direction along the rotational axis 68 of the compound gear 64. The housing assembly 12 can further comprise a bearing cover 90 that can be mounted to the gearbox cover 30 to close the bores 86 in the gearbox cover 30 and shroud the first bearings 82. If desired, pads or bosses 92 (FIG. 9) can be formed onto the bearing cover 90 to radially overlap and axially abut the outer bearing races of the first bearings 82 to further support and stabilize the first bearings 82. Additionally, or alternatively, passages 94 (FIG. 9) can be provided in the bearing cover 90 to permit lubrication passing through the first bearings 82 to drain to an oil drain channel 96 in the gearbox cover 30 that permits the lubrication to drain to a desired area, such as a sump 98 (FIG. 2).

With reference to FIGS. 4 and 8, the second bearing 84 can be a type of bearing that is configured to at least substantially or exclusively handle and transmit radially-directed forces between the compound gear 64 and the housing assembly 12. Stated another way, the second bearing 84 can be a type of bearing that has an insufficient ability to handle or transmit forces that are directed axially along the rotational axis 68 of the compound gear 64 when rotary power is transmitted through the transmission 16. In the example shown, the second bearing 84 is a roller bearing that employs cylindrically-shaped rollers between an inner bearing race and an outer bearing race. The second bearing 84 can be received into a bore 99 formed into the gearcase 32. If desired, the inner bearing race could be formed onto the shaft member 80 to which the first and second reduction gears 70 and 72 are rotationally coupled.

With renewed reference to FIGS. 3 and 4, the rotational axes 68 of the compound gears 64 can be disposed relative to the motor output axis 50 in any desired manner to satisfy or accommodate criteria such as the overall speed or gear reduction of the transmission 16, the size of the envelope into which the electric drive unit 10 (FIG. 1) can be packaged and/or the extent to which the loading of the teeth of the first reduction gears 70 is equalized. In the example shown, the rotational axes 68 of the compound gears 64 and the motor output axis 50 are disposed in a plane P and an even number of teeth are formed on the transmission input gear 62. Configuration in this manner can help to balance the loads that are transmitted between each of the first reduction gears 70 and the transmission input gear 62.

Figure 10:
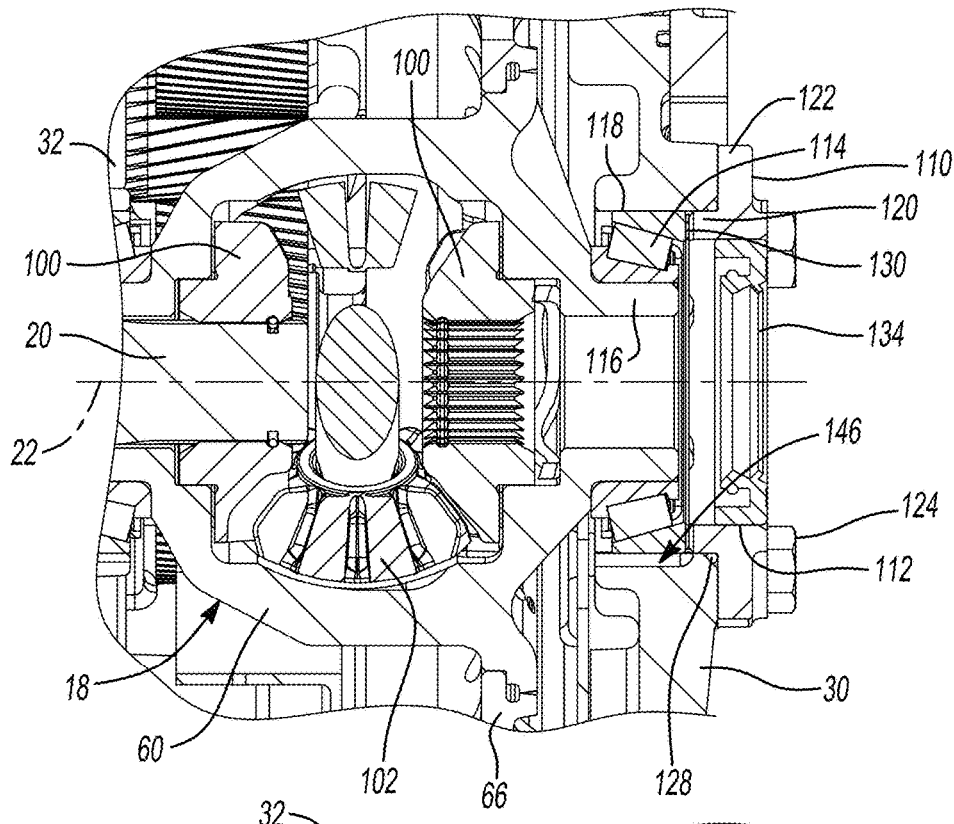
FIGS. 10 and 11 are perspective section views of portions of the electric drive unit of FIG. 1 illustrating the differential assembly as it is supported in the housing assembly.
Figure 11:
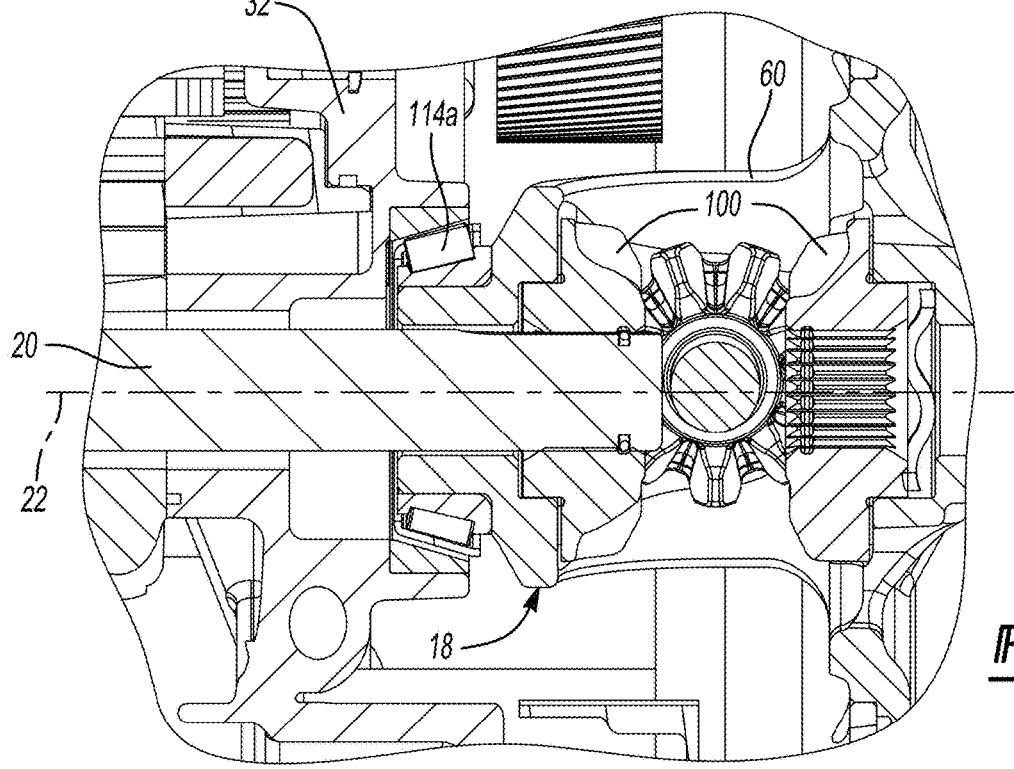

With reference to FIGS. 10 and 11, the differential assembly 18 can further include a pair of differential output members 100 and can employ any desired means for permitting speed differentiation between the differential output members. In the example provided, the differential input member 60 is a differential case and the speed differentiation means comprises a differential gearset 102 in which the differential output members 100 are bevel side gears. It will be appreciated, however, that the speed differentiation means could employ a different type of differential gearset (e.g., a planetary gear arrangement in which the gears of the planetary arrangement are formed as spur or helical gears and one or more of the differential output members is a sun gear or a planet carrier of the planetary arrangement, or a helical gear arrangement in which the side gears are helical gears) or could employ one or more sets of clutches (e.g., friction clutches).

Figure 12:
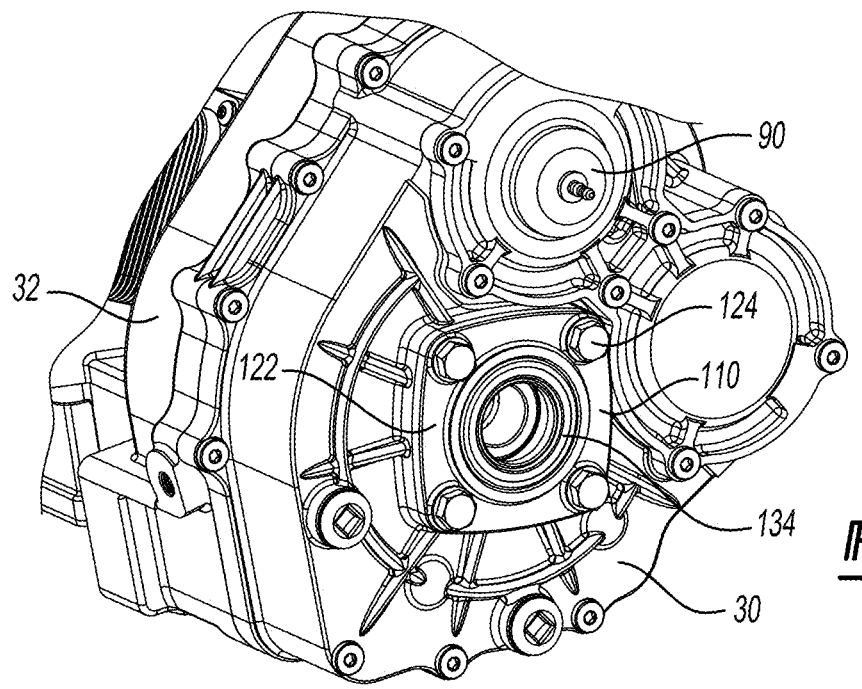
FIG. 12 is a perspective view of a portion of the electric drive unit of FIG. 1 illustration a portion of a housing assembly in more detail.
Figure 13:
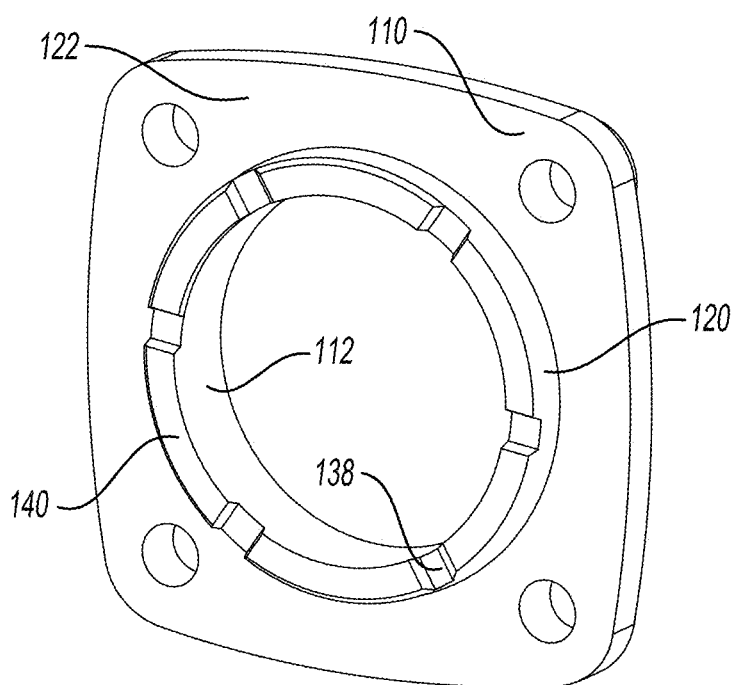
FIG. 13 is a rear perspective view of a differential bearing cover that is shown in the portion of the housing assembly illustrated in FIG. 12.

In FIGS. 10 and 12, the housing assembly 12 is illustrated to include a differential bearing cover 110 that is fixedly but removably coupled to the gearbox cover 30. The differential bearing cover 110 defines an output shaft bore 112 that is disposed concentrically about the output axis 22. A bearing, such as a tapered roller bearing 114, can be disposed on a trunnion 116 formed on the differential input member 60 and an inner bearing race of the tapered roller bearing 114 can be abutted axially against a shoulder that is formed on the differential input member 60. An outer bearing race of the tapered roller bearing 114 can be formed into a bearing bore 118 formed in the gearbox cover 30. The differential bearing cover 110 can include a piloting portion 120, which can be disposed in the bearing bore 118, and a flange 122 that can extend radially outwardly from the piloting portion 120. Threaded fasteners 124 can be disposed through the flange 122 and can be threaded into holes formed in the gearbox cover 30. A suitable seal or gasket can be disposed between the gearbox cover 30 and the differential bearing cover 110 to form a seal that inhibits the egress of lubrication from the housing assembly 12 through the joint that is formed by the gearbox cover 30 and the differential bearing cover 110. In the example shown, the seal comprises an O-ring 128 that is received over the piloting portion 120 and abutted against the flange 122. The O-ring 128 is seated between a chamfer that is formed about the bearing bore 118 and the differential bearing cover 110 and is configured to seal an annular groove having a triangular cross-sectional shape that is defined by the chamfer, the outer diameter of the piloting portion 120 and an axial end of the flange 122. A shim 130 can be received axially between the outer bearing race of the tapered roller bearing 114 and the piloting portion 120. The shim 130 can be "select fit" (i.e., specifically selected for its particular thickness from a set of shims having different thicknesses) so as to aid in preloading the tapered roller bearing 114 to a desired preload when the differential bearing cover 110 is installed to the gearbox cover 30. A shaft seal 134 can be received into the output shaft bore 112.

A corresponding one of the output shafts 20 can be received through the output shaft bore 112 and through the trunnion 116 on the differential input member 60 and can be non-rotatably coupled to a corresponding one of the differential output members 100. In the example provided, the output shafts 20 have an externally splined segment that matingly engages an internally splined segment formed onto the corresponding one of the differential output members 100. One or more grooves 138 can be formed in the axial end 140 of the piloting portion 120 to permit oil to drain through the piloting portion 120 to an oil drain channel 146 in the gearbox cover 30 that permits the lubrication to drain to a desired area, such as a sump 98 (FIG. 2).

Figure 14:
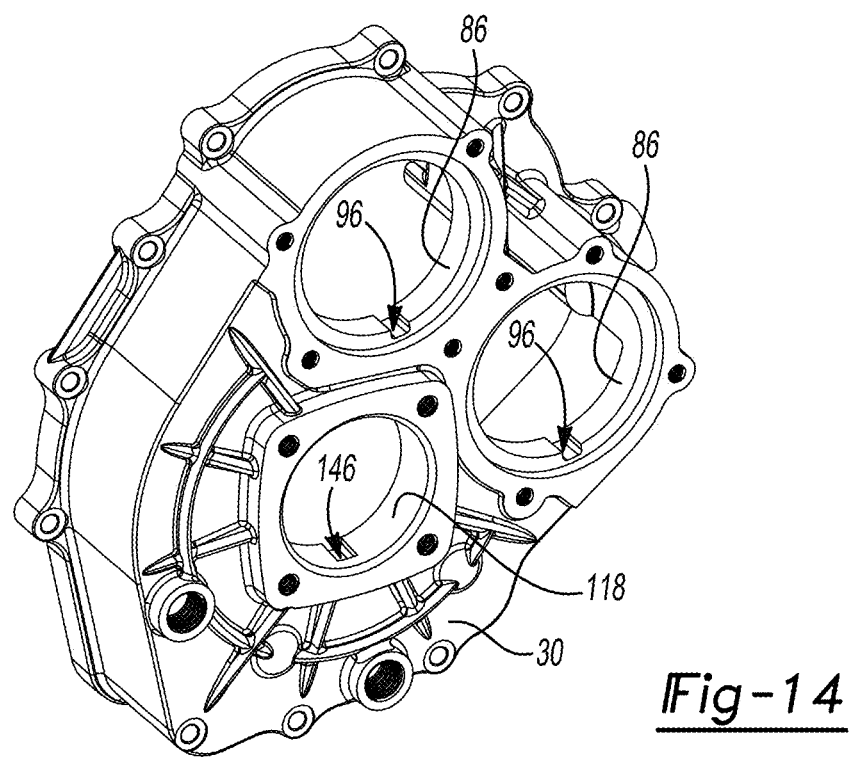
FIGS. 14 and 15 are front and rear perspective views, respectively, of a gearbox cover that is shown in the portion of the housing assembly illustrated in FIG. 12.
Figure 15:
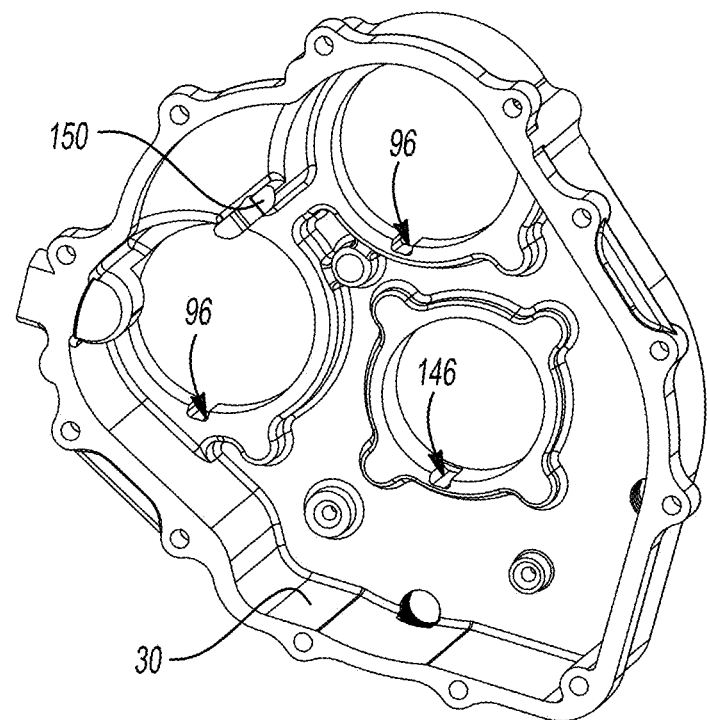

FIGS. 14 and 15 illustrate the front and rear sides of the gearbox cover 30 in more detail. A first cooling pipe bracket 150 can be fixedly coupled to the inside surface of the gearbox cover 30. In the example provided, the first cooling pipe bracket 150 is integrally and unitarily formed with the gearbox cover 30.

Figure 16:
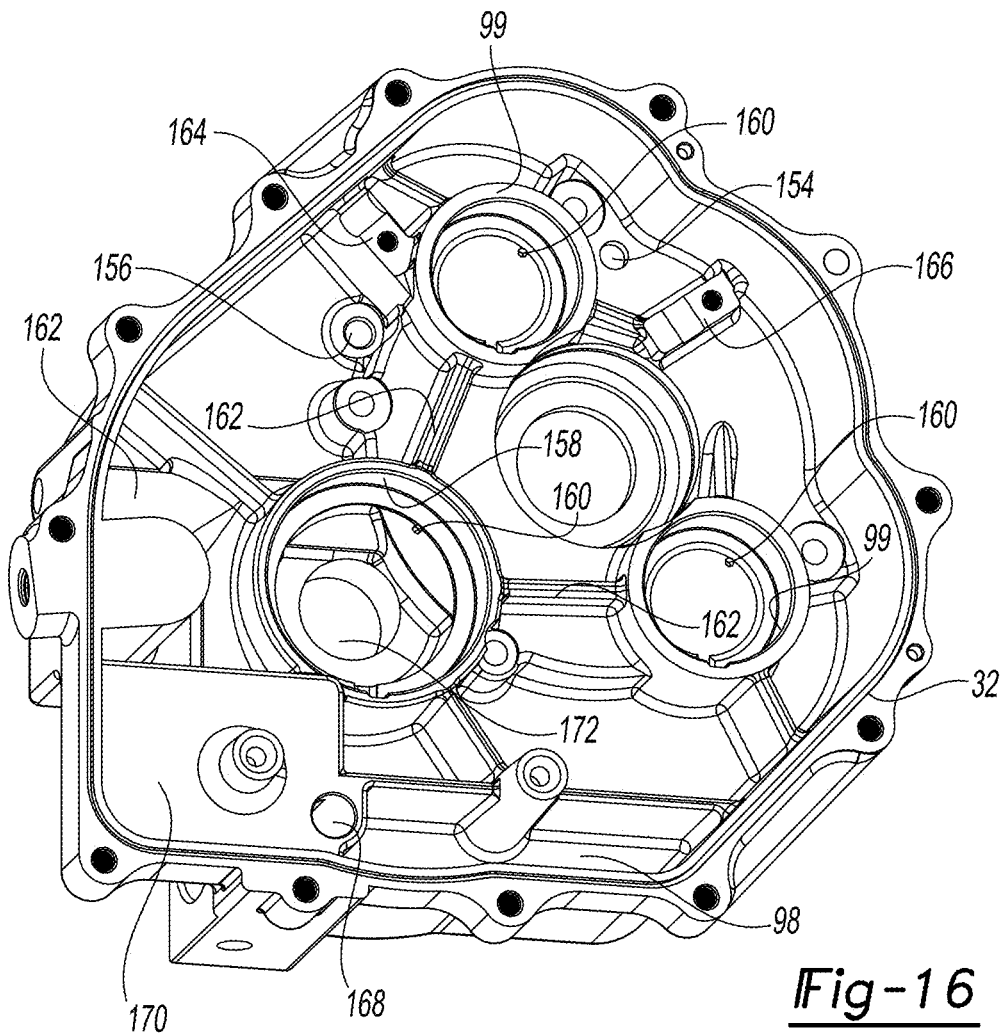
FIG. 16 is a front perspective view of a gearbox that is shown in the portion of the housing assembly illustrated in FIG. 12.

FIG. 16 illustrates the front side of the gearbox 32 in more detail. An stator oil return aperture 154 is formed through the gearbox 32 and permits fluid exiting the stator 46 (FIG. 2) to return to the sump 98. A coolant pipe aperture 156 is formed through the gearbox 32 and is configured to transmit a flow of fluid therethrough that is adapted for cooling the rotor 48 (FIG. 2). A plurality of lubricant feed apertures 160 can be formed into the gearbox 32 and can be configured to feed a flow of fluid into each of the bores 99 and a bore 158 that are configured to receive the second bearings 84 (FIG. 4), which support the compound gears 64 (FIG. 4), and a tapered roller bearing 114a (FIG. 11) that supports the differential input member 60 (FIG. 11). The lubricant feed apertures 160 intersect various lubricant feed galleries 162 that are formed through the gearbox 32. Second and third coolant pipe brackets 164 and 166, respectively, are fixedly coupled to the gearbox 32. In the example provided, the second and third coolant pipe brackets 164 and 166 are unitarily and integrally formed with the gearbox 32. A coolant pump intake port 168 is formed in the gearbox 32 and fluidly couples the sump 98 to a pump bore 170 that is also formed in the gearbox 32 and which is configured to receive a pump (not shown) that is part of the lubrication and cooling system 24. An output shaft bore 172 is formed through the gearbox 32 and is configured to receive a corresponding one of the output shafts 20 (FIG. 2) therethrough.

Figure 17:
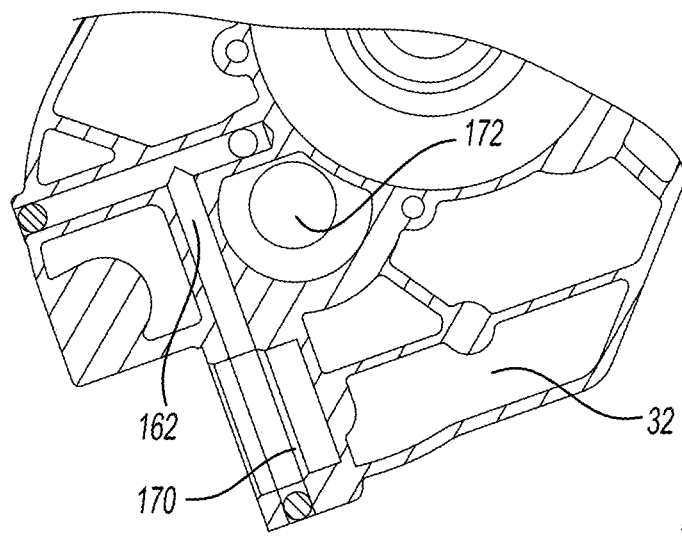
FIG. 17 is a section view of a portion of the gearbox illustrating a pump mount in more detail.

In FIG. 17, a portion of the gearbox 32 is shown in section view to better illustrate the pump bore 170 and one of the lubricant feed galleries 162. The particular lubricant feed gallery 162 shown happens to intersect the pump bore 17. Accordingly, it will be appreciated that a pump can be mounted in the pump bore 170 and can discharge fluid to the lubricant feed gallery 162 that intersects the pump bore 17.

Figure 18:
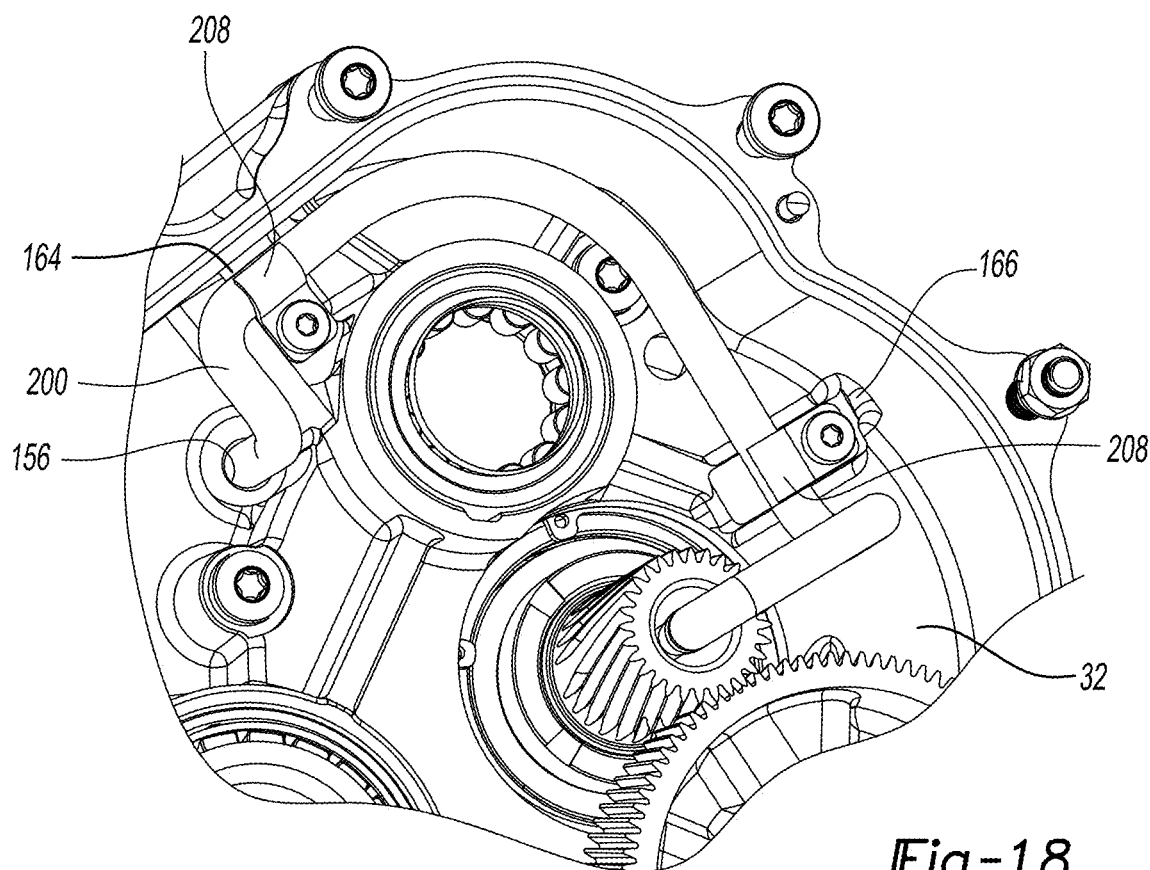
FIG. 18 is a perspective view of a portion of the electric drive unit of FIG. 1 illustrating a coolant pipe as coupled to a coolant pipe aperture in the gearbox and extending into the rotor of the electric motor.
Figure 19:
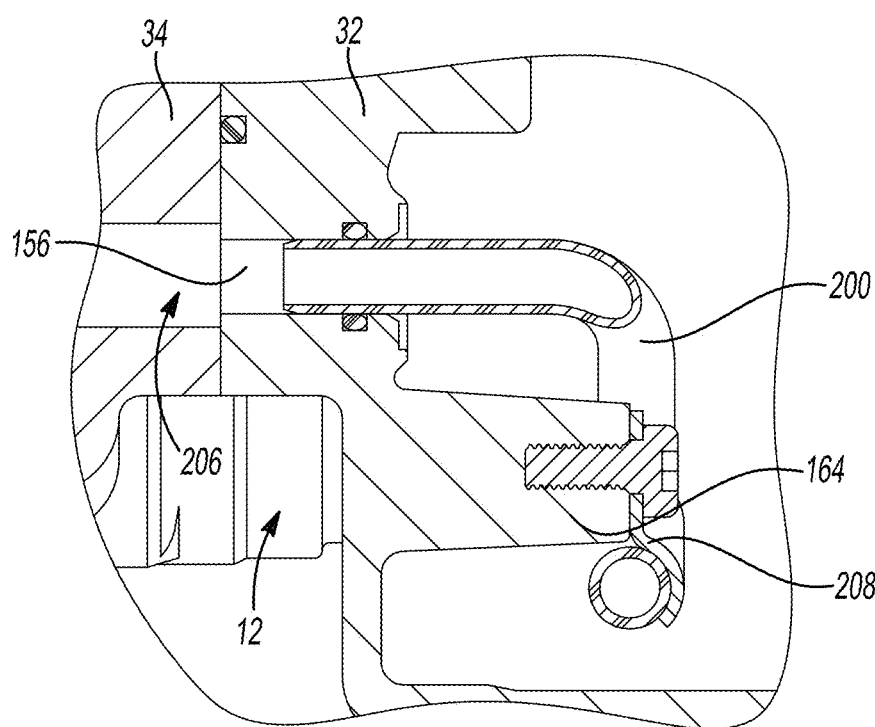
FIG. 19 is a section view of a portion of the electric drive unit of FIG. 1, illustrating the connection between the coolant pipe and the gearbox.
Figure 20:
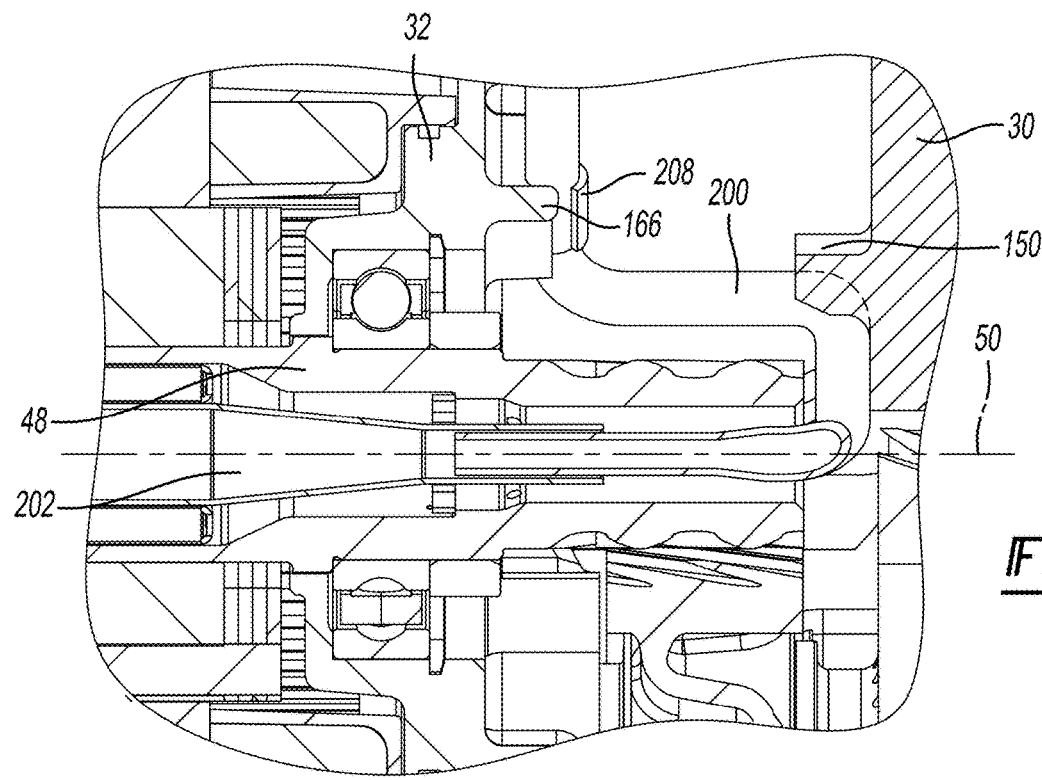
FIG. 20 is a perspective, partially sectioned view of a portion of the electric drive unit of FIG. 1 illustrating the connection between the coolant pipe and the rotor.

In FIGS. 18 through 20, a coolant pipe 200 is depicted connecting the coolant pipe aperture 156 to a central passage 202 in the rotor 48. The coolant pipe 200 is configured to introduce a flow of a coolant fluid into the rotor 48. The flow of coolant fluid is provided by the pump that is mounted to the gearbox 32 and is transmitted to the coolant pipe aperture 156 through various galleries (including gallery 206 in the motor housing 34) that are formed in the housing assembly 12. Clamps 208 can fixedly secure the coolant pipe 200 to the second and third coolant pipe brackets 164 and 166 on the gearbox 32, while the first coolant pipe bracket 150 on the gearbox cover 30 can abut the coolant pipe 200 on a side of the coolant pipe 200 that is opposite the rotor 48 to inhibit withdrawal of the coolant pipe 200 from the rotor 48. In the particular example provided, the coolant pipe 200 extends into the rotor 48 by a distance that equals or exceeds seven times the inside diameter of the coolant pipe 200. However, it will be appreciated that the distance by which the coolant pipe 200 extends into the rotor 48 could be sized differently.

Figure 21:
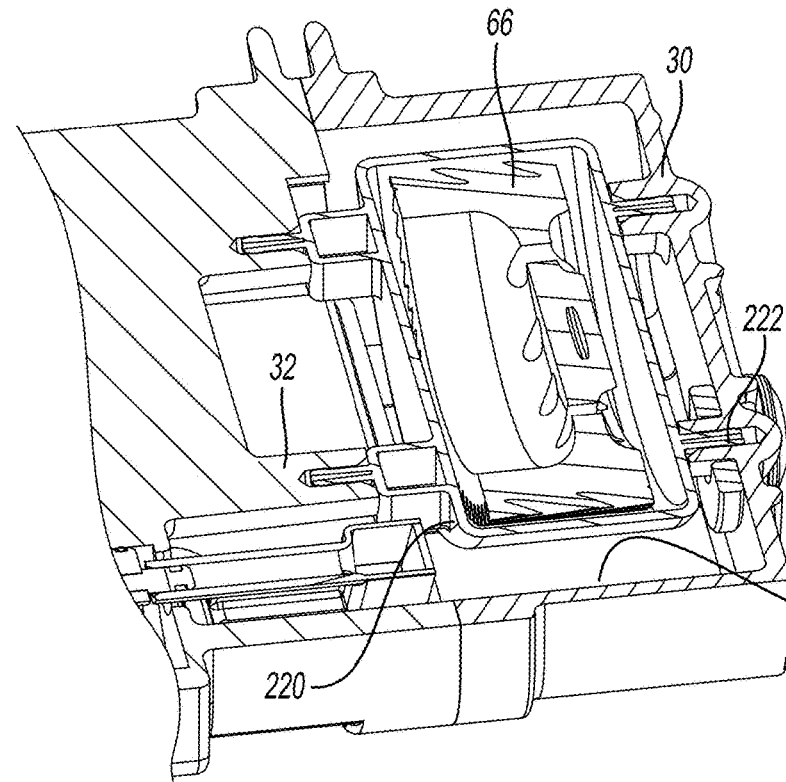
FIG. 21 is a perspective section view of a portion of the electric drive unit of FIG. 1 illustrating a trough that is mounted to the housing assembly to shield a transmission output gear from a liquid lubricant held in a sump.

In FIG. 21, a trough 220 is mounted to the gearcase cover 30 and the gearcase 32. The transmission output gear 66 rotates in the trough 220 to reduce or eliminate the churning of fluid in the sump 98. The trough 220 can be formed of a suitable plastic material and can include a plurality of posts 222 that are received (e.g., slip fit or press fit) into apertures formed in the gearcase cover 30 and the gearcase 32.

Figure 22:
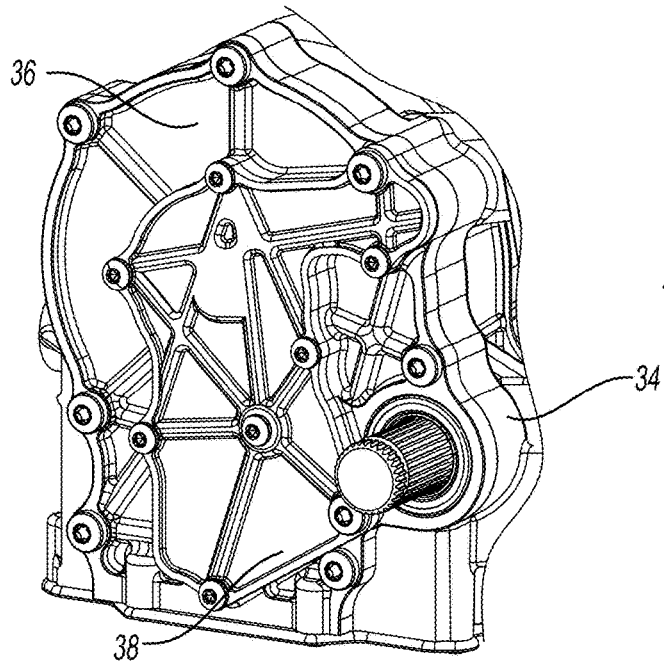
Figure 23:
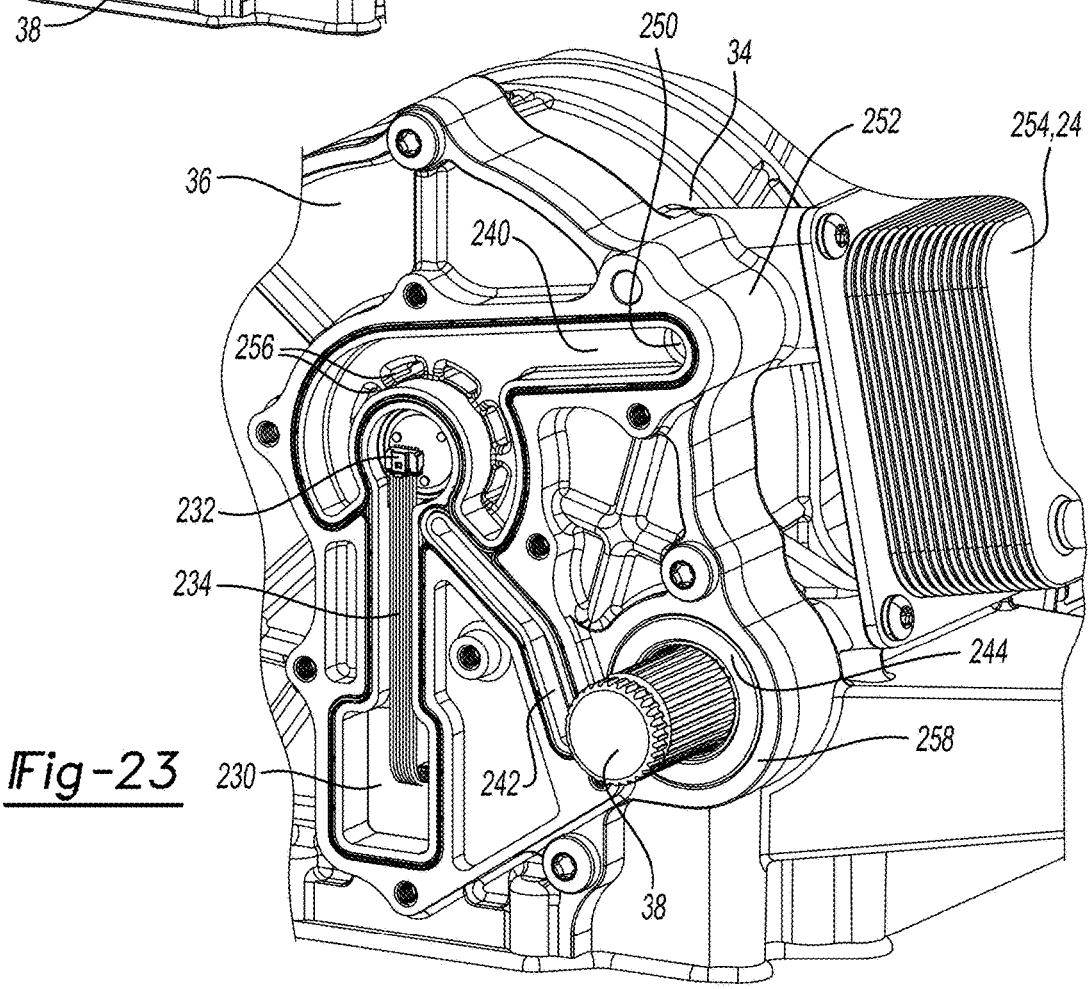
FIG. 23 is a perspective view of a portion of the electric drive unit of FIG. 1 illustrating a motor housing cover and an end cover of the housing assembly in more detail.

With reference to FIGS. 22 and 23, the motor housing cover 36 defines a cavity 230 for housing a rotational position sensor 232 and a portion of a wire harness 234 that couples the rotational position sensor 232 to a control board (not shown) of the motor control unit 42 (FIG. 2). The motor housing cover 36 can also define a fluid feed gallery 240, a fluid drain gallery 242 and an output shaft bore 244. The motor housing cover 36 is sealingly coupled to the motor housing 34 to fluidly couple an inlet 250 of the fluid feed gallery 240 to an outlet port 252 from a heat exchanger 254 of the lubrication and cooling system 24. The fluid feed gallery 240 defines a plurality of gallery outlet ports 256 that are configured to route fluid from the fluid feed gallery 240 into the motor control unit 42 (FIG. 2) and the electric motor 40 (FIG. 2) as will be described in more detail below. The fluid drain gallery 242 can be employed to route a lubricating and cooling fluid from a rotor shaft bearing (not shown) to a gallery (not shown) in the motor housing 34 to return the fluid to the sump 98 (FIG. 2). The output shaft bore 244 can be sized to receive an output shaft seal 258 therein. A corresponding one of the output shafts 20 can extend through the motor housing cover 36 and can be sealingly engaged to the output shaft seal 258. The end cover 38 can be sealingly coupled to the motor housing cover 36 to seal each of the cavity 230, the fluid feed gallery 240, and the fluid drain gallery 242.

Figure 24:
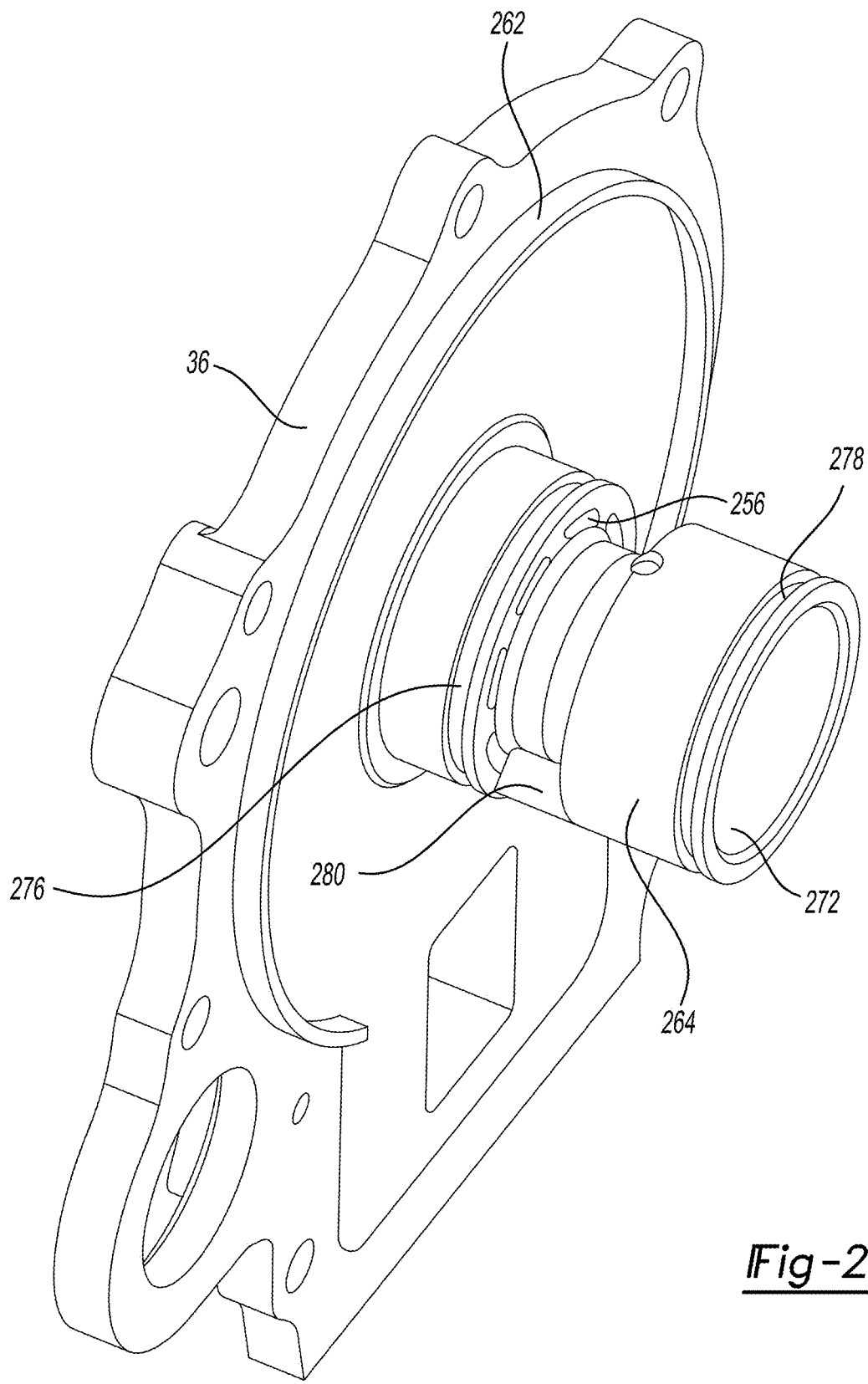
FIG. 24 is a rear perspective view illustrating the motor housing cover and a bearing holder.
Figure 25:
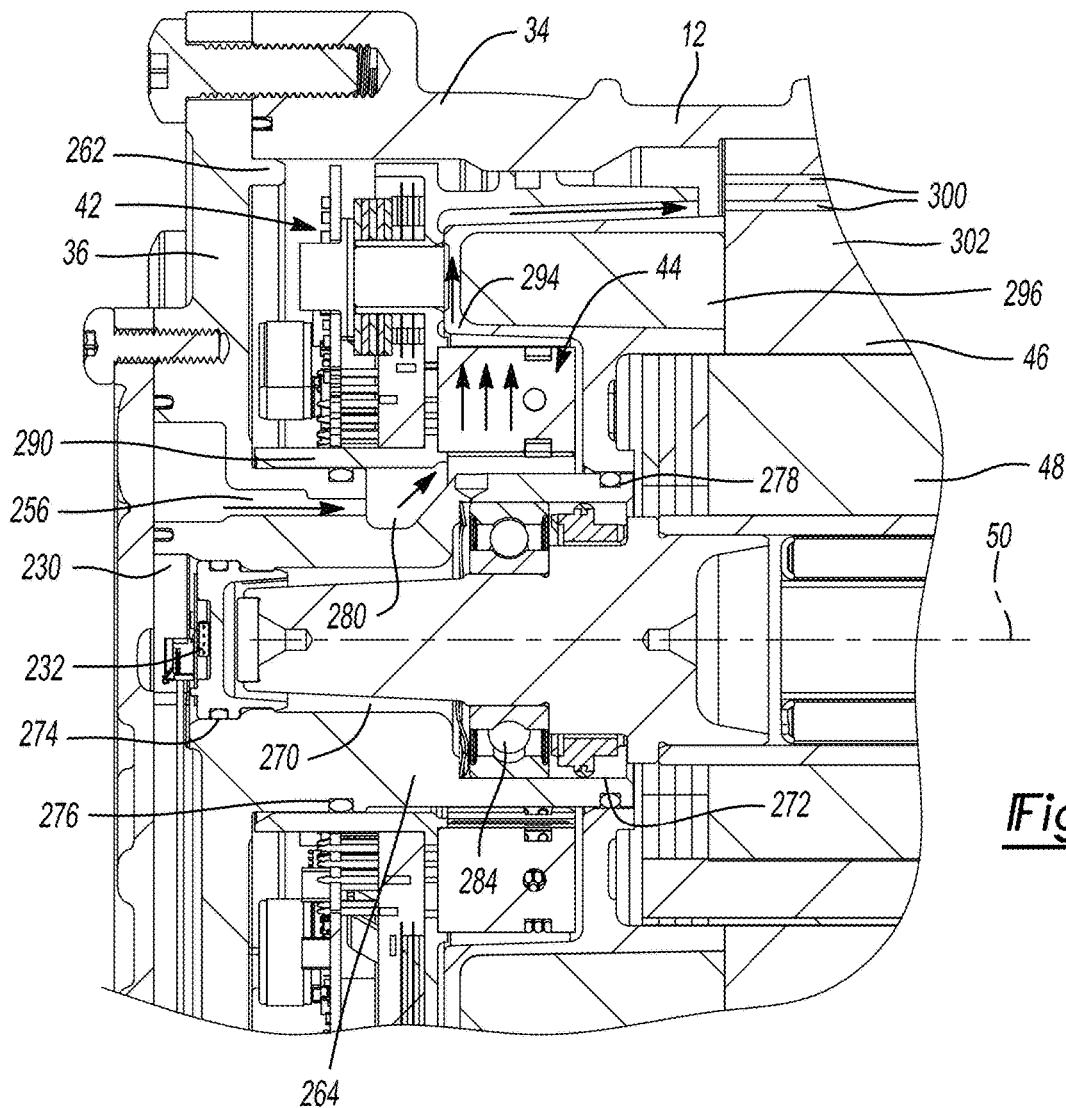
FIG. 25 is a section view taken through a portion of the electric drive unit of FIG. 1 and illustrating an inverter, the electric motor, the motor housing cover and the end cover in more detail.

In FIGS. 24 and 25, the motor housing cover 36 can include a pilot rib 260 that can be received into a bore 262 formed in the motor housing 34 to aid in locating the motor housing cover 36 to the motor housing 34 in a desired manner. The pilot rib 262 can be shaped as a segment of a circle that is centered about the motor output axis 50. A bearing holder 264 can be shown to be fixedly coupled (e.g., unitarily and integrally formed with) the motor housing cover 36 and disposed concentrically about the gallery outlet ports 256 such that the gallery outlet ports 256 pass axially through a portion of the bearing holder 264. The bearing holder 264 can define a rotor shaft bore 270, a bearing counterbore 272, sensor mount counterbore 274, a first external seal groove 276, a second external seal groove 278 and a fluid distribution groove 280. The rotor shaft bore 270 can be formed through the bearing holder 264 and can be sized to receive an end of the rotor 48 therein. The bearing counterbore 272 can be disposed in the distal end of the bearing holder 264, can be concentric with the rotor shaft bore 270, and is sized to receive a bearing 284 that is mounted on the rotor 48. The bearing 284 is configured to support the end of the rotor 48 for rotation about the motor output axis 50 relative to the housing assembly 12. The sensor mount counterbore 274 is formed the proximal end of the bearing holder 264, can be concentric with the rotor shaft bore 270, and intersects the cavity 230 in the motor housing cover 36. The sensor mount counterbore 274 is sized to receive a sensor mount as will be discussed in more detail below.

The first external seal groove 270 and the second external seal groove 272 are spaced axially apart from one another along the motor output axis 50 and are each configured to receive a respective seal (not shown), such as an O-ring seal, therein. The seal in the first external seal groove 270 is configured to form a fluid-tight seal between the bearing holder 264 and an inverter mount 290 of the inverter 44, while the seal in the second external seal groove 272 is configured to form a fluid-tight seal between the bearing holder 264 and a cap 294 that covers the windings 296 of the stator 46. The fluid distribution groove 280 is disposed along the motor output axis 50 between the first and second external seal grooves 270 and 272. The fluid distribution groove 280 extends over a portion of the circumference of the bearing holder 264 and intersects the gallery outlet ports 256. Accordingly, fluid discharged from the fluid feed gallery 240 (FIG. 23) in the motor housing cover 36 through the gallery outlet ports 256 passes into the fluid distribution groove 280 and is directed radially outwardly and circumferentially about an interior perimeter of the inverter 44. If desired, the downstream end of the fluid distribution groove 280 can be shaped in a manner that aids the outward progression of fluid toward the inverter 44. In the example provided, the downstream end of the fluid distribution groove 280 is frustoconically shaped. Fluid passes through a plurality of heat sinks and power semiconductors (e.g., MOSFET's, IGBT's) in the inverter 44 to remove heat from the inverter 44. Fluid discharged from the inverter 44 is routed against and around the cap 294 that covers the windings 296 of the stator 46 before it is routed into a plurality of cooling channels 300 that are formed in a body 302 of the stator 46.

Figure 26:
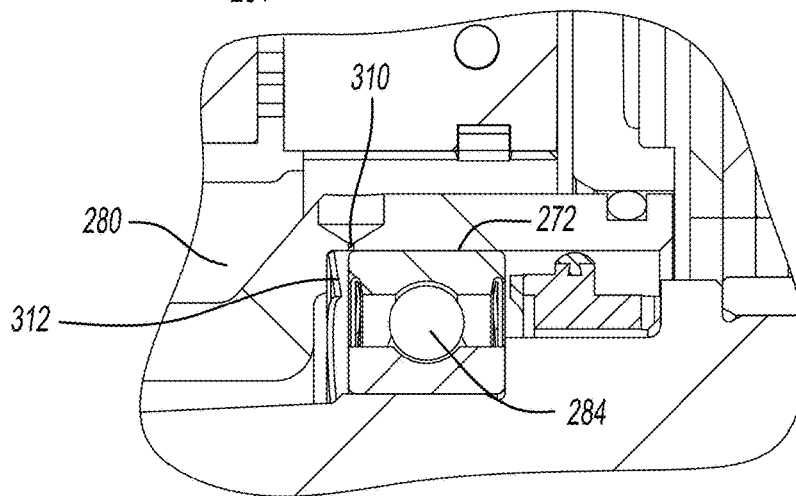
FIG. 26 is an enlarged portion of FIG. 25.

In FIG. 26, a relatively small hole 310 is formed radially through the bearing holder 264 at a location that intersects or is somewhat downstream from the fluid distribution groove 280. The hole 310 intersects the bearing counterbore 272 and is configured to supply a lubricating fluid to the bearing 284. A Belleville spring washer 312 can be disposed between an internal shoulder on the bearing holder 264 that defines the proximal end of the bearing counterbore 272 and the bearing 284. The Belville spring washer 312 acts as a spacer that is configured to ensure that the flow of fluid exiting the hole 310 is not and does not become blocked by the outer bearing race of the bearing 284.

Figure 27:
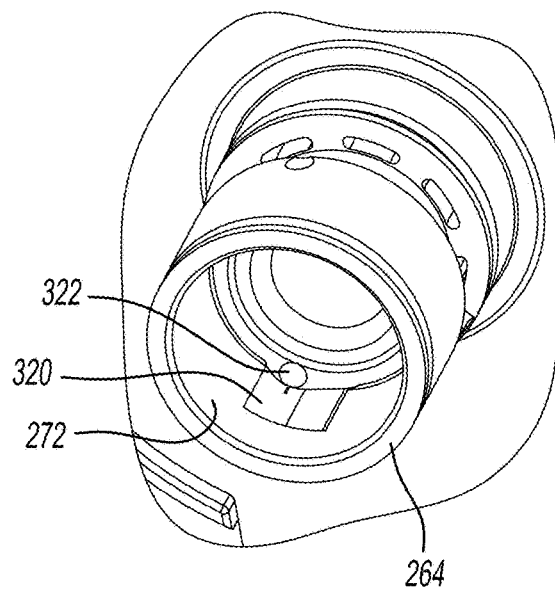
FIGS. 27 and 28 are rear and front perspective views, respectively, that illustrate the motor housing cover and the bearing holder in more detail.
Figure 28:
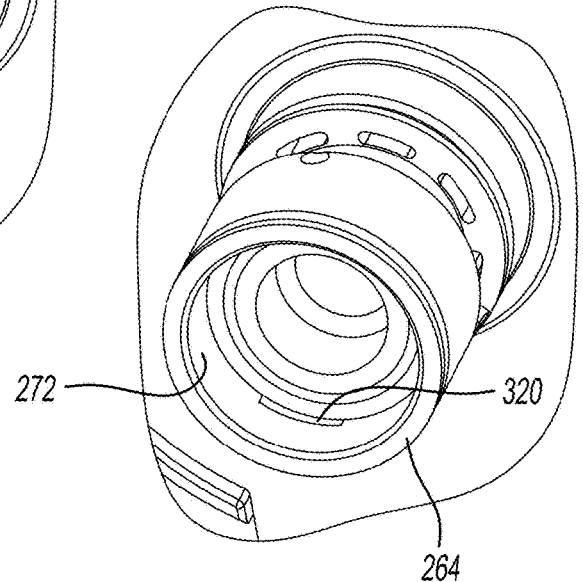
Figure 29:
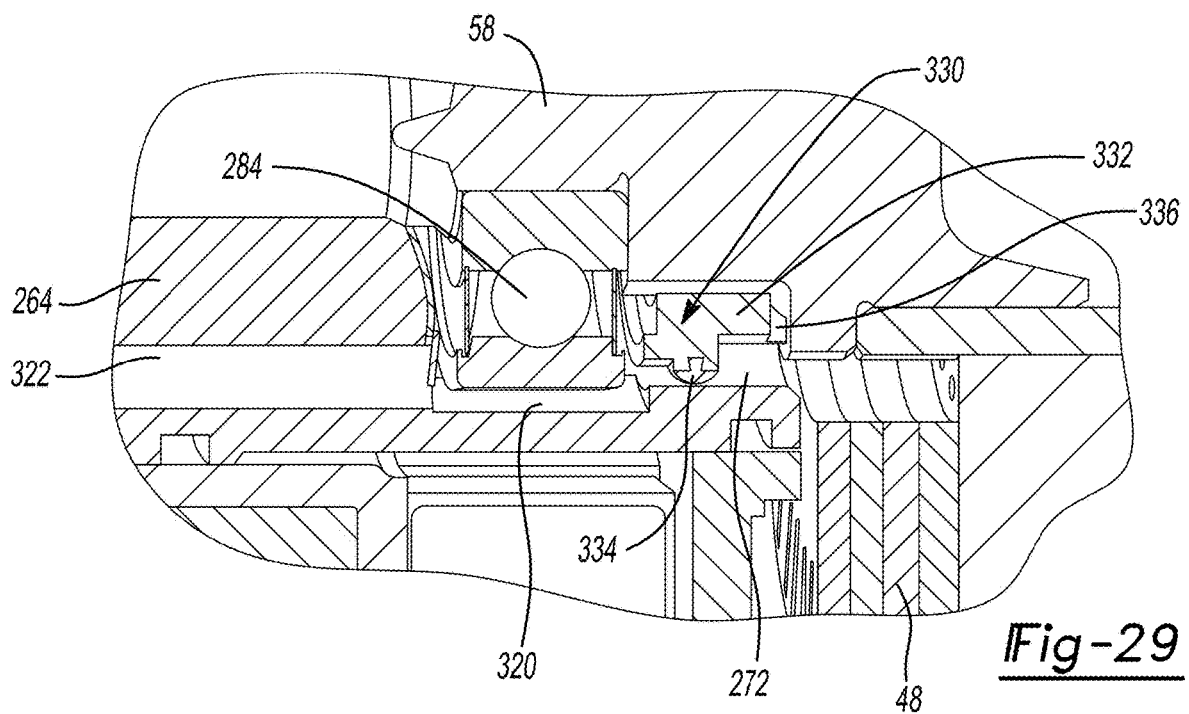
FIG. 29 is an enlarged portion of FIG. 25.

In FIGS. 27 through 29, a well 320 and a drain gallery 322 are formed in the bearing holder 264. The well 320 intersects and extends radially outwardly from the bearing counterbore 272. The well 320 extends in an axial direction so as to be somewhat wider than the bearing 284. The drain gallery 322 connects the well 320 to the fluid drain gallery 242 (FIG. 23) in the motor housing cover 36 (FIG. 23). Accordingly, fluid supplied to the bearing 284 for its lubrication and/or cooling can be discharged to the well 320 and will drain through the drain gallery 322 to the fluid drain gallery 242 (FIG. 23) and then to the sump 98 (FIG. 2).

Figure 30:
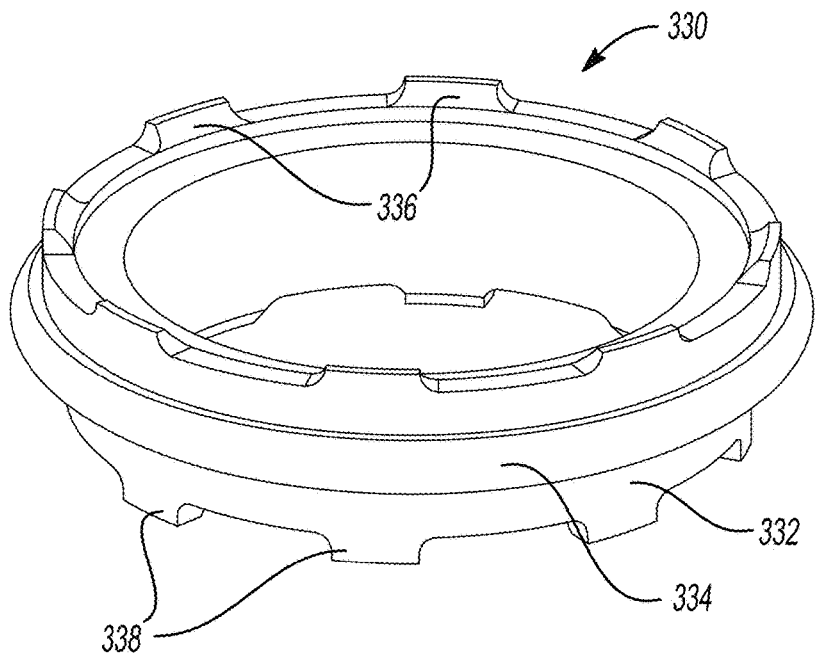
FIG. 30 is a perspective view of a portion of the electric drive unit of FIG. 1, illustrating a floating seal in more detail.

In FIGS. 29 and 30, a floating seal 330 is mounted to the motor output shaft 52. The floating seal 330 is disposed radially between the motor output shaft 52 and the bearing holder 264, as well as axially on the motor output shaft 52 between a first shoulder and a second shoulder. The bearing 284 is abutted against the second shoulder. The floating seal 330 has an annular body 332 and a circumferentially extending seal member 334. The annular body 332 is sized to slip fit over the portion of the motor output shaft 58 that is disposed between the first and second shoulders. The annular body 332 can define a first set of projections 336, which face toward the first shoulder, and a second set of projections 338 that face toward the bearing 284. The first set of projections 336 can be spaced circumferentially apart from one another and can be configured to minimize the surface area over which the annular body 332 and the first shoulder are potentially able to contact one another. The second set of projections 338 can be spaced circumferentially apart from one another and can be configured to minimize the surface area over which the annular body 332 and the outer bearing race of the bearing 284 are potentially able to contact one another. Additionally, the second set of projections 338 permit lubrication that has passed through the bearing 284 to drain through the second set of projections 338 into the well 320. The circumferentially extending seal member 334 can be sealingly engaged to the annular body 332 and to the circumferentially extending surface of the bearing counterbore 272.

In some instances, it may be possible to configure the bearing 284 as a greased bearing to eliminate the need for supplying fluid to and draining fluid from the bearing 284 to thereby reduce the complexity of various components, such as by omitting features, such as the hole 310 (FIG. 26) in the bearing holder 264 (FIG. 26) and/or the fluid drain gallery 242 (FIG. 23) in the motor housing cover 36 (FIG. 23), and/or the well 320 (FIG. 27) and the drain gallery 322 (FIG. 27) in the bearing holder 264 (FIG. 27), and/or to eliminate various components, such as the floating seal 330. The (greased) bearing 284 could be a sealed bearing, such as a bearing that uses non-contacting seals. Optionally, the bearing (not shown) that supports the opposite end of the rotor 48 (FIG. 2) could also be a greased bearing and can be a sealed bearing (e.g., a bearing using non-contacting seals) or alternatively could be a bearing with a single seal in which the seal is a non-contacting seal and faces toward the rotor 48 (FIG. 2) while the open or unsealed side of the bearing faces the transmission 16 (FIG. 2).

Figure 31:
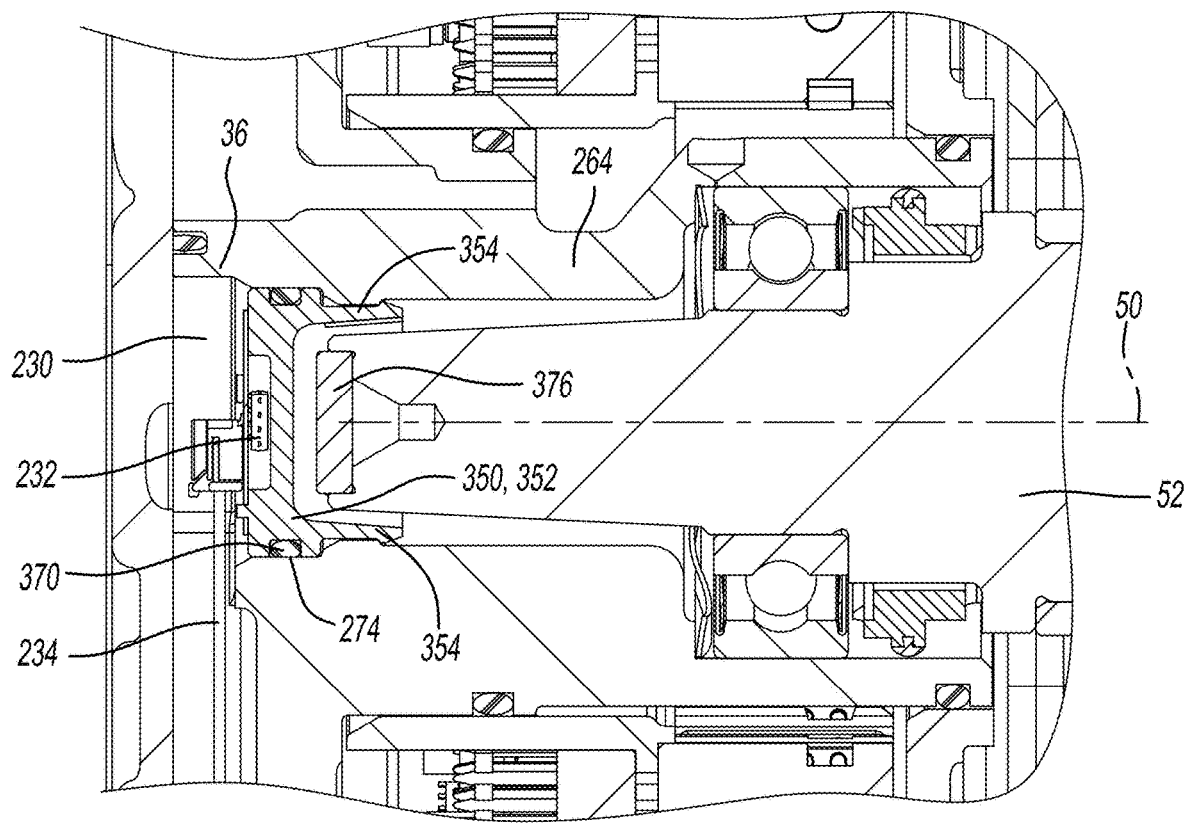
FIG. 31 is an enlarged portion of FIG. 25.
Figure 32:
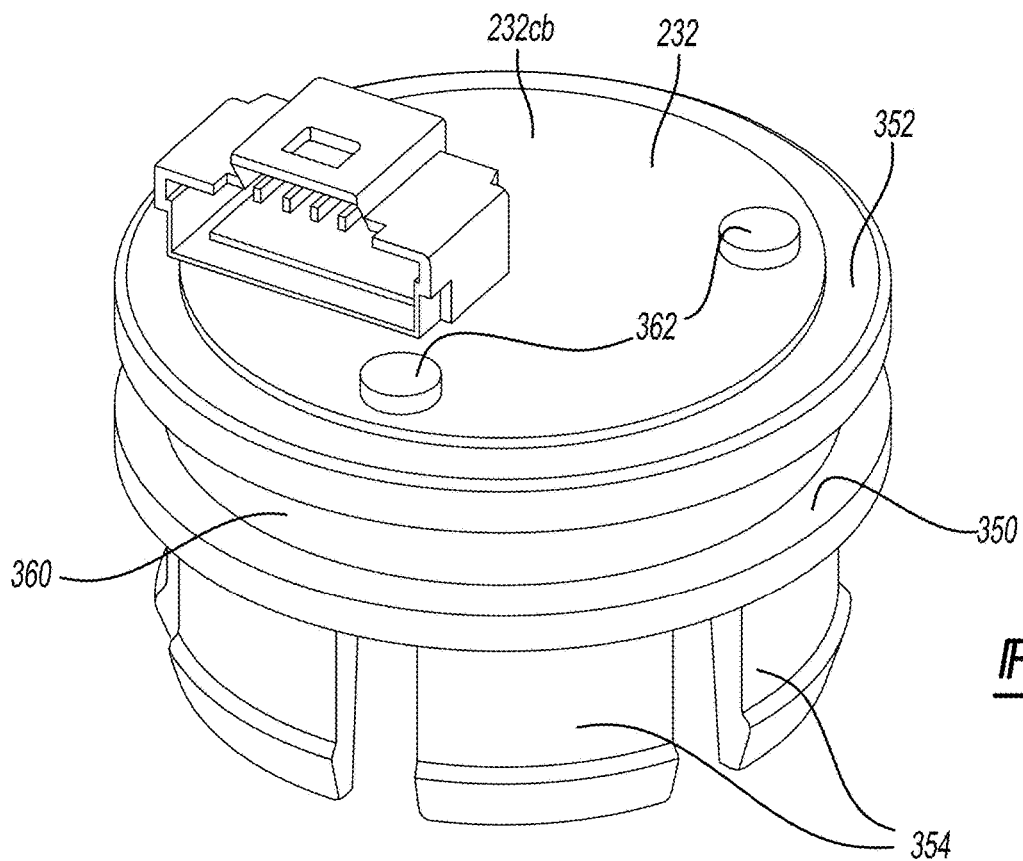
FIG. 32 is a perspective view of a portion of the electric drive unit of FIG. 1, illustrating a sensor mount in more detail.
Figure 33:
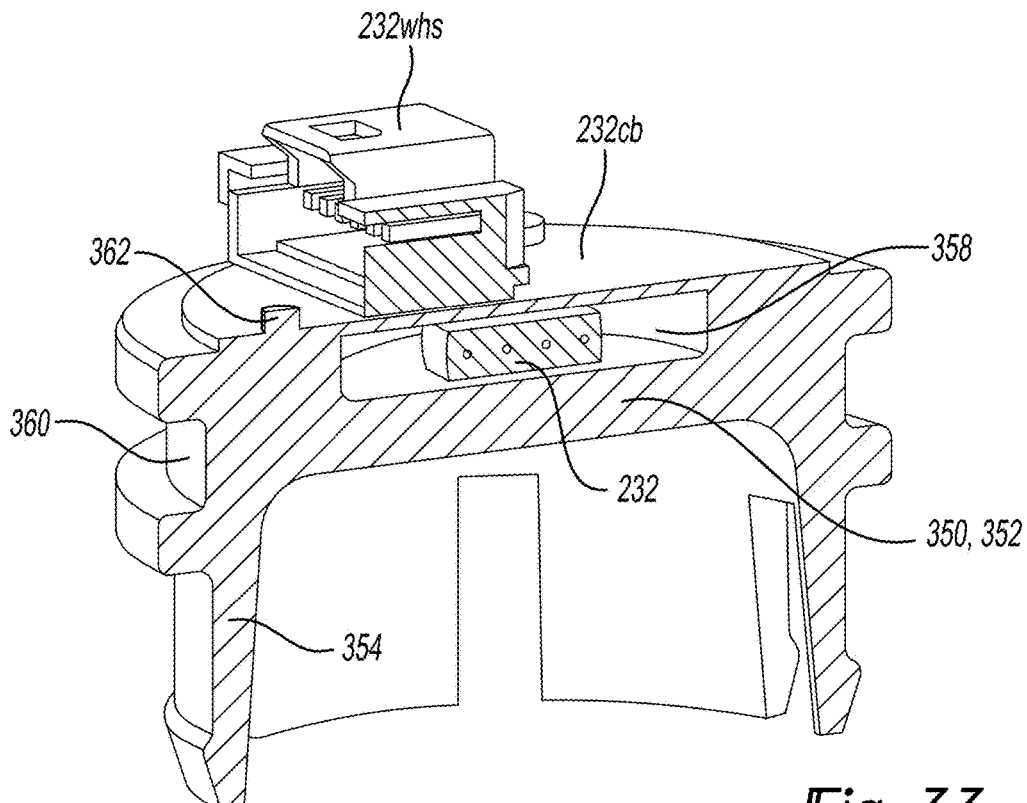
FIG. 33 is a section view taken through the sensor mount of FIG. 32.

With reference to FIGS. 31 through 33, the rotational position sensor 232 can be disposed on a circuit board that can be mounted to a plug or sensor mount 350 that is fitted into the bearing holder 264. The sensor mount 350 can have a body 352 and a plurality of fingers 354 that extend from and are resiliently (flexibly) coupled to the body 352. A recess 358 can be formed in the body 352 on a side of the body 352 that is opposite the fingers 354. A seal groove 360 can be disposed about the perimeter of the body 352. A plurality of posts 362 can extend from an axial end of the body 352 the side of the body 352 into which the recess 358 is formed. The circuit board 232cb of the rotational position sensor 232 can be abutted to the axial end of the body 352 such that the posts 362 extend through holes (not specifically shown) in the circuit board 232cb and various components of the rotational position sensor 232 are received into the recess 358. The posts 362 can be employed to heat-stake the circuit board 232cb to the body 352 to thereby fixedly couple the rotational position sensor 232 to the sensor mount 350. The circuit board 232cb further includes a wire harness socket 232whs that is configured to receive a connector on the wire harness 234. A suitable seal 370, such as an O-ring, is received into the seal groove 360. The sensor mount 350 is inserted into the interior of the bearing holder 264 such that the seal 370 is sealingly engaged to the interior surface of the sensor mount counterbore 274 and the body 352 of the sensor mount 350. If desired, a chamfer can be formed on the bearing holder 264 to aid in compressing the seal 370 when the sensor mount 350 is inserted into the bearing holder 264. The body 352 of the sensor mount 350 can abut an internal shoulder that is formed on the bearing holder 264 where the rotor shaft bore 270 intersects the sensor mount counterbore 274. The fingers 354 frictionally engage the interior surface of the rotor shaft bore 270 to inhibit axial movement of the sensor mount 350 along the motor output axis 50. A suitable sensor target 376 can be mounted to an axial end of the motor output shaft 52. In the example provided, the rotational position sensor 232 is a TMR sensor, and the sensor target 376 is a diametrically poled magnet that is secured to the motor output shaft 52 via a suitable adhesive. The wire harness 234 can be mounted to the wire harness socket 232whs to electrically couple the wire harness 234 to the rotational position sensor 232.

Figure 34:
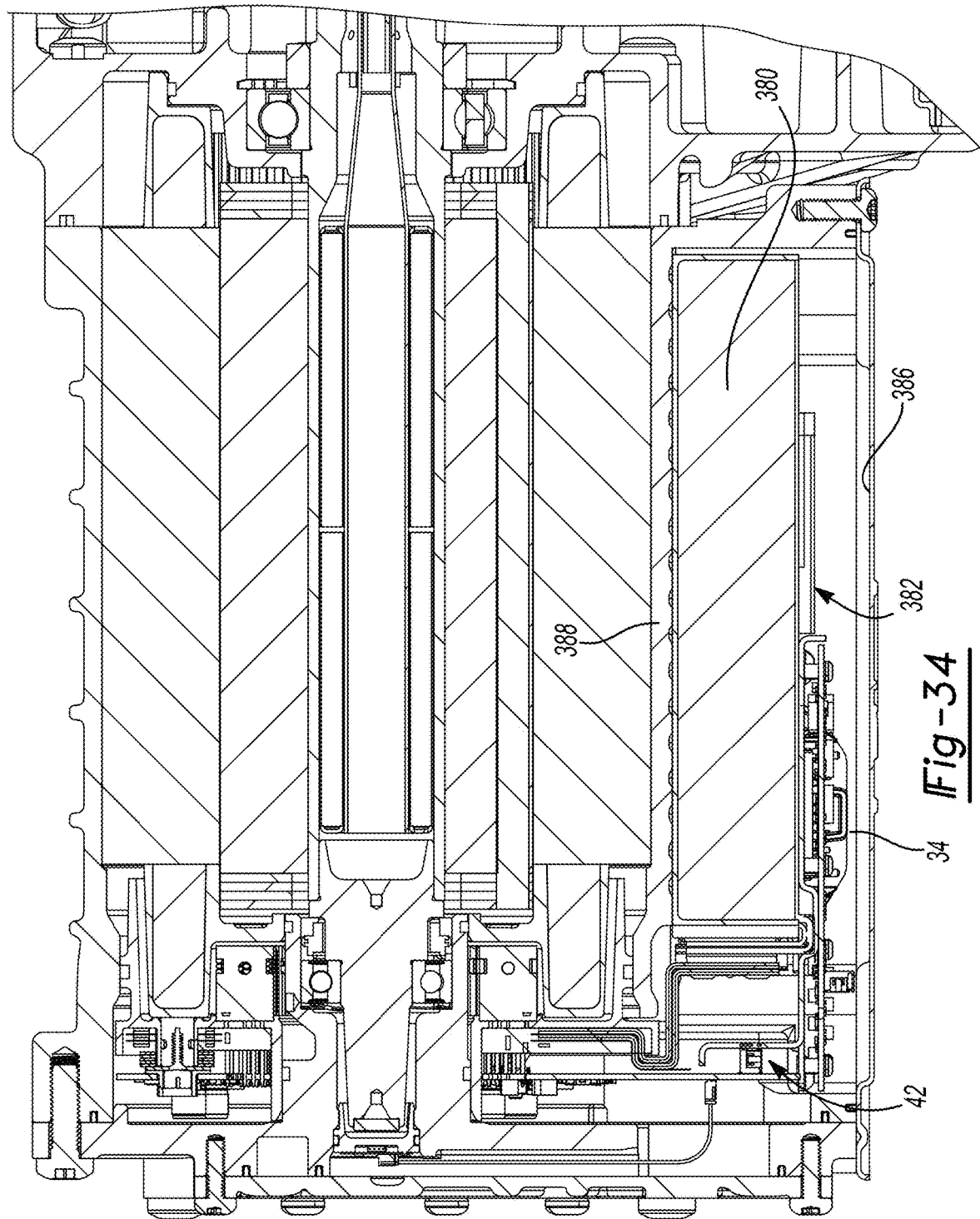
FIG. 34 is a longitudinal section view of the electric drive unit of FIG. 1, taken along a rotational axis of the rotor of the electric motor.
Figure 35:
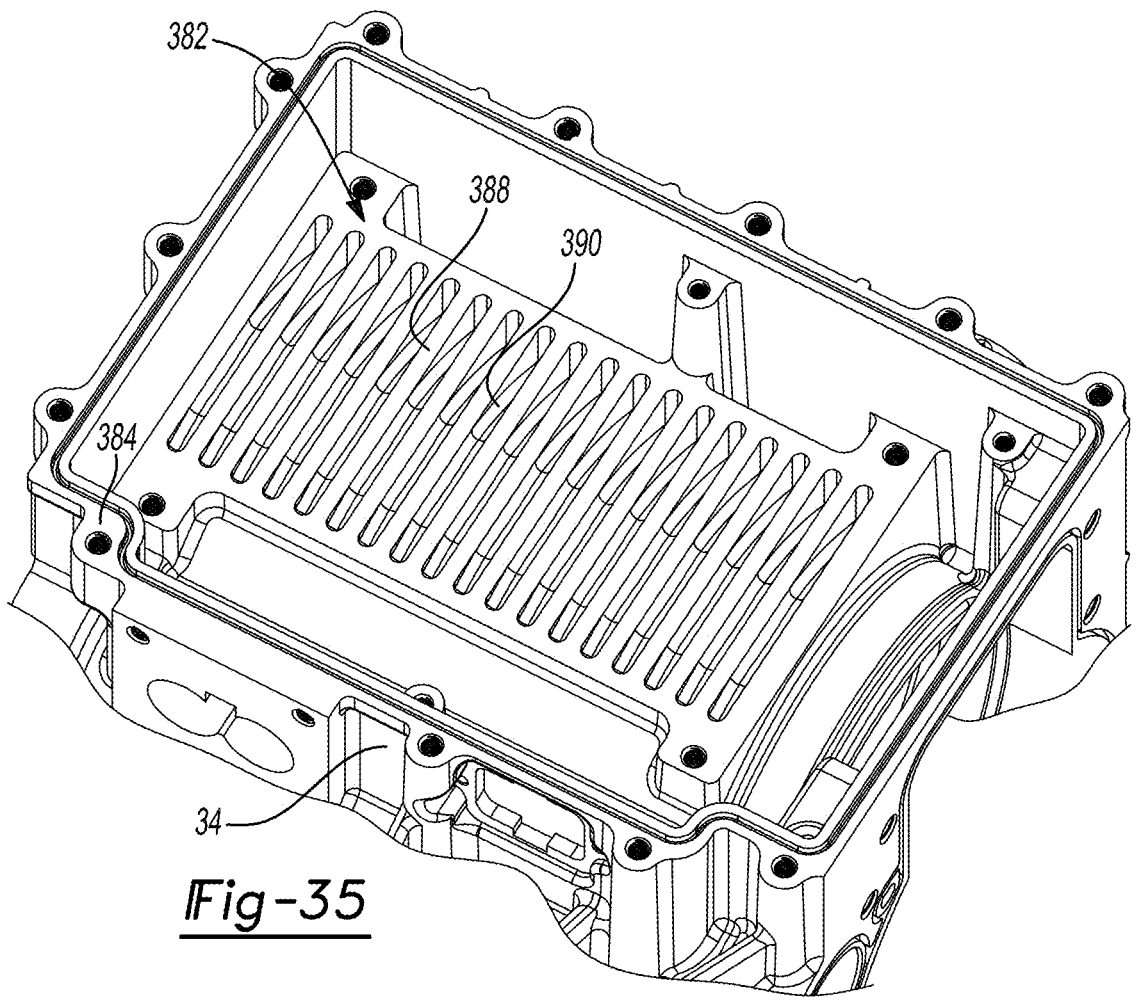
FIG. 35 is a perspective view of a portion of the electric drive unit of FIG. 1 illustrating a field capacitor cavity formed in the housing assembly.

With reference to FIGS. 34 and 35, the motor control unit 42 includes a field capacitor 380 that is received into a capacitor cavity 382 that is formed in the motor housing 34. The capacitor cavity 382 is surrounded by a mounting flange 384 against which a cover 386 is secured to close the open end of the capacitor cavity 382. The motor housing 34 includes a heat sink 388 that is configured to abut the field capacitor 380 when the field capacitor 380 is installed in the capacitor cavity 382. If desired, the heat sink 388 could be unitarily and integrally formed with the remainder of the motor housing 34, or could be a discrete component that is assembled to the remainder of the motor housing 34. Mass-reduction features, such as slots 390 can be formed into the heat sink 388 if desired. Threaded fasteners (not shown) can be employed to secure the field capacitor 380 to the heat sink 388. If desired, a thermally-conductive paste or foil can be disposed between the field capacitor 380 and the heat sink 388.

Figure 36:
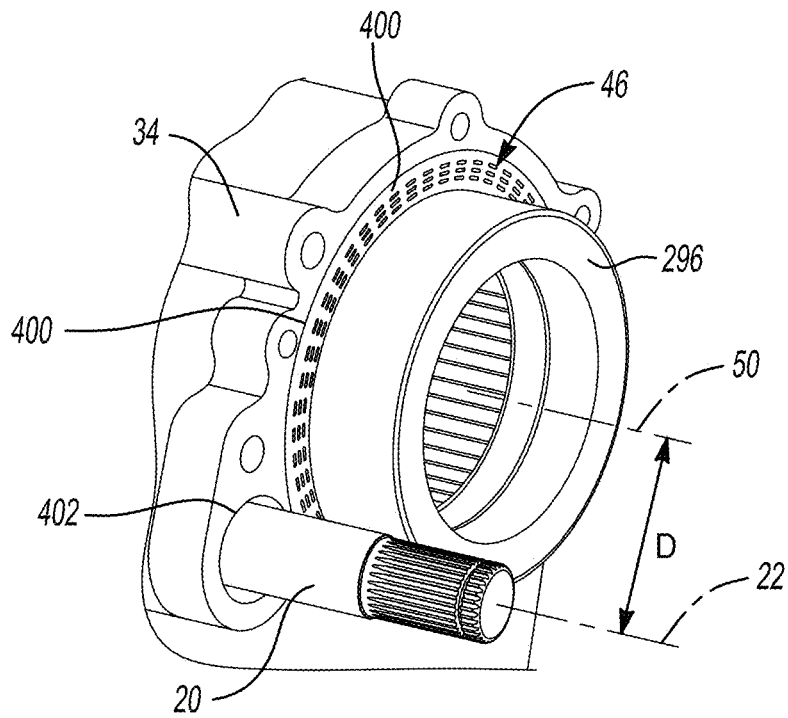
FIG. 36 is a perspective view of a portion of the electric drive unit of FIG. 1 illustrating a stator of the electric motor and an output shaft.

In FIG. 36, a stator bore 400 and an output shaft bore 402 are formed in the motor housing 34. The stator bore 400 is sized to receive the body 302 of the stator 46 therein and the central or longitudinal axis of the stator bore 400 is the motor output axis 50. The output shaft bore 402 is sized to receive a corresponding one of the output shafts 20 therein and the central or longitudinal axis of the output shaft bore 402 is the output axis 22. In the example provided, the stator bore 400 and the output shaft bore 402 are spaced apart from one another so that they do not intersect one another. If desired, however, the stator bore 400 and the output shaft bore 402 could intersect one another to reduce the overall volume of the electric drive unit 10 (FIG. 1). Stated another way, and assuming that the diameters of the stator bore 400 and the output shaft bore 402 were the same as those in the example illustrated in FIG. 36, the stator bore 400 could be configured to intersect the output shaft bore 402 such that the distance between the motor output axis 50 and the output axis 22 is smaller than the dimension D that is depicted in FIG. 36 (i.e., the distance D is smaller than the radius of the stator bore 400).

Figure 37:
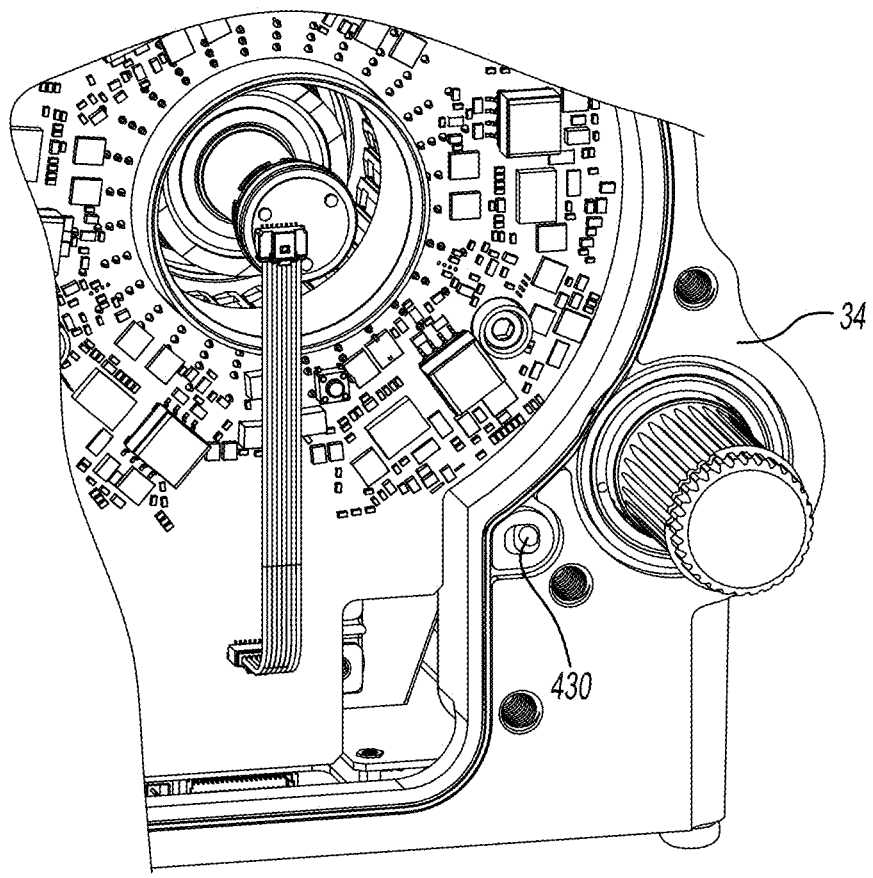
FIG. 37 is an elevation view of a portion of the electric drive unit of FIG. 1 illustrating a control board, an output shaft and a motor housing of the housing assembly.
Figure 38:
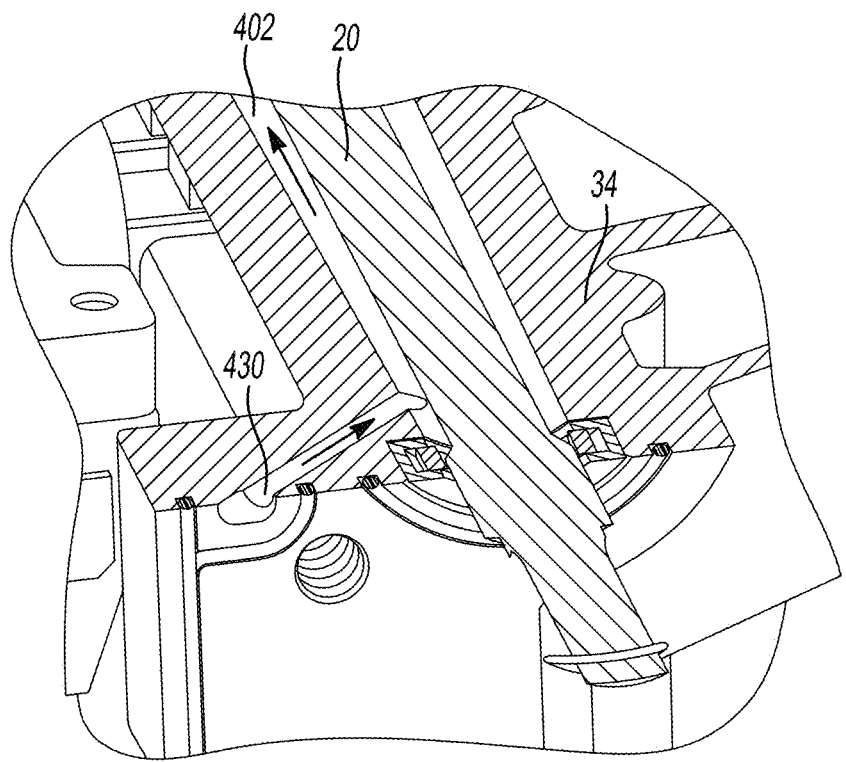
FIGS. 38 and 39 are perspective section views of portions of the electric drive unit of FIG. 1 illustrating the motor housing and the output shaft.
Figure 39:
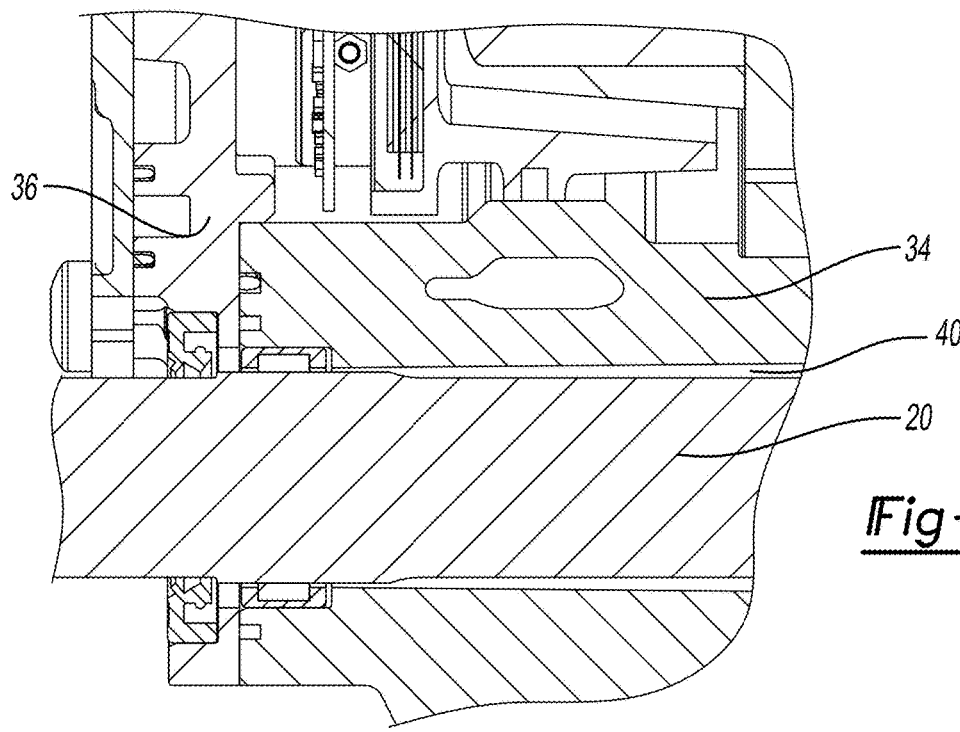

With reference to FIGS. 37 through 39, fluid that drain through the fluid drain gallery 234 (FIG. 23) in the motor housing cover 36 (FIG. 23) is directed axially through the motor housing cover 36 (FIG. 23) into a gallery 430 that is formed in the motor housing 34. The gallery 430 intersects the output shaft bore 402. The output shaft bore 402 is tapered, having a smaller diameter end proximate the axial end of the motor housing 34 that is adjacent the motor housing cover 36 (FIG. 2), and a larger diameter end proximate the axial end of the motor housing 34 that is adjacent the gearbox 32. Configuration in this manner aids the draining of fluid through the output shaft bore 402 to the sump 98 (FIG. 2), as well as ensures that sloshing fluid in the sump 98 (FIG. 2) cannot be pushed from the sump 98 (FIG. 2) to the rotor 48 (FIG. 2) via the output shaft bore 402, the gallery 430 and the fluid drain gallery 234 (FIG. 23).

Figure 40:
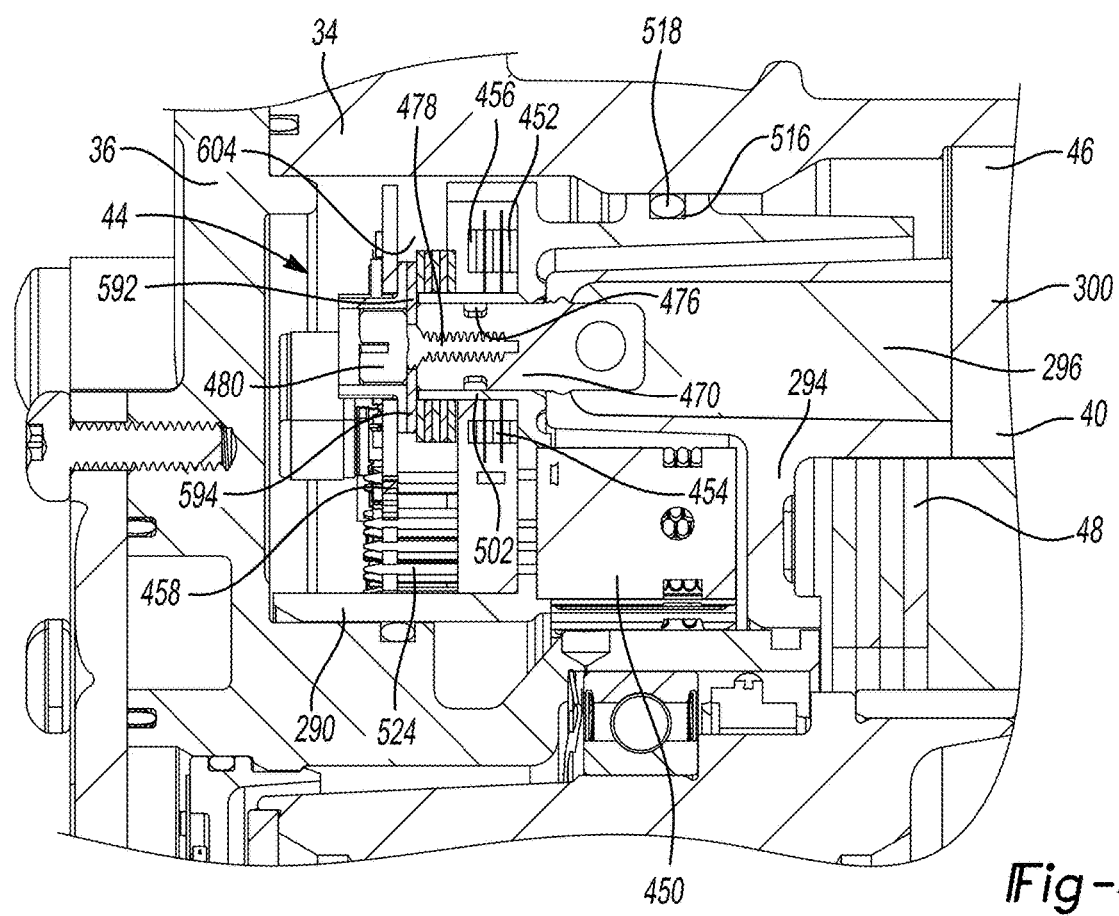
FIG. 40 is a section view of a portion of the electric drive unit of FIG. 1, illustrating portions of the inverter and the electric motor in more detail.

With reference to FIG. 40, the electrical connection between the electric motor 40 and the inverter 44 is shown in more detail. In addition to the inverter mount 290, the inverter 44 comprises a plurality of power semiconductors 450, a plurality of busbars (e.g., positive busbar 452, ground busbar 454, and a plurality of phase busbars 456), and an inverter circuit board 458. The inverter 44 controls the frequency of power supplied to the electric motor 40. More specifically, the inverter 44 employs the power semiconductors 450 (e.g., MOSFET's, IGBT's) to control the switching of DC electricity to create three AC electric outputs, each being associated with a given phase of the windings 296 of the stator 46. Each phase of the windings 296 is fixedly and electrically coupled to a bridge member 594 on an associated one of the phase busbars 456 in the inverter 44.

Figure 41:
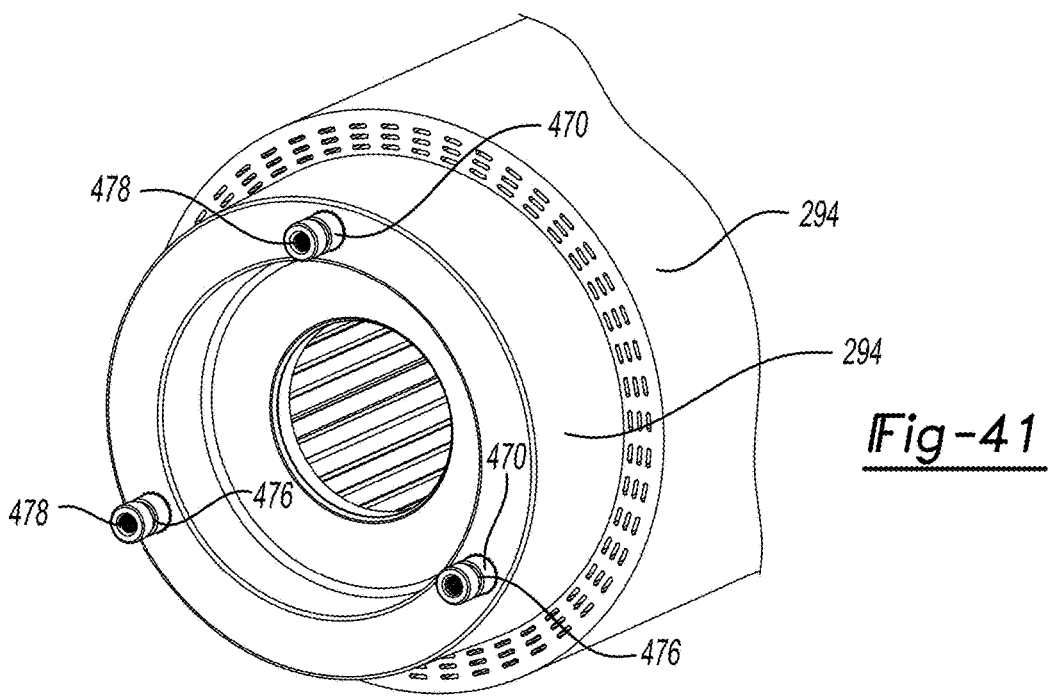
FIG. 41 is a perspective view of a portion of the electric motor, illustrating the stator in more detail.
Figure 42:
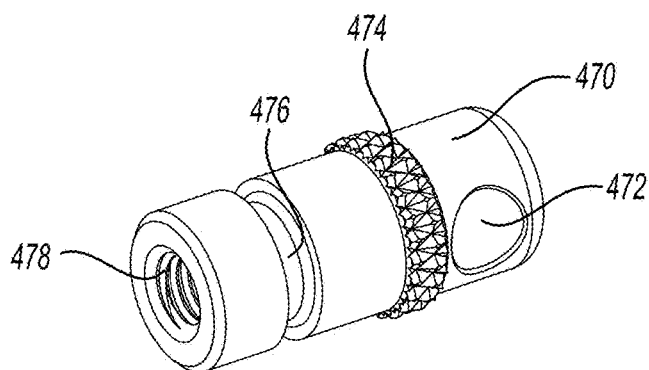
FIG. 42 is a perspective view of a portion of the electric motor, illustrating a phase terminal in more detail.

With additional reference to FIGS. 41 and 42, a phase terminal 470 is electrically coupled to each phase of the windings 296. In the example provided, an end (not shown) of the phase of the windings 296 is received into a winding aperture 472 in the phase terminal 470. In the example shown, the winding aperture 472 is transverse to the longitudinal axis of the phase terminal 470 and the end of the phase of the windings 296 is soldered to the phase terminal 470. The phase terminal 470 can further include an anti-rotation feature, such as knurling 474, a seal groove 476 and a connecting feature 478. The seal groove 476 can be configured to receive an associated seal, such as an O-ring, that can form a seal between the phase terminal 470 and the inverter mount 290. The connecting feature 478 aids in fixedly and electrically coupling the phase terminal 470 to an associated one of the phase busbars 456. In the example provided, the connecting feature 478 is a threaded aperture that is configured to receive a threaded fastener 480 that is inserted through the bridge member 594 on an associated one of the phase busbars 456 to thereby fixedly and electrically couple the phase terminal 470 to the bridge member 594.

The cap 294 can be formed by overmolding a material over the windings 296. The material that is used to form the cap 294 is an electrically insulating material but also has relatively good thermally conductive properties. The phase terminals 470 are partly encased in the material that forms the cap 294. More specifically, the portion of the phase terminals 470 that includes the winding aperture 472 and the knurling 474 is encased in the material that forms the cap 294. The knurling 474 and the material that forms the cap 294 cooperate to resist relative rotation between the phase terminal 470 and the cap 294.

Figure 43:
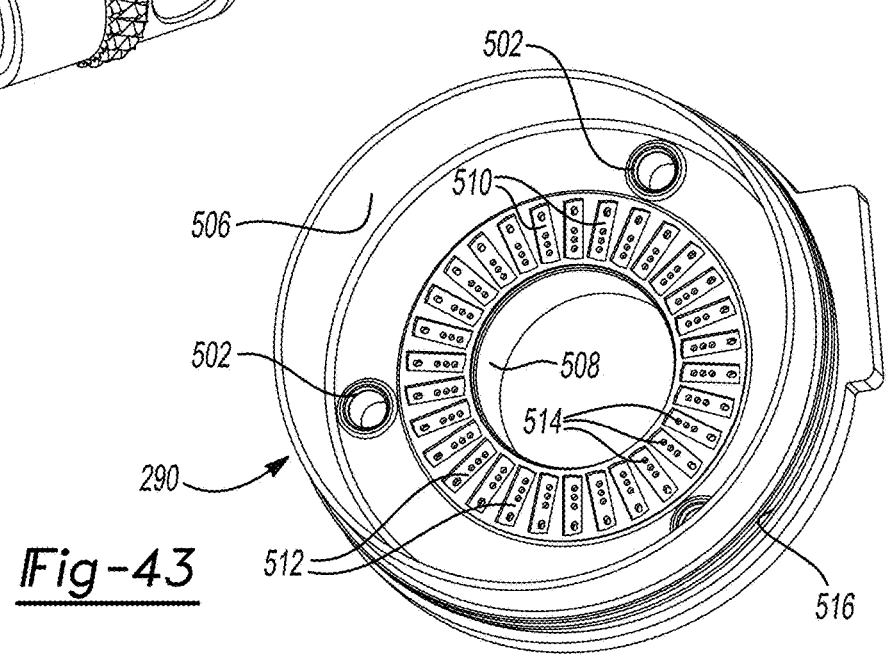
FIG. 43 is an end view of a portion of the inverter, illustrating an inverter mount in more detail.
Figure 44:
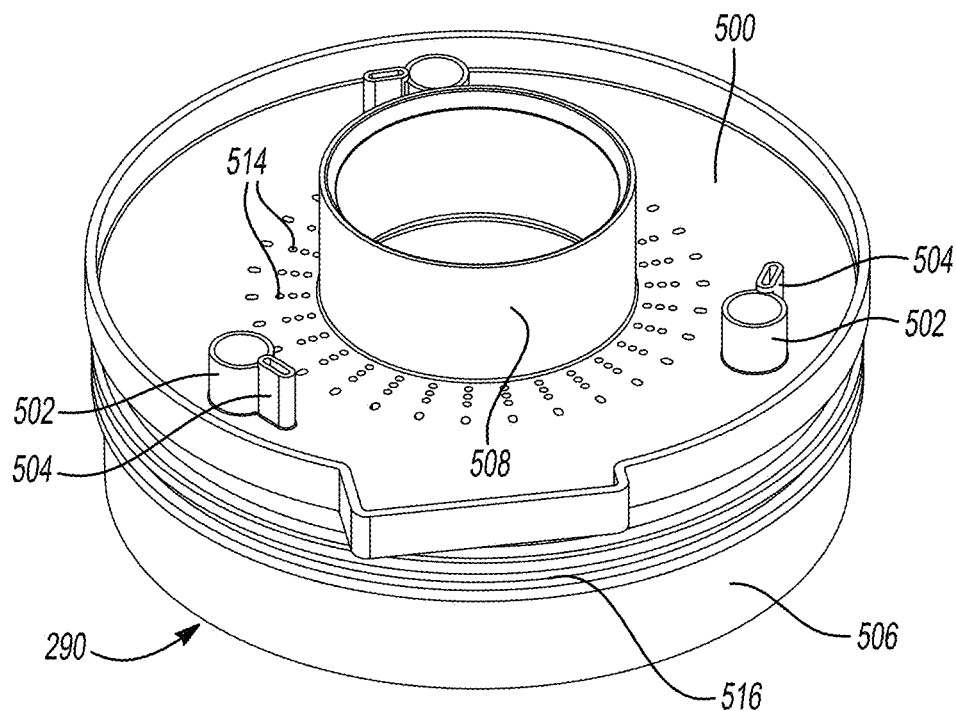
FIG. 44 is a bottom perspective view of the inverter mount.

With reference to FIGS. 43 and 44, the inverter mount 290 is illustrated in more detail. The inverter mount 290 can include a base 500, a plurality of terminal receptacles 502, a plurality of sensor receptacles 504, a first side wall 506 and a second side wall 508. The base 500 can have a generally annular configuration. A first axial side or face of the base 500 can have a central portion that is somewhat thicker than an outer portion that is disposed radially outwardly of the central portion. A second, opposite side or face of the base 500 can be flat. The base 500 can define a plurality of semiconductor mounts 510 that can be formed into the central portion on the first face of the base 500. Each of the semiconductor mounts 510 can define a semiconductor recess 512 and a plurality of semiconductor terminal apertures 514. The semiconductor mounts 510 can be disposed in any desired arrangement, but in the particular example provided, the semiconductor mounts 510 are disposed in a ring-shaped arrangement. The semiconductor terminal apertures 514 are disposed in each the semiconductor recess 512 and are formed through the base 500. Each of the terminal receptacles 502 can have a first portion, which is located on the portion of the base 500 that is disposed radially outwardly of the central portion and which extend axially away from the first face of the base 500, and a second portion that extends axially away from the second face of the base 500. In the example shown, each of the terminal receptacles 502 is a generally tubular structure that is disposed through the outer portion of the base 500. The terminal receptacles 502 can be spaced circumferentially apart from one another. Each of the sensor receptacles 504 can extend from the second face of the base 500 and can intersect an associated one of the terminal receptacles 502. The first and second sidewalls 506 and 508 can be fixedly coupled to the base 500 and can encircle the outer perimeter and the inner perimeter, respectfully, of the base 500. The first side wall 506 can extend from the first face of the base 500 by a relatively large distance and from the second face of the base 500 by a relatively short distance. The second side wall 508 can extend from the second face of the base 500 by a relatively large distance and from the first face of the base by a relatively small distance. A seal groove 516 is formed about the first side wall 506 and is configured to receive a seal 518 (FIG. 40) therein that sealingly engages the first side wall 506 and the motor housing 34 (FIG. 40. A seal that is mounted in the first external seal groove 276 (FIG. 25) in the bearing holder 264 (FIG. 25) is sealingly engaged to the bearing holder 264 (FIG. 25) and the radially inner surface of the second side wall 508.

Figure 45:
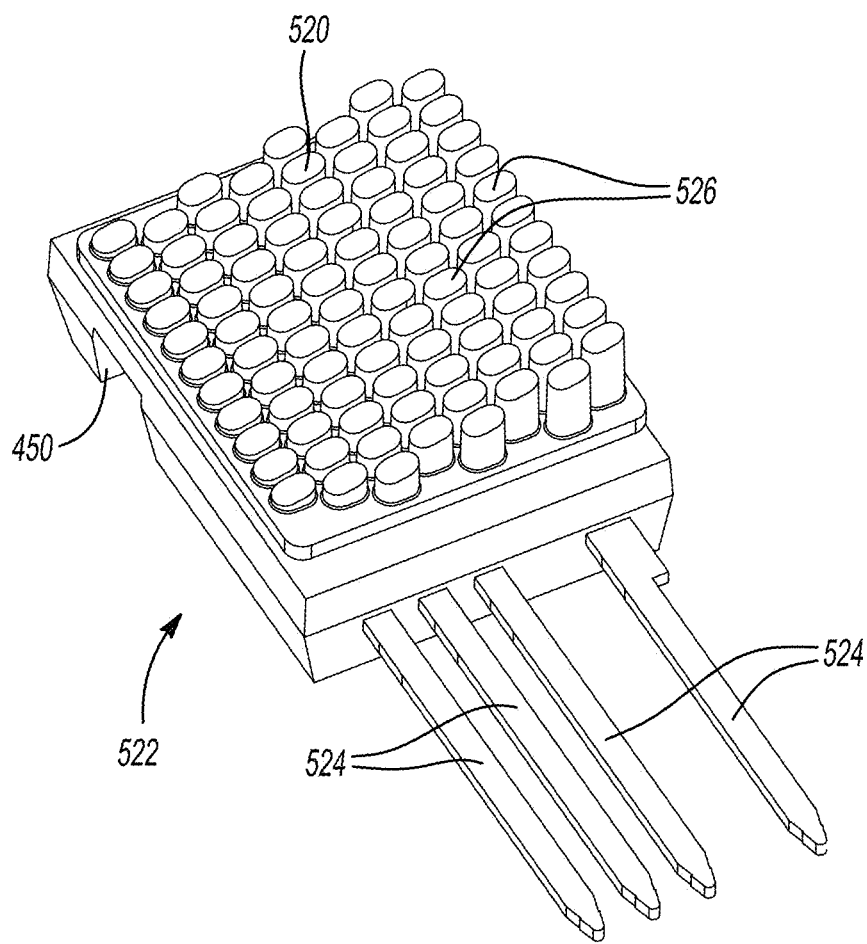
FIG. 45 is a perspective view of a portion of the inverter, illustrating a heat-sinked power semiconductor in more detail.

In FIG. 45, a heat sink 520 is illustrated as being fixedly coupled to one of the power semiconductors 450 to form a heat-sinked power semiconductor assembly 522. The power semiconductor 450 includes a plurality of pins or terminals 524. The heat sink 520 can be formed of a suitable thermally conductive material and can be electrically coupled to an associated one of the terminals 524. As a non-limiting example, the heat sink 520 could be formed of a metal material, such as aluminum, brass, bronze or copper. The heat sink 520 can define a plurality of fins 526 that can be employed to discharge heat into a flow of fluid passing through the fins 526. In the particular example illustrated, the fins 526 comprise rod-like projections having an oval cross-sectional shape, but it will be appreciated that the fins 526 can be formed in any desired manner and can have any desired cross-sectional shape (e.g., circular, rectangular, diamond). The heat sink 520 could be unitarily and integrally formed, and if desired, the fins 526 can be formed with draft (i.e., taper along their longitudinal axis). Alternatively, the fins 526 could be discrete components that are assembled/fixedly coupled to a base of the heat sink 520. Each of the heat sinks 520 can be disposed between a pair of the power semiconductors 450 (i.e., each heat sink 520 is physically coupled to one of the power semiconductors 450 and is adjacent, but circumferentially spaced from, another power semiconductor 450). Each heat sink 520 can be configured such that the height of the fins 526 (i.e., a distance that the fins 526 extend from the power semiconductor 450 of a given heat-sinked power semiconductor assembly 522) on a radially inward end of the heat sink 520 can be shorter than the height of the fins 526 on a radially outward end of the heat sink 520. Accordingly, the height of the heat sink 520 of a heat-sinked power semiconductor assembly 522 can taper between the radially inward end of the heat-sinked power semiconductor assembly 522 and the radially outer end of the heat-sinked power semiconductor assembly 522.

Figure 46:
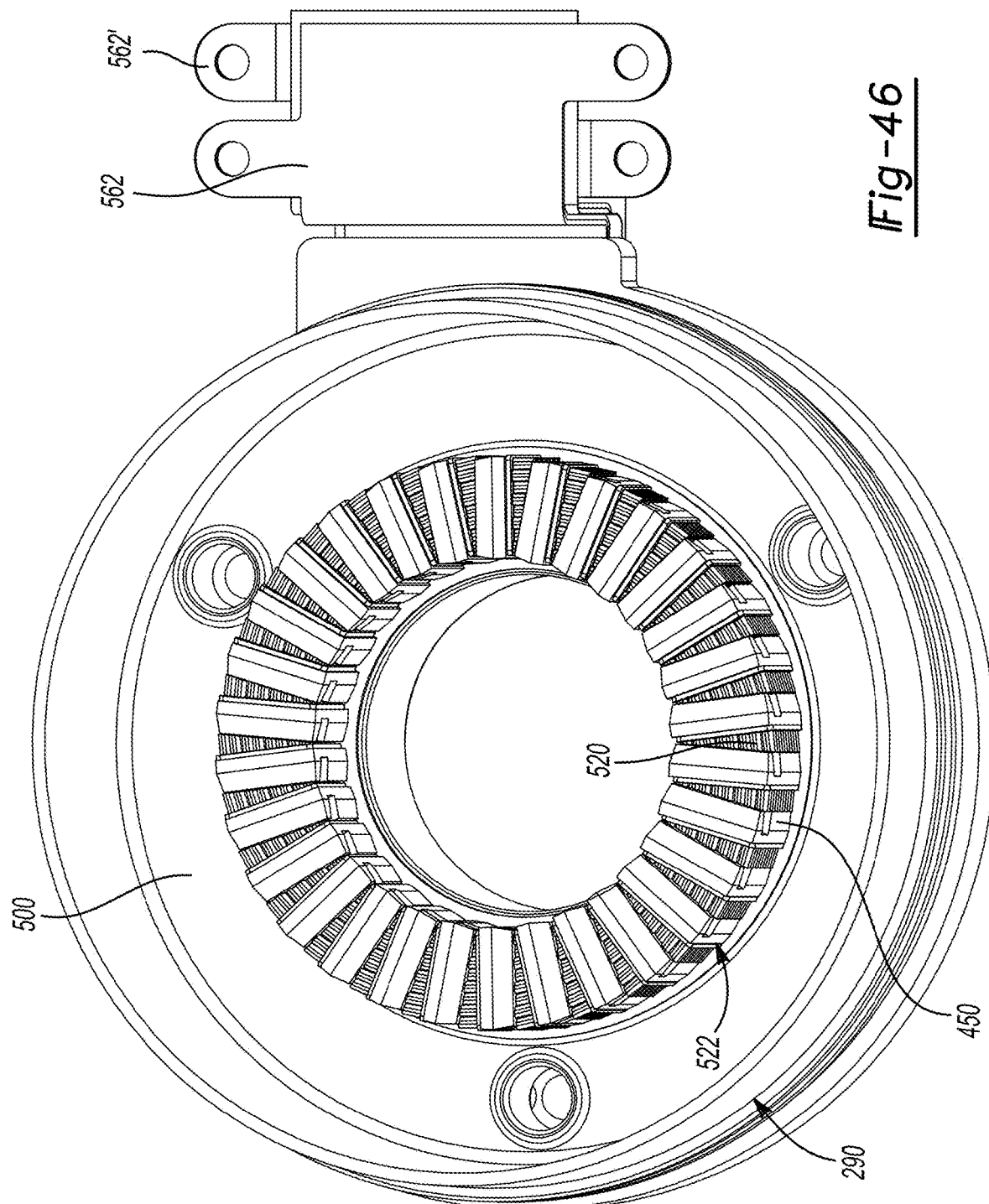
FIG. 46 is a perspective view of a portion of the inverter, illustrating the heat-sinked power semiconductors and a plurality of bus bars being coupled to the inverter mount.

With reference to FIGS. 43, 45 and 46, each of the heat-sinked power semiconductor assembly 522 can be mounted in a respective one of the semiconductor mounts 510 on the inverter mount 290 such that each of the power semiconductors 450 is received into a corresponding one of the semiconductor recesses 512 and the terminals 524 on each of the power semiconductors 450 are received through semiconductor terminal apertures 514.

Figure 47:
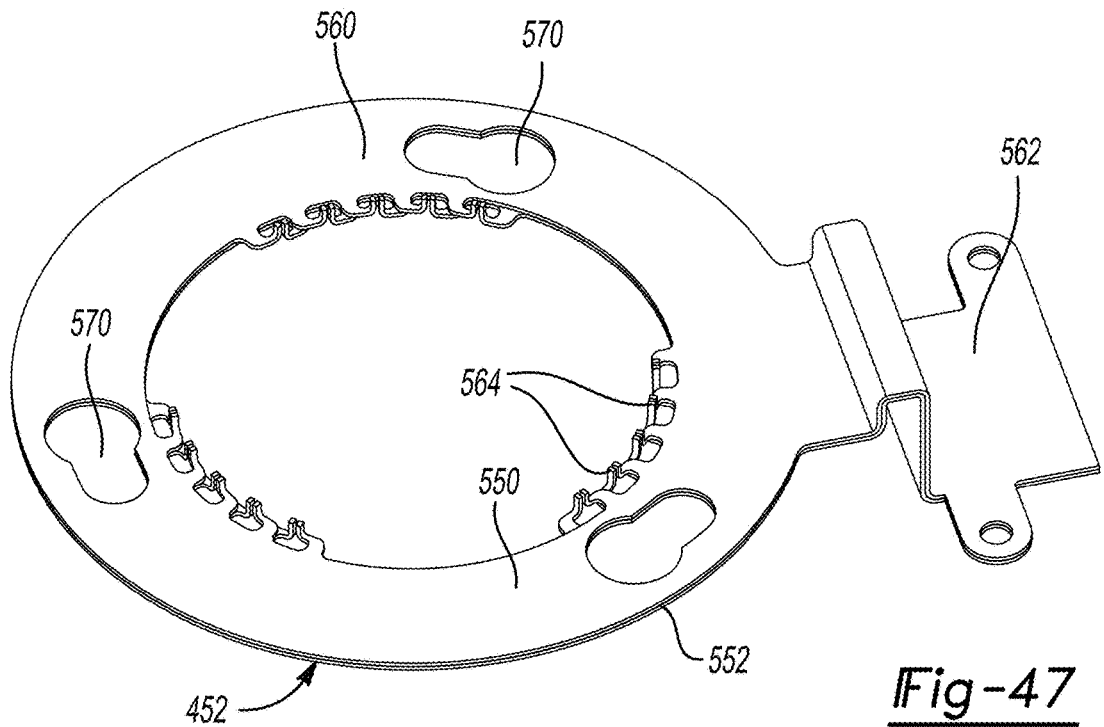
FIG. 47 is a perspective view of a portion of the inverter, illustrating a positive busbar in more detail.
Figure 48:
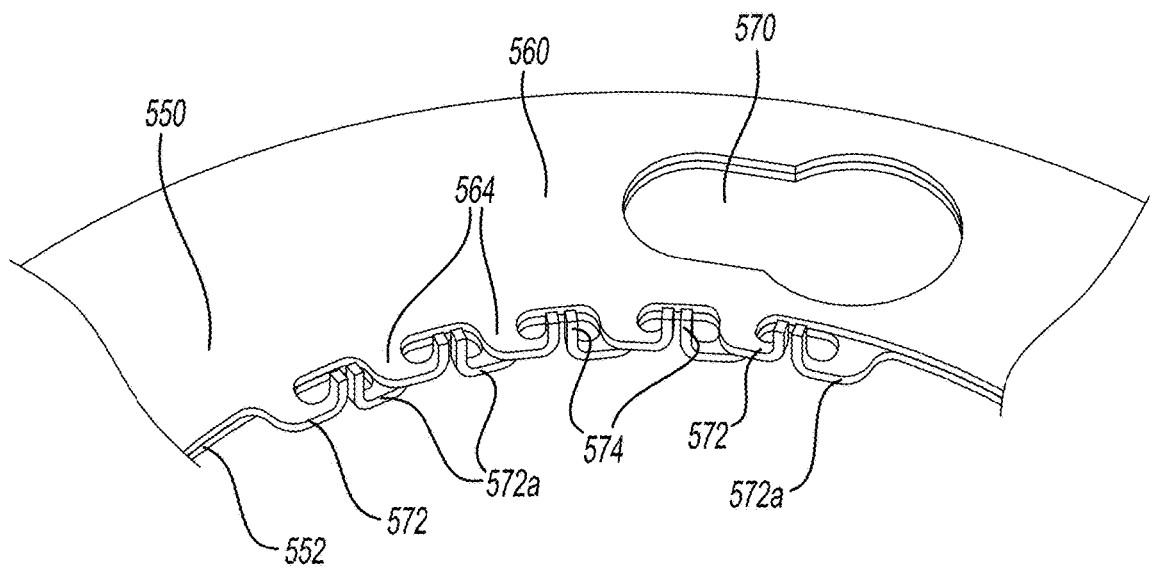
FIG. 48 is an enlarged portion of FIG. 47.

With reference to FIGS. 47 and 48, the positive busbar 452 includes a first busbar portion 550 and a second busbar portion 552 that are fixedly and electrically coupled to one another. The first and second busbar portions 550 and 552 can be generally similar in their construction and as such, only the first busbar portion 550 will be described in detail herein. The first busbar portion 550 can be formed of an electrically conductive material, such as copper, and can include an annular body 560, a conductor link 562 and a plurality of fingers 564. The annular body 560 is sized to be received within the first side wall 506 (FIG. 44) in the inverter mount 290 (FIG. 44). The inner circumference of the annular body 560 can be disposed radially outwardly of the semiconductor terminal apertures 514 (FIG. 44). A plurality of apertures 570 can be formed through the annular body 560 that permit the annular body 560 to be received over the terminal receptacles 502 (FIG. 44) and the sensor receptacles 504 (FIG. 44). The conductor link 562 can extend radially outwardly from the annular body 560 and can be configured to extend over the inverter mount 290 (FIG. 46) where it can be disposed at a location where it can be electrically coupled to a capacitor (not shown). Each of the fingers 564 can having a first portion 572 and a second portion 574. The first portion 572 can be generally L-shaped, having a leg that extends radially inwardly from the inner circumferential edge of the annular body 560, and an arm that extends away from the leg in a first circumferential direction. The second portion 574 can extend from the distal end of the arm in a direction that is perpendicular to the annular body 560. It should be noted that the arms of the first portion 572a of the fingers 564 of the second busbar portion 552 extends away from an associated one of the legs in a second, opposite circumferential direction so that the arms of the first portions 572 and 572a face one another. It will be appreciated that the fingers 564 are configured to electrically connect to a first set of the terminals 524 (FIG. 45) on a first set of the power semiconductors 450 (FIG. 46).

Figure 49:
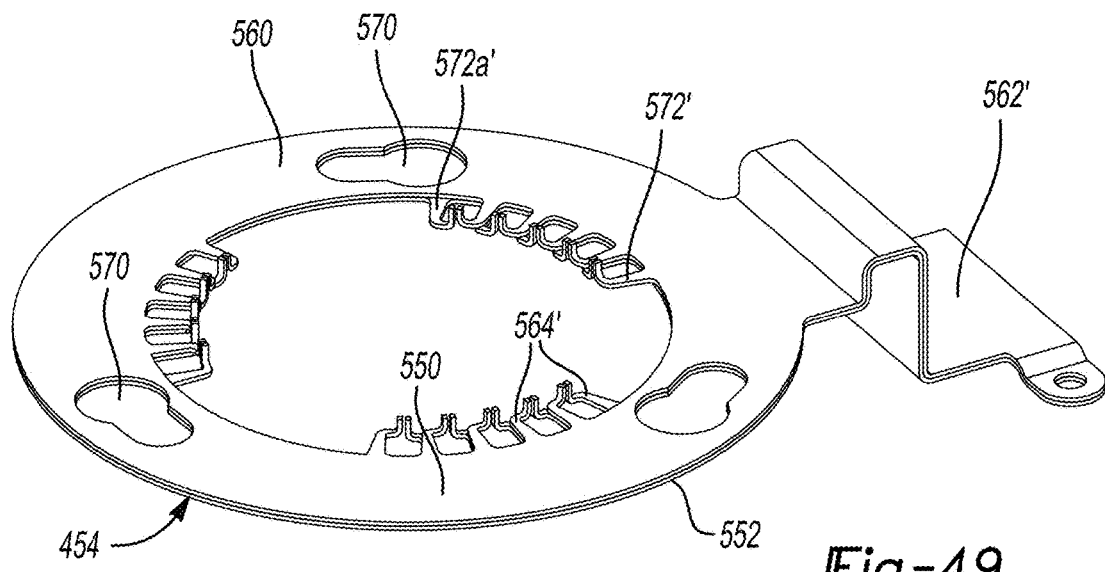
FIG. 49 is a perspective view of a portion of the inverter, illustrating a ground busbar in more detail.

The ground busbar 454 is illustrated in FIG. 49 and has a configuration that is generally similar to that of the positive busbar 452 (FIG. 47) except for the locations of the fingers 564' and the radial length of the legs of the first portions 572', 572a' of the fingers 564'. In this regard, the fingers 564' are configured to electrically connect to a second set of the terminals 524 (FIG. 45) on a second set of the power semiconductors 450 (FIG. 46).

Figure 50:
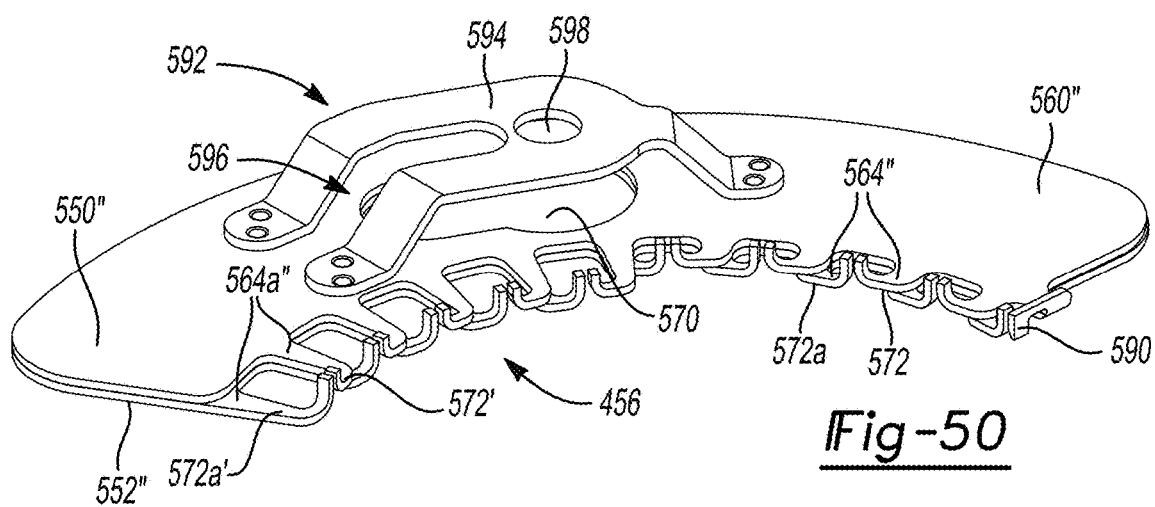
FIG. 50 is a perspective view of a portion of the inverter, illustrating a phase busbar in more detail.
Figure 51:
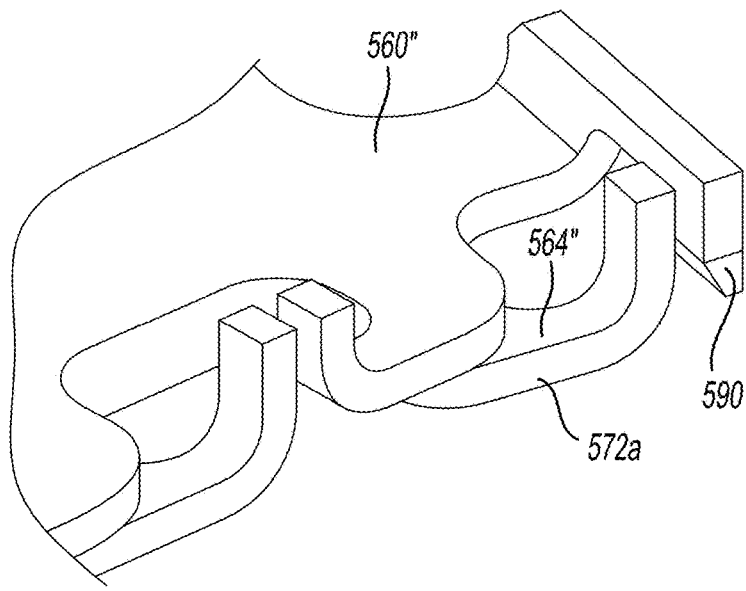
FIG. 51 is an enlarged portion of FIG. 50.

With reference to FIGS. 50 and 51, each phase busbar 456 can be formed in a manner that is similar to that of the positive busbar 452 (FIG. 47) except that the phase busbars 456 do not include a conductor link, each phase busbar 456 has first and second busbar portions 550" and 552" that each have an annular segment-shaped body 560", and the phase busbars 456 each include sets of different fingers 564", 564a", an end finger 590, and a bridge 592. In the example provided, the fingers 564a" are relatively longer than the fingers 564", and the quantity of sets of the fingers 564" is equal to the quantity of sets of fingers 564a" on each of the phase busbars 456. The end finger 590 is configured to extend outwardly from the annular segment-shaped body 560" of the phase busbar 456. The bridge 592 has a bridge member 594 that is parallel to but spaced apart from the first busbar portion 550". A sensor slot 596 is formed through one side of the bridge 592, while a fastener aperture 598 is formed through the bridge member 594. The bridge 592 can be fixedly coupled to the first busbar portion 550" in any desired manner, such as projection welding.

With reference to FIGS. 40, 44, 45 and 52, the positive busbar 452 can be received within the first side wall 506 in the inverter mount 290 such that the positive busbar 452 is abutted against the second side of the base 500 and each adjacent pair of the arms 574, 574a (FIG. 48) is engaged to opposite sides of one of the terminals 524 on a respective one of the power semiconductors 450. A first electrically insulating member can be disposed over the positive busbar 452 and the ground busbar 454 can be positioned within the first side wall 506 in the inverter mount 290 such that the ground busbar 454 is abutted against the first electrically insulating member and each adjacent pair of the arms of the fingers 564' (FIG. 49) is engaged to opposite sides of one of the terminals 524 on a respective one of the power semiconductors 450. A second electrically insulating member can be disposed over the ground busbar 454 and each of the phase busbars 456 can be positioned within the first side wall 506 and abutted against the second insulator. Each adjacent pair of the arms of the fingers 564" and 564a" (FIG. 50) of the phase busbar 456 is engaged to opposite sides of one of the terminals 524 on a respective one of the power semiconductors 450. The positive busbar 452, the ground busbar 454 and each of the phase busbars 456 can be oriented relative to the inverter mount 290 such that the terminal receptacles 502 and an adjacent one of the sensor receptacles 504 are received through each of the apertures 570. Each of the terminals can be soldered, sintered or welded to the set of fingers that connect the terminal to an associated one of the busbars to thereby mechanically and electrically couple the terminals and busbars.

Figure 52:
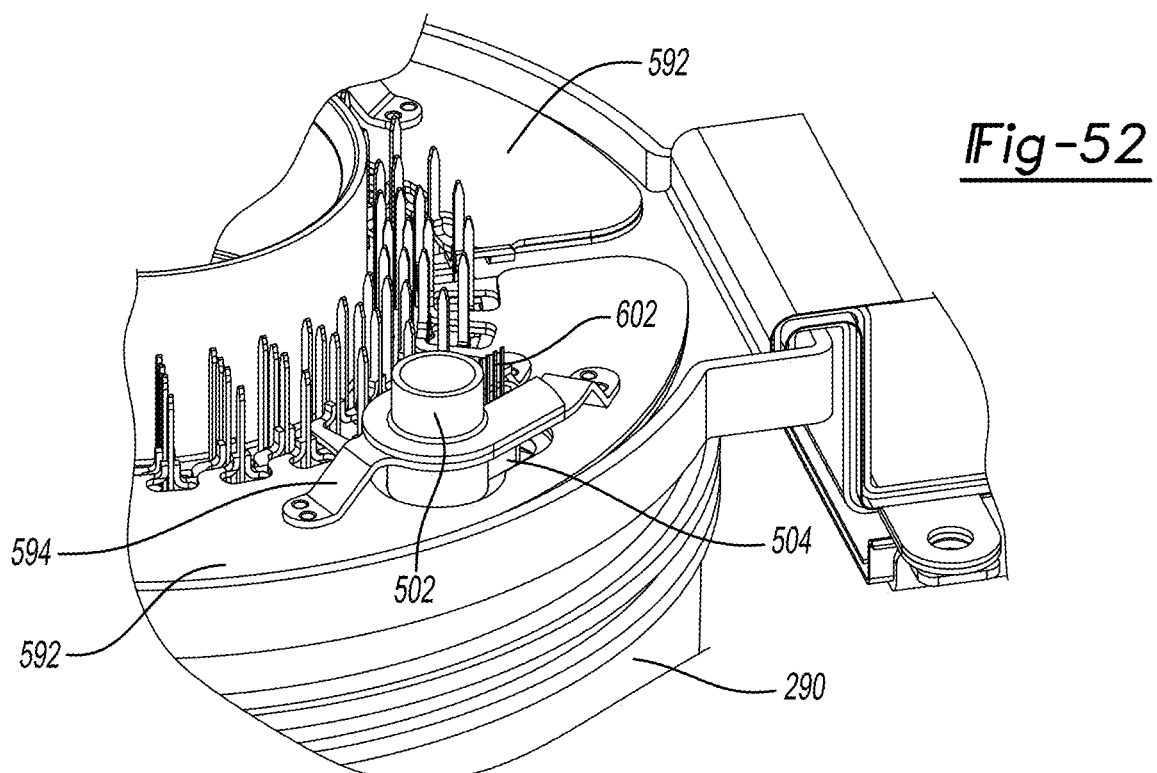
FIGS. 52 and 53 are perspective views of portions of the inverter that illustrate the busbars and the heat-sinked power semiconductors assembled to the inverter mount.
Figure 53:
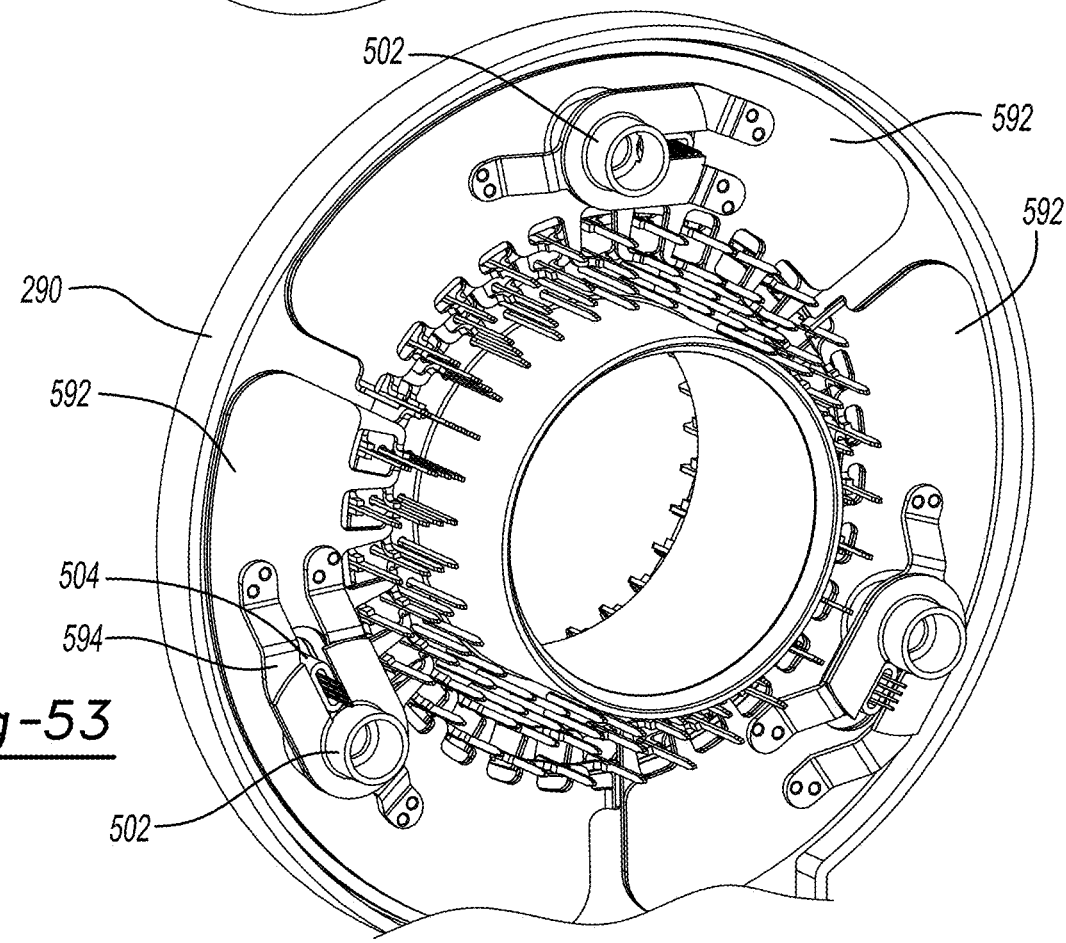
Figure 54:
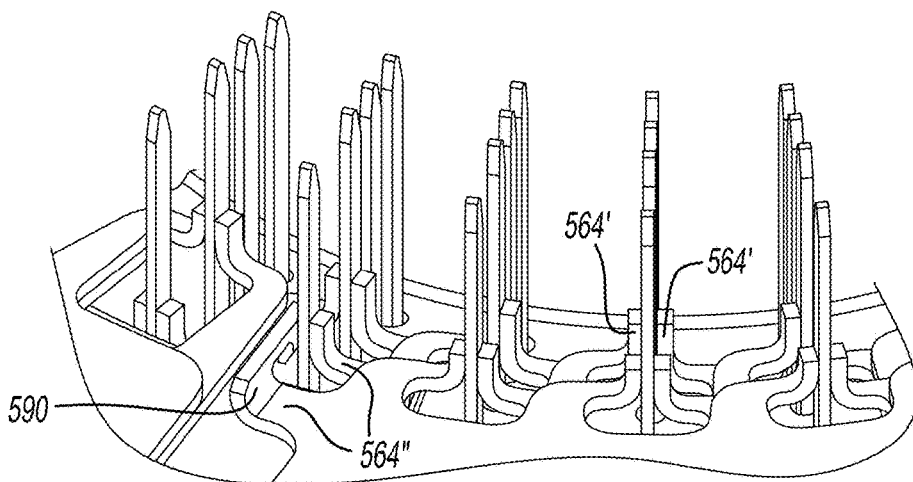
FIG. 54 is a perspective view illustrating the busbars as coupled to the heat-sinked power semiconductors.

With reference to FIGS. 52 through 54, it will be appreciated that assembly of the several busbars to the power semiconductors in this manner will position the distal ends of each of the fingers and end fingers in abutment with an associated one of the terminals 524 on an associated one of the power semiconductors 450. Thereafter, the fingers and end fingers can be fixedly and electrically coupled to the terminals 524, for example by resistance welding or resistance soldering adjacent pairs of them to the terminals 524.

Figure 55:
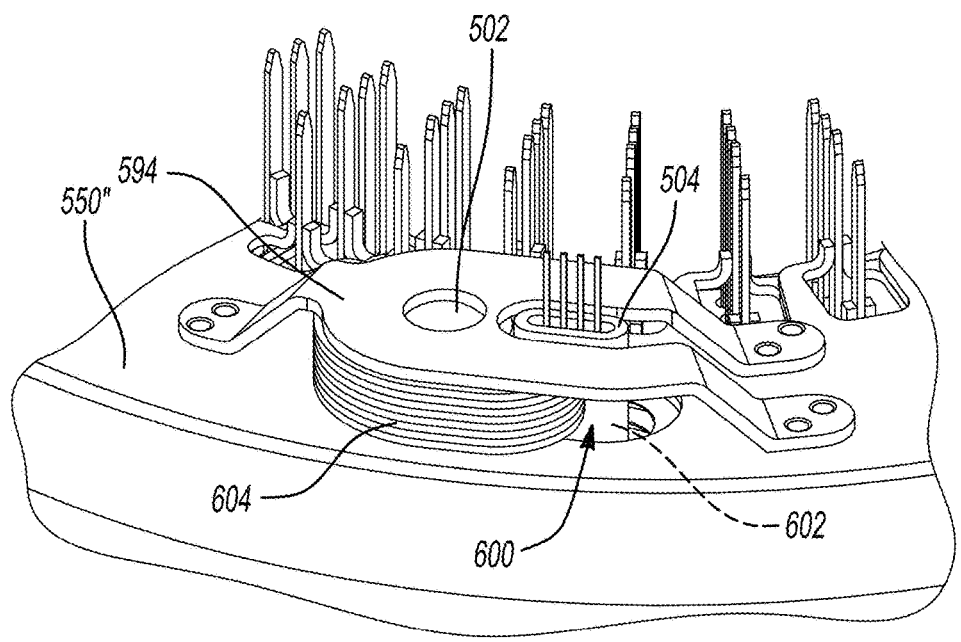
FIG. 55 is a perspective view of a portion of the inverter, illustrating the integration of a current sensor with a phase busbar.
Figure 56:
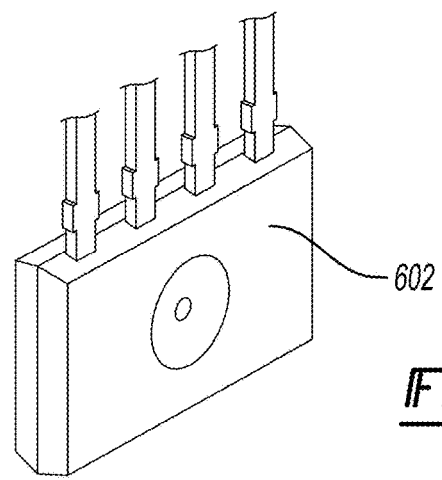
FIG. 56 is a perspective view of a sensor that is employed in the current sensor shown in FIG. 55.

In FIGS. 55 and 56, the motor control unit 42 (FIG. 2) includes a plurality of current sensors 600, each of which being associated with a corresponding set of the terminal receptacles 502, the sensor receptacles 504, and the bridges 592 on the phase busbars 456. Each of the current sensors comprises a sensor 602 and a plurality of C-shaped sensor laminations 604. The sensor 602 can be an eddy current sensor and can be received in the sensor receptacle 504. The sensor laminations 604 are abutted against one another and are received about the terminal receptacle 502 between the first busbar portion 550" and the bridge member 594. The open ends of the sensor laminations 604 are disposed on opposite sides of the sensor receptacle 504 (i.e., a radially inner side and a radially outer side).

With additional reference to FIG. 40, the terminals 524 of the power semiconductors 450 and the terminals of the sensor 602 are received into the inverter circuit board 458 and can be electrically coupled to other componentry of the inverter circuit board 458 in a desired manner. The phase terminals 470 are received into the terminal receptacles 502 and the seal that is disposed in the seal groove 476 in each of the phase terminals 470 forms a seal between the phase terminal 470 and the inverter mount 290 that inhibits the flow of fluid therethrough. The threaded fastener 480 is received through the fastener aperture 598 in the bridge member 594 and is threadably engaged to the connecting feature 478 to fixedly and electrically couple the phase terminal 470 to the phase busbar 456.

During operation of the electric motor 40, current passing from the bridge member 594 of the phase busbar 456 to the phase terminal 470 will generate a magnetic field that will correspondingly generate eddy currents in the sensor laminations 604. The sensor 602 is configured to sense the eddy currents in the sensor laminations 604 and responsively generate a sensor signal that is indicative of a magnitude of eddy currents in the sensor laminations. Significantly, the current sensor 602 is positioned in as close a proximity to the interface between the phase busbar 456 and the phase terminal 470 as is possible.

Figure 57:
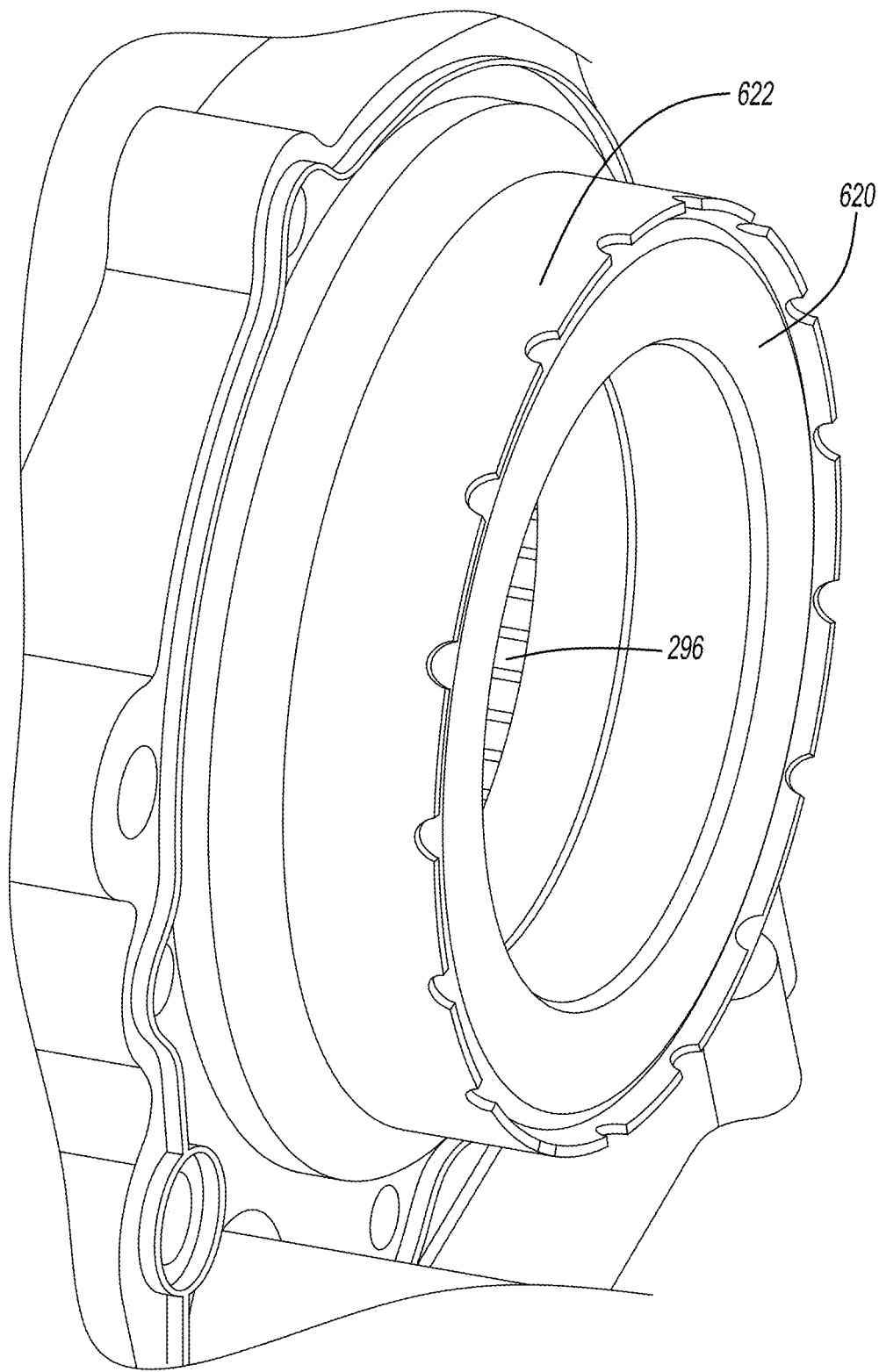
FIG. 57 is a perspective view of a portion of the electric drive unit of FIG. 1, illustrating the stator and an annular oil diverter in more detail.
Figure 58:
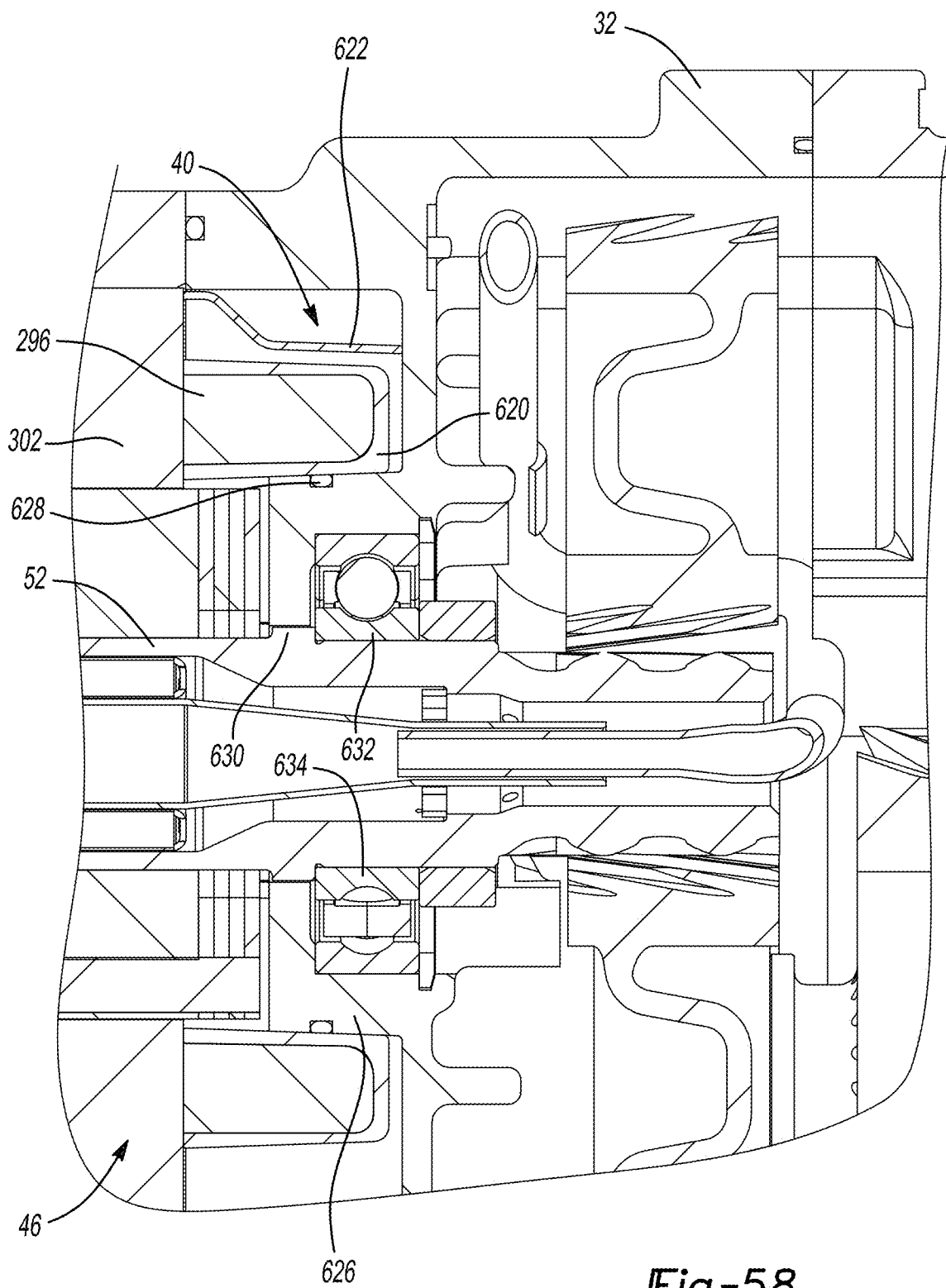
FIG. 58 is a section view of a portion of the electric drive unit of FIG. 1, illustrating the electric motor in more detail.

FIGS. 57 and 58 depict a second cap 620 that is coupled to (e.g., overmolded over) the windings 296 on an end of the motor 40 that extends into a cavity formed by the gearbox 32. The second cap 620 can be generally similar to the cap 294 (FIG. 25). An annular oil diverter 622 is mounted about the second cap 620 and aids in directing fluid discharged from the cooling channels 300 (FIG. 25) to flow against the outer circumferential surface of the second cap 620 as well as an axial end of the second cap 620 that is spaced apart from the body 302 of the stator 46. A cylindrical projection 626 can be formed on the gearcase 32 and can extend into the second cap 620. A seal 628, such as an O-ring, can be received into a groove formed in the cylindrical projection 626 and can sealingly engage the inside circumferential surface of the second cap 620. A bore 630 can be formed through the axial end of the cylindrical projection 626 and can intersect a bearing bore 632 that houses a bearing 634 that supports the motor output shaft 52. The bore 630 can be sized to receive the motor output shaft 50 in a non-contacting manner. If desired, a non-contact seal, such as one of the non-contact seals shown in FIG. 59, can be mounted in the bore 630 to resist migration of fluid through the axial end of the cylindrical projection 626.

With reference to FIGS. 60 through 63, an alternately configured inverter is shown. With reference to FIG. 60, the field capacitor 380b in this example is received in the motor housing 34 and has an annular configuration. The inverter 44 is received radially within the field capacitor 380b. If desired, the field windings 296 can be encapsulated in an encapsulant material 700 that can form an annular chamber into which the field capacitor 380b can be received. The encapsulant material 700 can be cohesively bonded to the motor housing 34. Optionally, the encapsulant material 700 can be sealingly engaged with a seal member to form a seal between the encapsulant material and another component. For example, an O-ring 702 that is mounted to the motor cover 36b can form a seal between the motor cover 36b and the encapsulant material 700, while another O-ring 704, which is mounted to the bearing holder 264, can form a seal between the bearing holder 264 and an inside diametrical surface of an annular flange 706 that is formed by the encapsulant material 700.

Figure 61:
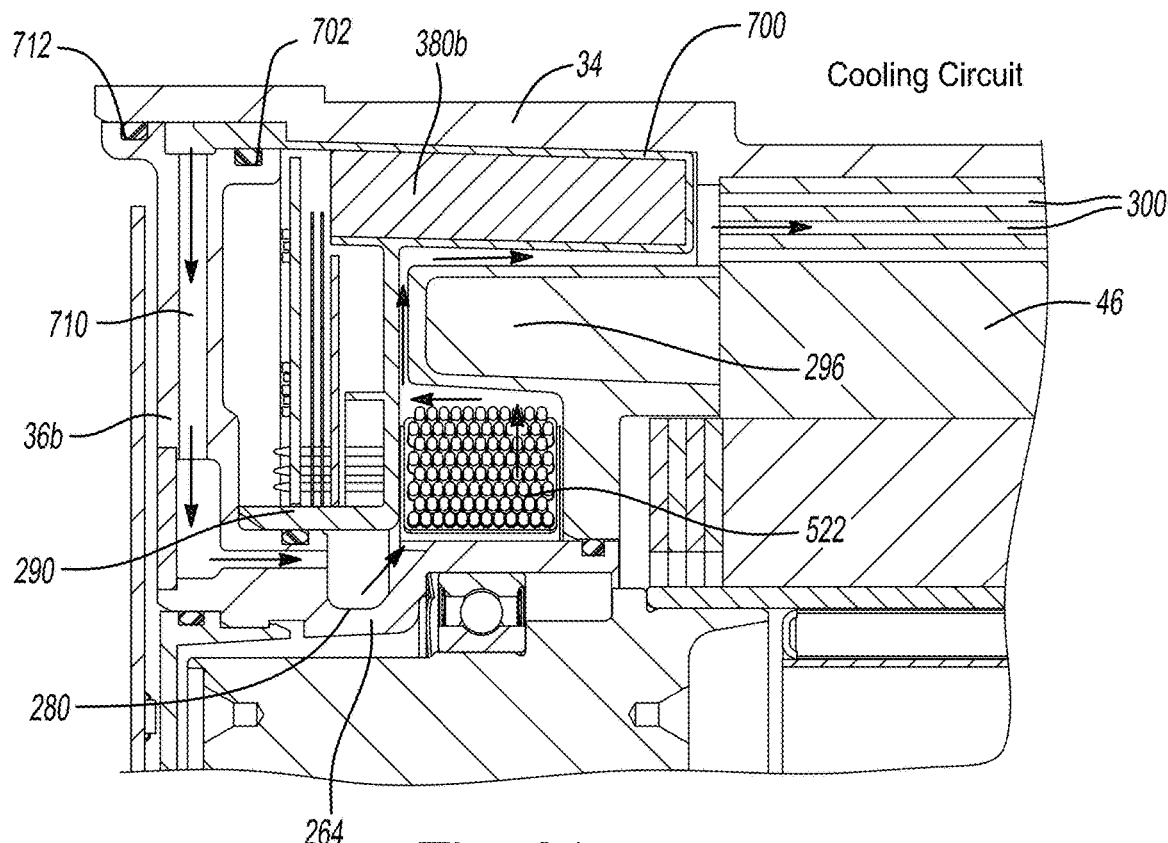
Figure 62:
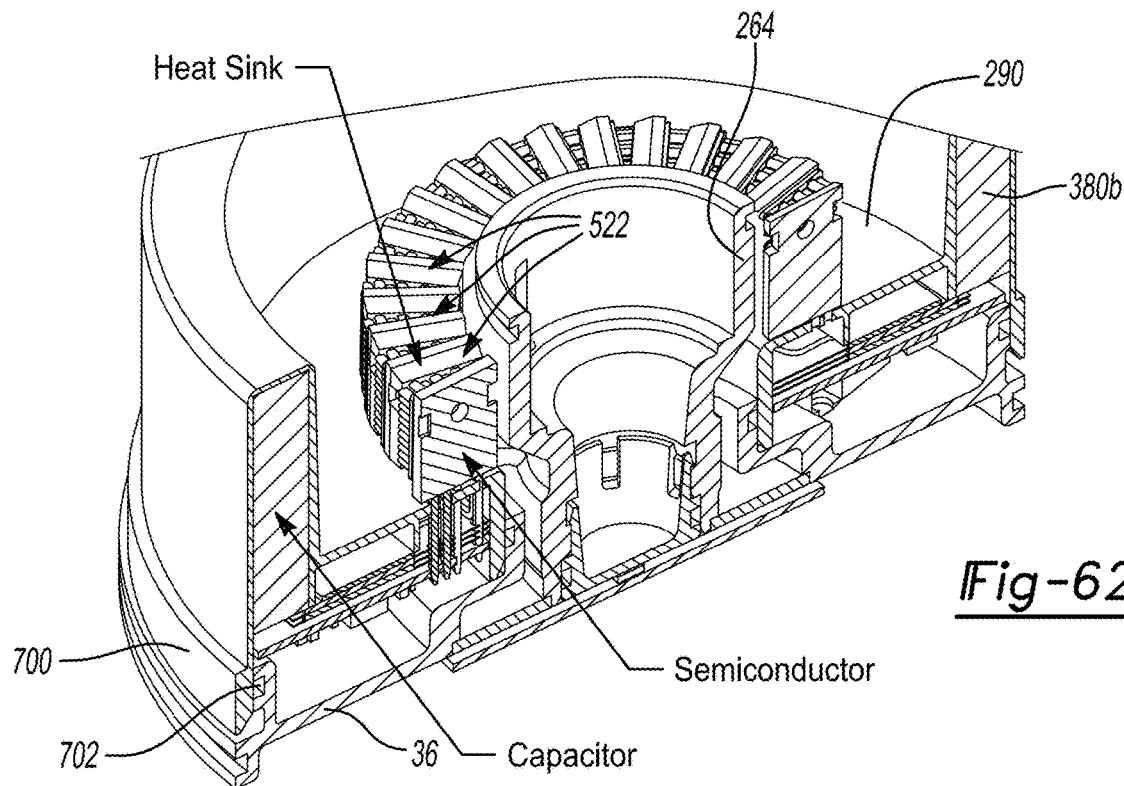
FIG. 62 is a perspective, partly sectioned view of a portion of the inverter that is shown in FIGS. 60 and 61.

With reference to FIGS. 61 and 62, a cooling channel 710 is formed in the motor cover 36b and receives a flow of coolant/lubricant that is fed between a pair of seal members 702 and 712 that are mounted to the motor cover 36b and engaged to the encapsulant material 700 and the motor housing 34, respectively. Fluid is discharged from the cooling channel 710 into the fluid distribution groove 280 in the bearing holder 264. It will be appreciated that the fluid in the fluid distribution groove 280 can travel through the heat-sinked power semiconductor assemblies 522, about the field windings 296 and into the cooling channels 300 in the stator 46.

Figure 63:
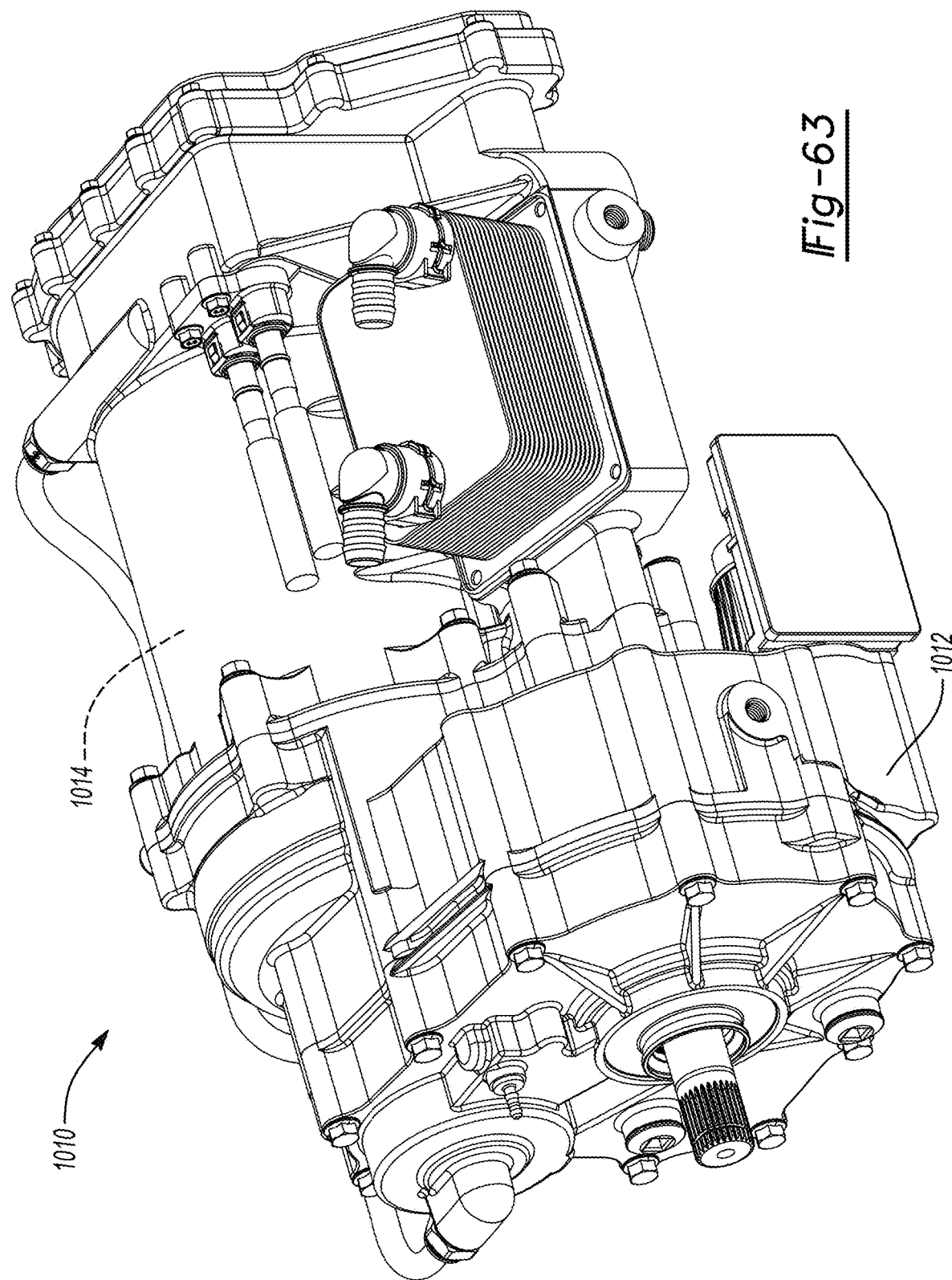
FIG. 63 is a perspective view of another exemplary electric drive unit constructed in accordance with the teachings of the present disclosure.
Figure 64:
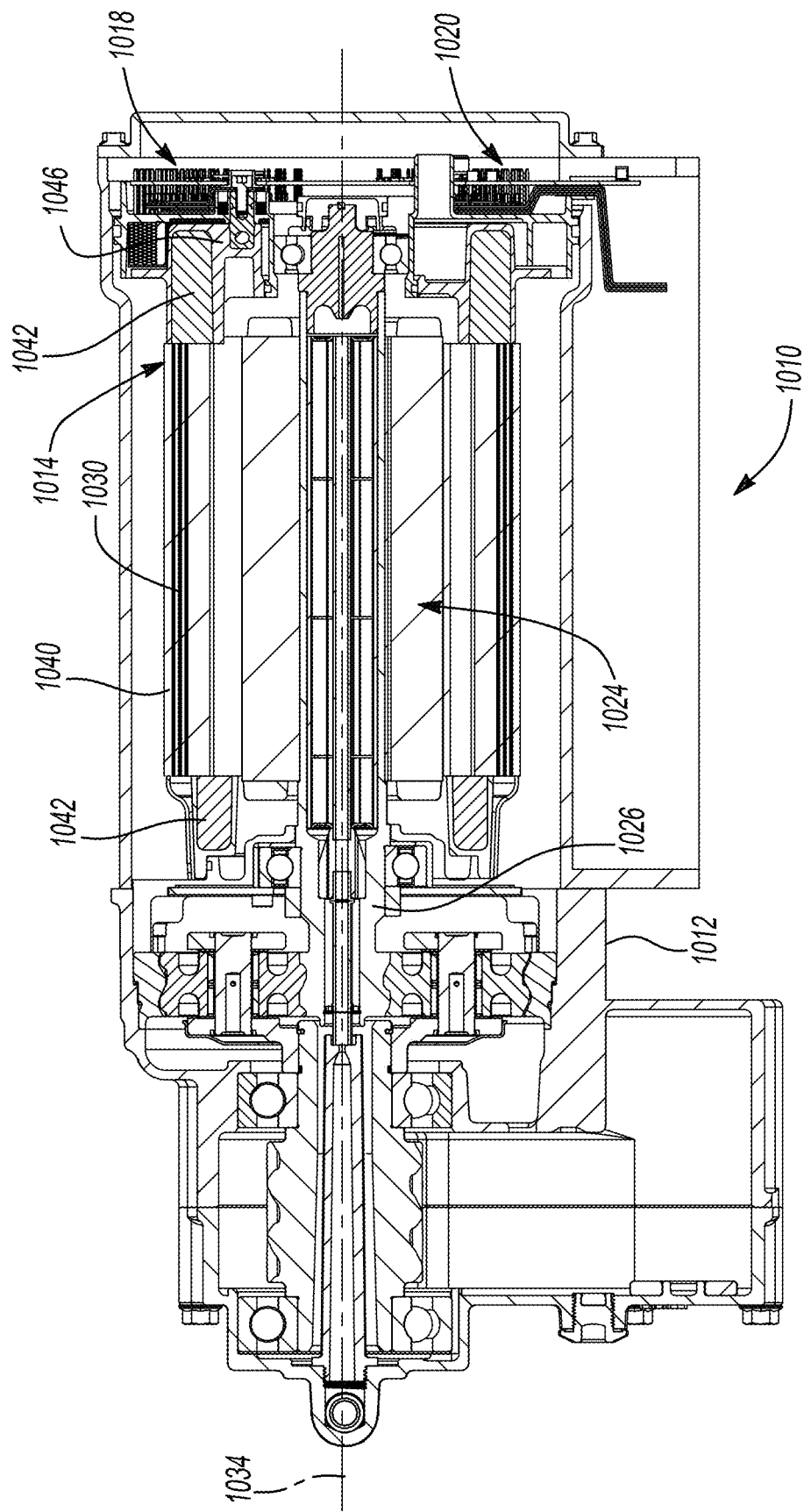
FIG. 64 is a longitudinal section view of the electric drive unit of FIG. 63 taken along a motor axis.

With reference to FIGS. 63 and 64 of the drawings, another exemplary electric drive unit (EDU) constructed in accordance with the teachings of the present disclosure is generally indicated by reference numeral 1010. Except as described herein, the EDU 1010 can be configured in a manner that is similar to that of the electric drive unit that is illustrated and described in detail in U.S. Provisional Patent Application No. 63/161,164 filed Mar. 15, 2021, the disclosure of which is incorporated by reference as if fully set forth in detail herein. The EDU 1010 includes a housing 1012 and a motor assembly 1014 that is received in the housing 1012 and which has an electric motor 1016 and a motor control unit 1018 that includes an inverter 1020. The electric motor 1016 includes a rotor 1024, a motor output shaft 1026 and a stator 1030. The rotor 1024 is rotatable relative to the stator 1030 about a motor axis 34. The motor output shaft 1026 is coupled to the rotor 1024 for rotation therewith.

With reference to FIGS. 64 through 67, the stator 1030 includes a stator core 1040, a plurality of windings 1042, a plurality of phase terminals 1044 and a cap 1046. The windings 1042 are wound about the stator core 1040 and are segregated into several phases.

Each phase terminal 1044 is mechanically and electrically coupled to an associated phase of the windings 1042. In the example provided, an end 1048 of a phase of the windings 1042 is received into a winding aperture 1052 in a respective one of the phase terminals 1044. In the example shown, the winding aperture 1052 is transverse to the longitudinal axis of the phase terminal 1044 and the end of the phase of the windings 1042 is physically and electrically coupled (e.g., soldered) to the phase terminal 1044. The phase terminal 1044 can further include an anti-rotation feature, such as knurling 1056, a seal groove 1058 and a connecting feature 1060. The seal groove 1058 can be configured to receive an associated seal, such as an O-ring 1062, that can form a seal between the phase terminal 1044 and the inverter 1020. The connecting feature 1060 aids in fixedly and electrically coupling the phase terminal 1044 to the inverter 1020. In the example provided, the connecting feature 1060 is a threaded aperture that is configured to receive a threaded fastener 1066.

The cap 1046 can be a discrete component that can be formed in a suitable process, such as injection molding, and can be fitted over the windings 1042. The cap 1046 defines a plurality of pockets 1070, each of which being disposed about a respective one of the phase terminals 1044. The material that is used to form the cap 1046 is an electrically insulating material but also has relatively good thermally conductive properties. A suitable material, such as an epoxy material 1072, can be injected between the windings 1042 and the cap 1046 and can fill the pockets 1070 to a desired extent to seal between the interior surface of each of the pockets 1070 and an associated one of the phase terminals 1044. It will be appreciated that the phase terminals 1044 are partly encased in the epoxy material 1072. More specifically, the knurling 1056 on each phase terminal 1044 is encased in the epoxy material 1072. The knurling 1056 and the epoxy material 1072 cooperate to resist relative rotation between the phase terminal 1044 and the cap 1046.

Figure 65:
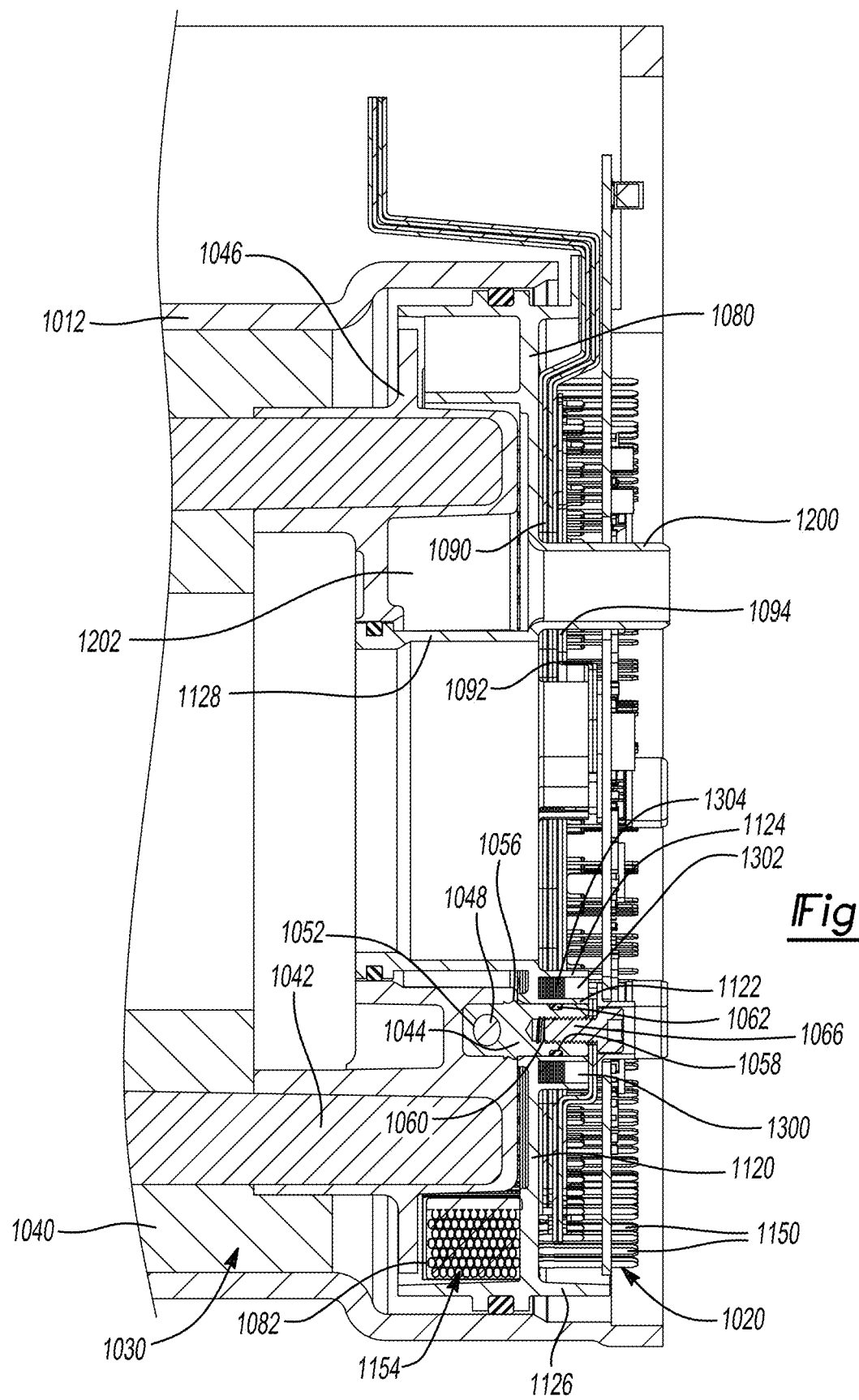
FIG. 65 is an enlarged portion of FIG. 64, showing a portion of an inverter of a motor control unit in more detail.
Figure 66:
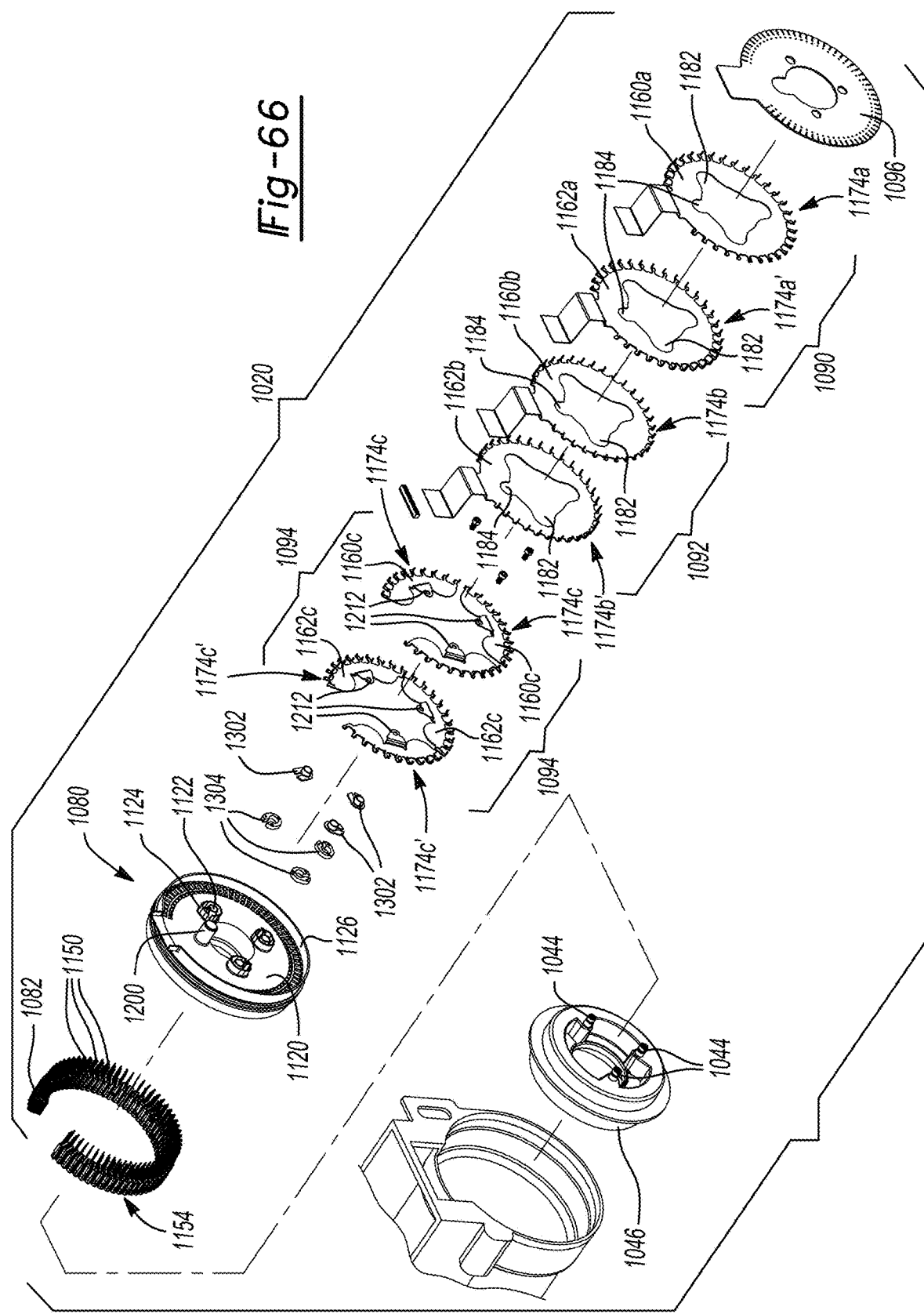
FIG. 66 is an exploded perspective view of a portion of the electric drive unit of FIG. 63, the view illustrating a portion of the inverter in more detail.
Figure 67:
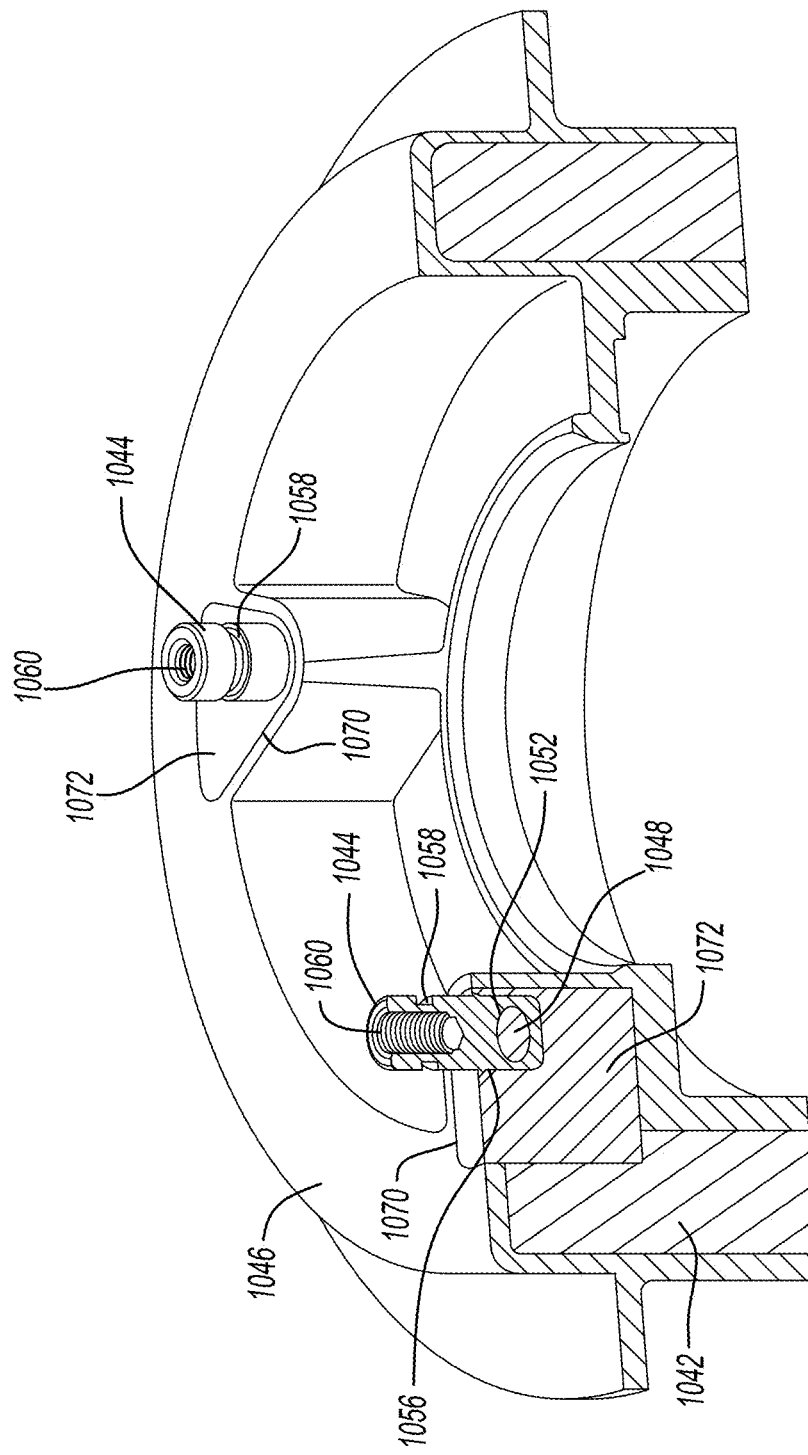
FIG. 67 is a perspective section view of a portion of the electric drive unit of FIG. 63, the view illustrating a cap and phase terminals of an electric motor.
Figure 68:
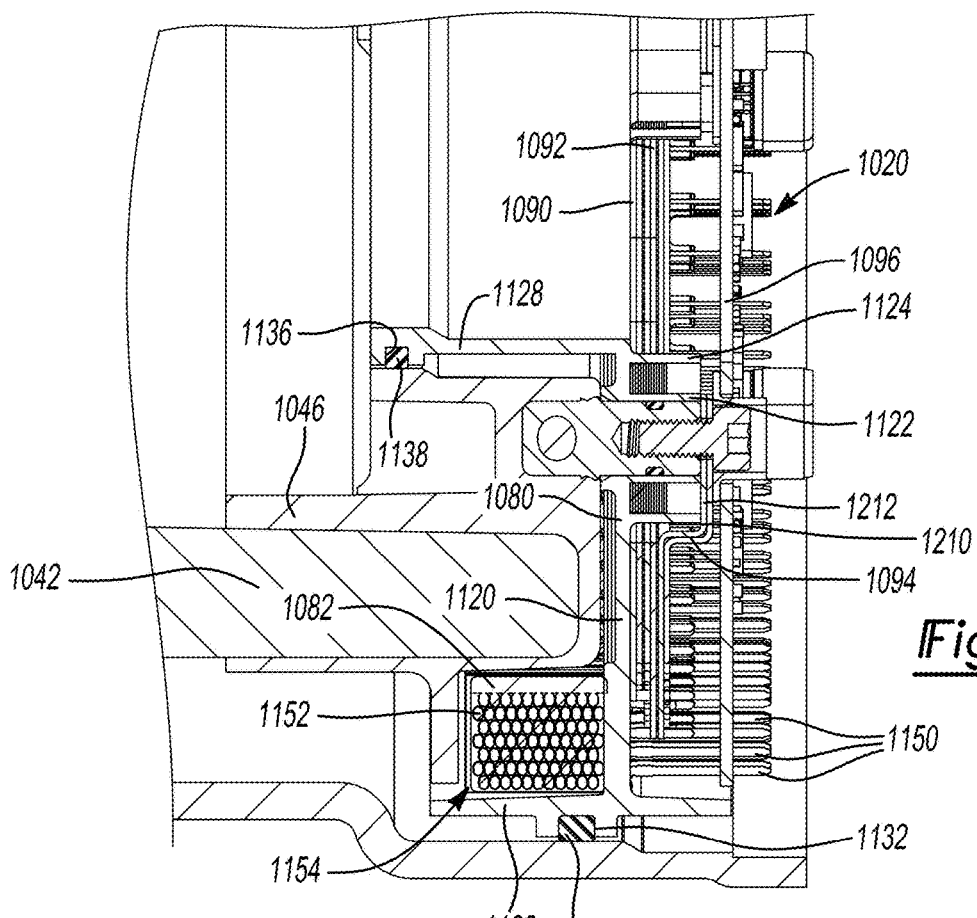
FIG. 68 is an enlarged portion of FIG. 66.

With reference to FIGS. 65, 66 and 68, a portion of the inverter 1020 is shown in more detail. The inverter 1020 includes an inverter mount 1080, a plurality of power semiconductors 1082, a plurality of busbars (e.g., positive busbar 1090, ground busbar 1092, and a plurality of phase busbars 1094), a plurality of insulating layers (not specifically shown), and an inverter circuit board 1096. The inverter 1020 controls the frequency of power supplied to the electric motor 1016. More specifically, the inverter 1020 employs the power semiconductors 1082, which can be MOSFET's or IGBT's, for example, to control the switching of DC electricity to create three AC electric outputs, with each AC electric output being associated with a given phase of the windings 1042 of the stator 1030. Each phase of the windings 1042 is fixedly and electrically coupled to a bridge member 1212 on an associated one of the phase busbars 1094 in the inverter 1020.

The inverter mount 1080 can include a base 1120, a plurality of terminal receptacles 1122, a plurality of sensor receptacles 1124, a first side wall 1126 and a second side wall 1128. The base 1120 can have a generally annular configuration. A first axial side or face of the base 1120 can have a radially outer portion that is somewhat thicker than a central portion that is disposed radially inwardly of the radially outer portion. A second, opposite side or face of the base 1120 can be flat. The base 1120 can define a plurality of semiconductor mounts (not specifically shown) that can be formed into the radially outer portion on the first face of the base 1120. Each of the semiconductor mounts can define a plurality of semiconductor terminal apertures (not specifically shown). The semiconductor mounts can be disposed in any desired arrangement, but in the particular example provided, the semiconductor mounts are disposed in a ring-shaped arrangement about the outer perimeter of the base 1120. Each of the terminal receptacles 1122 defines an aperture, which is formed through the base 1120, and can have a first portion, which is located on the central portion of the base 1120 and which extends axially away from the first face of the base 1120, and a second portion that extends axially away from the second face of the base 1120. In the example shown, each of the terminal receptacles 1122 is a generally tubular structure that is disposed on the central portion of the base 1120. The terminal receptacles 1122 can be spaced circumferentially apart from one another. Each of the sensor receptacles 1124 can extend from the second face of the base 1120 and can be disposed about an associated one of the terminal receptacles 1122. The first and second sidewalls 1126 and 1128 can be fixedly coupled to the base 1120 and can encircle the outer perimeter and the inner perimeter, respectfully, of the base 1120. The first side wall 1126 can extend from the first face of the base 1120 by a first distance and from the second face of the base 1120 by a second, relatively shorter distance. The second side wall 1128 can extend from the first face of the base 1120 by a third distance that can be relatively larger than the first distance. A first seal groove 1132 is formed about the first side wall 1126 and is configured to receive a first seal 1134 therein that sealingly engages the first side wall 1126 and the housing 1012. A second seal groove 1136 is formed about the second side wall 1128 and is configured to receive a second seal 1138 therein that sealingly engages the second side wall 1128 and the cap 1046.

Figure 69:
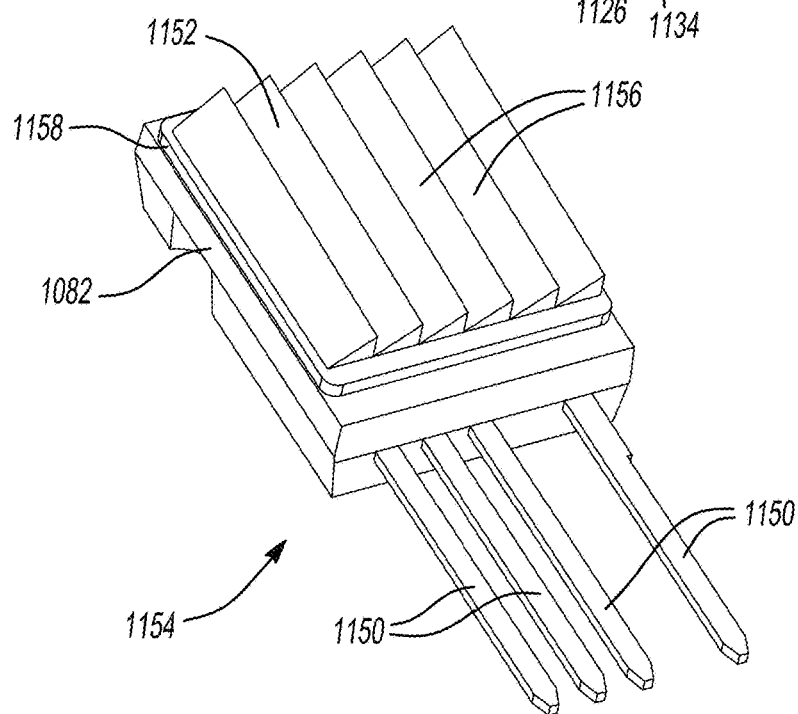
FIG. 69 is a perspective view illustrating a portion of the inverter of the electric drive unit of FIG. 63.

With reference to FIG. 69, each of the power semiconductors 1082 has a plurality of pins or terminals 1150 and is fixedly coupled to a respective heat sink 1152 to form a heat-sinked power semiconductor assembly 1154. The heat sink 1152 can be formed of a suitable thermally conductive material and can be electrically coupled to an associated one of the terminals 1150. As a non-limiting example, the heat sink 1152 could be formed of a metal material, such as aluminum, brass, bronze or copper. The heat sink 1152 can define a plurality of fins 1156 that can be employed to discharge heat into a flow of fluid passing through the fins 1156. The fins 1156 are schematically illustrated in the particular example provided.

Returning to FIGS. 66 and 68, each of the heat-sinked power semiconductor assemblies 1154 can be mounted in a respective one of the semiconductor mounts on the inverter mount 1080 such that each of the power semiconductors 1082 is received into a corresponding one of the power semiconductor recesses and the terminals 1150 on each of the power semiconductors 1082 are received through semiconductor terminal apertures in the inverter mount 1080. Configuration in the manner illustrated positions the power semiconductors 1082 radially outwardly of the windings 1042.

Figure 70:
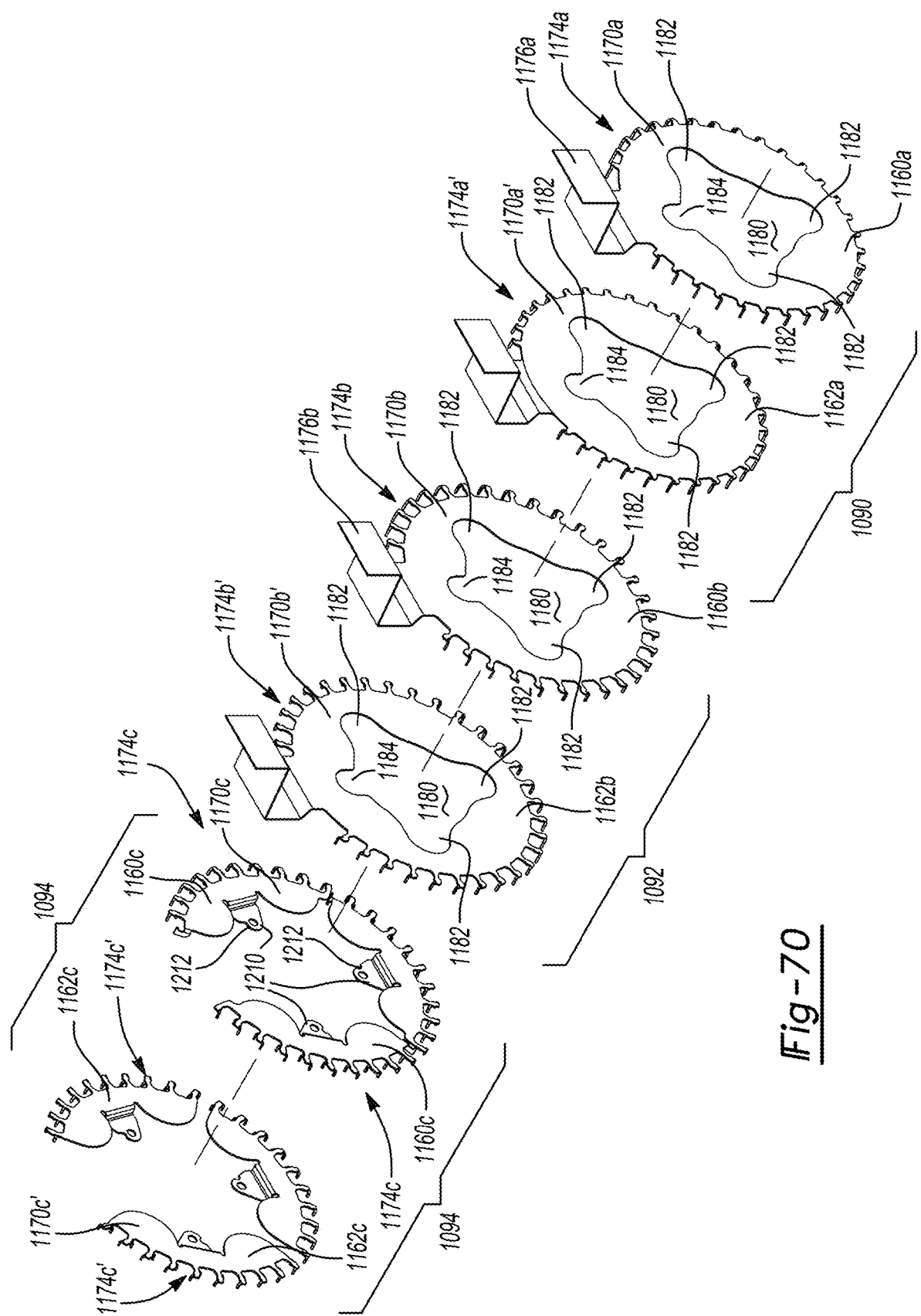
FIG. 70 is an exploded perspective view illustrating a positive busbar, a ground busbar and a plurality of phase busbars of the inverter of the electric drive unit of FIG. 63.

With reference to FIGS. 66, 68 and 70, the busbars and the insulating layers are stacked to form a busbar assembly in which an insulating layer is disposed between the positive busbar 1090 and the ground busbar 1092, and an insulating layer is disposed between the ground busbar 1092 and the phase busbars 1094. The insulating layers are formed of an electrically insulating material and electrically insulate axially adjacent busbars from one another.

Each of the positive and ground busbars 1090 and 1092 and each of the phase busbars 1094 includes a first busbar portion 1160a, 1160b and 1160c, respectively, and a second busbar portion 1162a, 1162b and 1162c, respectively, that are fixedly and electrically coupled to one another. Each of the second busbar portions 1162a, 1162b and 1162c can be generally similar in their construction to their associated first busbar portion 1160a, 1160b and 1162c, respectively, and as such, only the first busbar portions 1160a, 1160b and 1160c will be described in detail herein. Each of the first busbar portions 1160a, 1160b and 1160c can be formed of an electrically conductive material, such as copper, and can include a body 1170a, 1170b and 1170c, respectively, and a set of fingers 1174a, 1174b and 1174c, respectively. The first busbar portions 1160a and 1160b of the positive busbar 1090 and the ground busbar 1092 also include a conductor link 1176a and 1176b, respectively.

The bodies 1170a and 1170b of the positive busbar 1090 and the ground busbar 1092 can have an annular shape, while the body 1170c of each phase busbar 1094 can be shaped as an annular segment. The bodies 1170a, 1170b and 1170c are sized to be received over the second side wall 1128 of the inverter mount 1080 and within the first side wall 1126 of the inverter mount 1080. The outer circumference of the annular bodies 1170a, 1170b and 1170c can be disposed radially inwardly of the semiconductor terminal apertures in the inverter mount 1080.

The annular bodies 1170a and 1170b can define a central aperture 1180, a plurality of terminal apertures 1182 and a cooling standpipe aperture 1184 that are formed through the annular body 1170. The terminal apertures 1182 can be received over the terminal receptacles 1122 (FIG. 65) and the sensor receptacles 1124 (FIG. 65), while the cooling standpipe aperture 1184 can be received over a cooling standpipe 1200 that is integrally formed with the inverter mount 1080. The cooling standpipe 1200 is configured to direct coolant through the inverter mount 1080 to a coolant chamber 1202 (FIG. 65) that is disposed between the inverter mount 1080 and the cap 1046. Heat from the power semiconductor assemblies 1154 and the windings 1042 can be transmitted to the coolant in the coolant chamber 1202 (FIG. 65) to thereby cool the inverter 1020 and the electric motor 1016 (FIG. 64). The conductor links 1176a and 117b can extend radially outwardly from the annular body 1170a and 1170b and can be configured to extend over the inverter mount 1080 and disposed at locations where they can be electrically coupled to an associated terminal (not shown) of a capacitor (not shown). A bridge 1210 can be coupled to the radially inner side of the body 1170c of each of the phase busbars 1094. The bridge 1210 has a bridge member 1212 that is parallel to but spaced apart from the body 1170c. A terminal aperture is formed through the bridge member 1212. The bridge 1210 can be fixedly coupled to the body 1170c in any desired manner, but in the particular example provided the bridge 1210 is integrally and unitarily formed with the body 1170c.

Each of the sets of fingers 1174a, 1174b and 1174c comprises a plurality of fingers that are configured to mechanically and electrically couple a terminal 1150 (FIG. 69) of an associated one of the power semiconductors 1082 to an associated one of the positive, ground and phase busbars 1090, 1092 and 1094.

Figure 71:
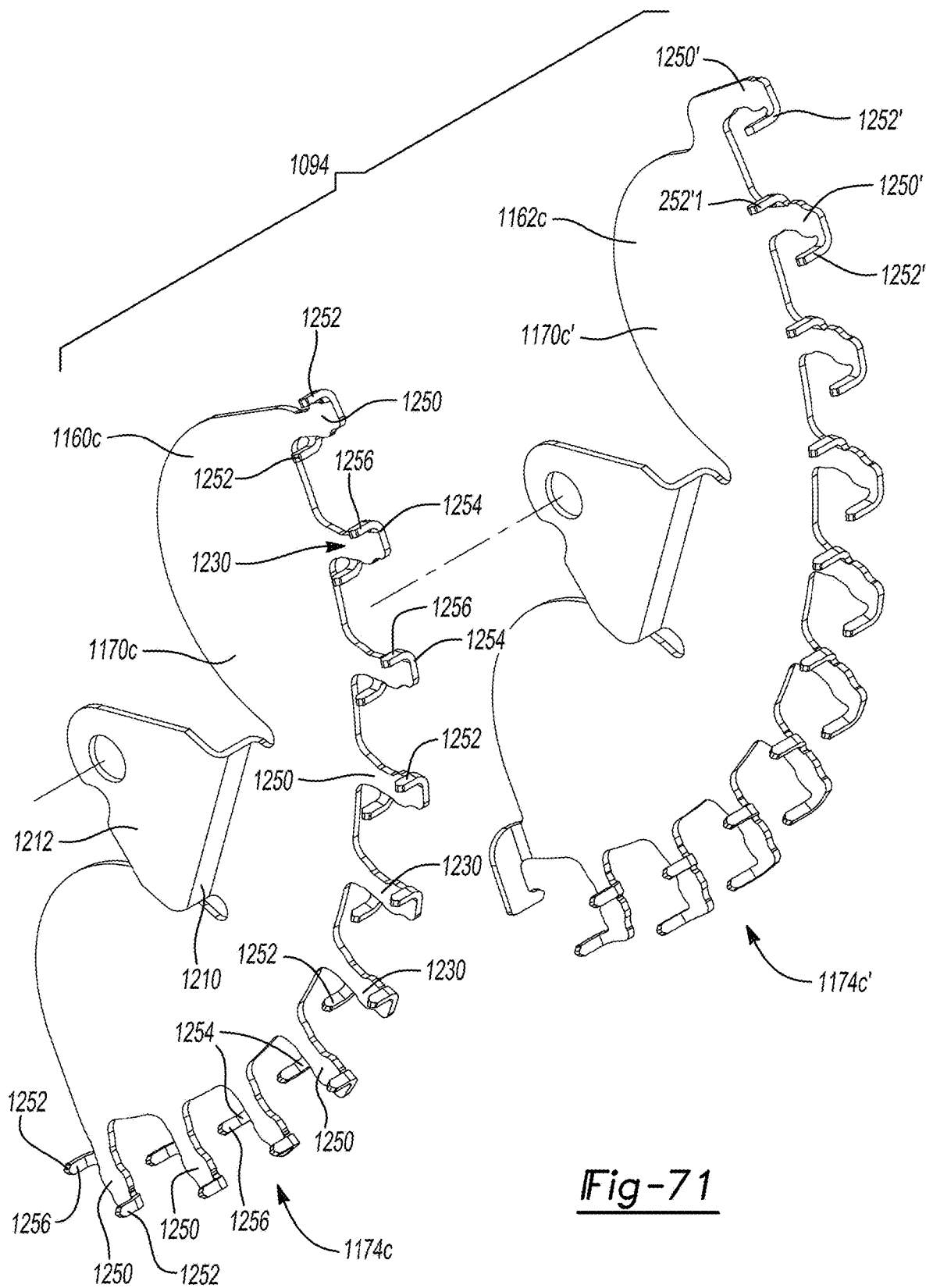
FIG. 71 is an exploded perspective view of one of the phase busbars that is illustrated in FIG. 70.
Figure 72:
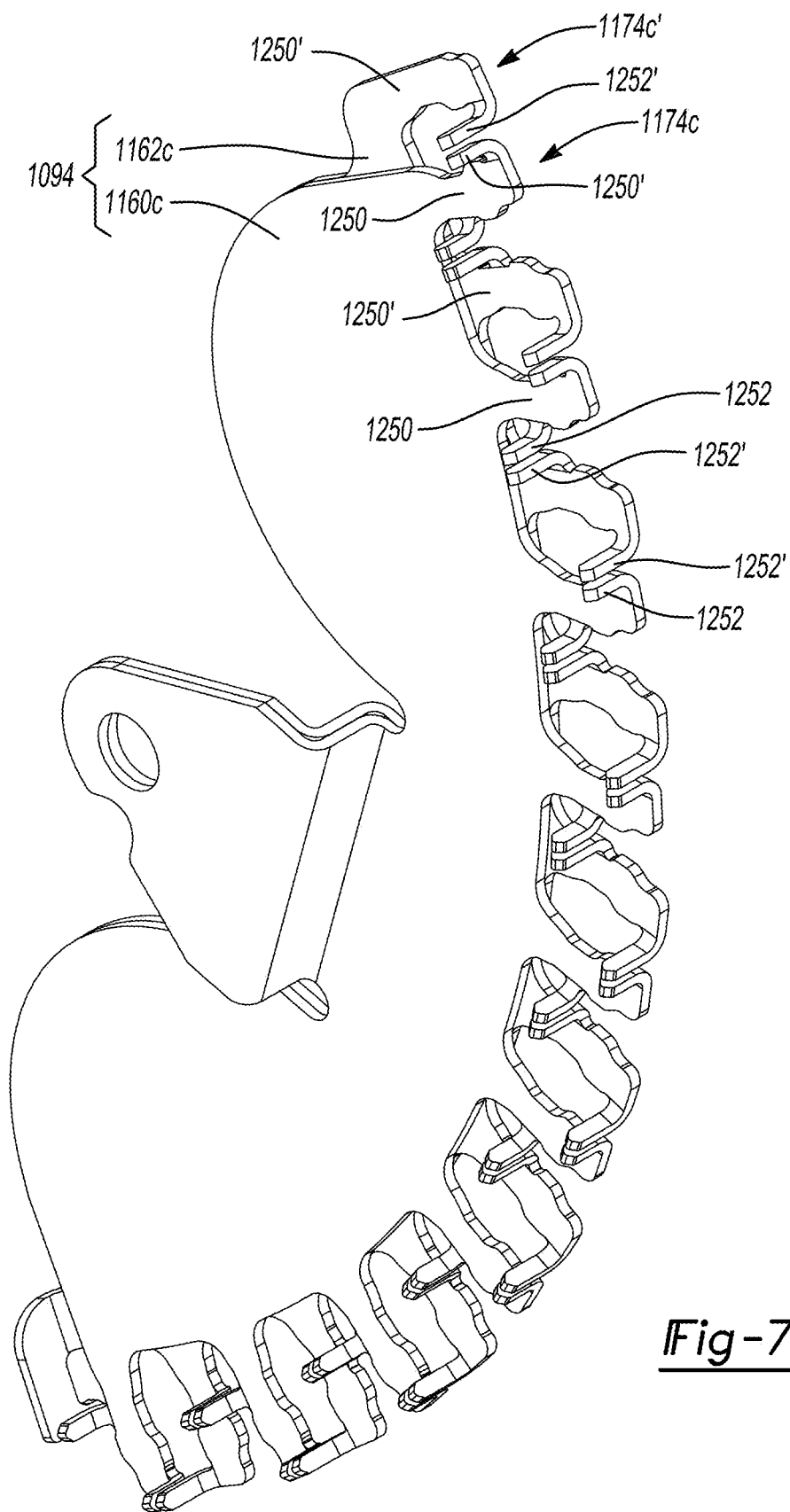
FIG. 72 is a perspective view of the phase busbar of FIG. 71.

With reference to FIGS. 71 and 72, each of the fingers (e.g., fingers 1230) in a set of fingers (e.g., fingers 1174c) can having a first portion 1250, which can extend radially outwardly from the body (e.g., body 1170c), and at least one second portion 1252 that is configured to be mechanically and electrically coupled to a respective terminal 1150 (FIG. 69) on an associated one of the power semiconductors 1082 (FIG. 69). In the example shown, each of first portions 1250 is disposed in a plane in which the body (e.g., body 1170c) is disposed, each of the first portions 1250 is spaced circumferentially apart about the outside perimeter of the body (e.g., body 1170c), a pair of second portions 1252 is coupled to each of the first portions 1250, and each of the second portions 1252 is generally L-shaped, having a leg 1254 that extends from a respective one of the first portions 1250 and an arm 1256 that extends from the leg 1254 in a direction that is perpendicular to the leg 1254.

With reference to FIGS. 69 through 72, the sets of fingers 1174a, 1174b, 1174c on the first portions 1160a, 1160b and 1160c of the positive, ground and phase busbars 90, 92 and 94 can be generally similar in their configuration. The relative length of the first portions 1250 and the positioning of the second portions 1252 is configured so that each of the sets of fingers 1174a, 1174b and 1174c is configured to engage a respective set of terminals on the power semiconductors 1082. The set of fingers 1174a of the first portion 1160a of the positive busbar 1090 are configured to be mechanically and electrically coupled to a first one of the terminals 1150 on the power semiconductors 1082, the set of fingers 1174b of the first portion 1160b of the ground busbar 1092 are configured to be mechanically and electrically coupled to a second one of the terminals 1150 on the power semiconductors 1082, and the sets of fingers 1174c of the first portion 1160c of the phase busbars 1094 are configured to be mechanically and electrically coupled to a third one and a fourth one of the terminals 1150 on the power semiconductors 1082. It will be appreciated that the sets of fingers 1174a, 1174b and 1174c are staggered both in a circumferential direction and in a radial direction to avoid direct electrical coupling between two or more of the busbars.

Each of the second busbar portions 1162a, 1162b and 1162c can be generally similar to its associated first busbar portion 1160a, 1160b and 1160c, respectively, except for the configuration of the sets of fingers 1174a', 1174b' and 1174c'. More specifically, the fingers of each of the sets of fingers 1174a', 1174b' and 1174c' are offset from the fingers of the sets of fingers 1174a, 1174b and 1174c in a circumferential direction and a second portion 1252' of each of the fingers of the sets of fingers 1174a', 1174b' and 1174c' faces a second portion 1252 of an associated one of the fingers of the sets of fingers 1174a, 1174b and 1174c. Construction in this manner permits each terminal 1150 on each power semiconductor 1082 to be mechanically and electrically coupled to a second portion (e.g., second portion 1252) of a finger on a first busbar portion (e.g., first busbar portion 1160c) and to a second portion (e.g., second portion 1252') on a finger on a second busbar portion (e.g., second busbar portion 1162c).

With reference to FIGS. 65, 66 and 68, the positive busbar 1090 can be received within the first side wall 1126 in the inverter mount 1080 such that the positive busbar 1090 is abutted against the second side of the base 1120 and each adjacent pair of fingers of the sets of fingers 1174a and 1174a' is engaged to a first one of the terminals 1150 on a respective one of the power semiconductors 1082. A first electrically insulating member can be disposed over the positive busbar 1090. The ground busbar 1092 can be received within the first side wall 1126 in the inverter mount 1080 such that the ground busbar 1092 is abutted against a side of the first electrically insulating member that is opposite the positive busbar 1090 and each adjacent pair of fingers of the sets of fingers 1174b and 1174b' is engaged to a second one of the terminals 1150 on a respective one of the power semiconductors 1082. A second electrically insulating member can be disposed over the ground busbar 1092. Each of the phase busbars 1094 can be positioned within the first side wall 1126 and abutted against the second insulator on a side of the second insulator that is opposite the ground busbar 1092 and each adjacent pair of fingers of the sets of fingers 1174c and 1174c' is engaged to either third or fourth one of the terminals 1150 on a respective one of the power semiconductors 1082. The positive busbar 1090, the ground busbar 1092 and each of the phase busbars 1094 can be oriented relative to the inverter mount 1080 such that the terminal receptacles 1122 and an adjacent one of the sensor receptacles 1124 are received through each of the terminal apertures 1182 and the cooling standpipe aperture 1184 is received over the cooling standpipe 1200.

It will be appreciated that assembly of the several busbars to the power semiconductors in this manner will position the distal ends (i.e., arms 1256 (FIG. 71)) of each adjacent pair of the fingers in abutment with an associated one of the terminals 1150 on an associated one of the power semiconductors 1082. Thereafter, the distal ends of the fingers can be fixedly and electrically coupled to the terminals 1150, for example by resistance welding or resistance soldering adjacent pairs of them to the terminals 1150.

In FIGS. 65 and 66, the motor control unit 42 (FIG. 64) includes a plurality of current sensors 1300, each of which being associated with a corresponding set of the terminal receptacles 1122, the sensor receptacles 1124, and the bridges 1210 on the phase busbars 1094. Each of the current sensors 1300 comprises a sensor 1302 and a plurality of C-shaped sensor laminations 1304. The sensor 1302 can be an eddy current sensor and can be received in the sensor receptacle 1124. The sensor laminations 1304 are abutted against one another and are received about an associated one of the terminal receptacles 1122 and axially between the windings 1042 and the bridge member 1212 on an associated one of the phase busbars 1094. Accordingly, the open ends of the C-shaped sensor laminations 1304 can straddle the portion of the sensor receptacle 1124 where the sensor 1302 is located.

The terminals 1150 of the power semiconductors 1082 and the terminals of the sensor 1302 are received into the inverter circuit board 1096 and can be electrically coupled to other componentry of the inverter circuit board 1096 in a desired manner. The phase terminals 1044 are received into the terminal receptacles 1122 and the seal 62 that is disposed in the seal groove 1058 in each of the phase terminals 1044 forms a seal between the phase terminal 1044 and the inverter mount 1080 that inhibits the flow of fluid therethrough. The threaded fastener 66 is received through the fastener aperture in the bridge member 1212 and is threadably engaged to the connecting feature 1060 to fixedly and electrically couple the phase terminal 1044 to the phase busbar 1094.

During operation of the electric motor 40 (FIG. 64), current passing from the bridge member 1212 of the phase busbar 1094 to the phase terminal 1044 will generate a magnetic field that will correspondingly generate eddy currents in the sensor laminations 1304. The sensor 1302 is configured to sense the eddy currents in the sensor laminations 1304 and responsively generate a sensor signal that is indicative of a magnitude of eddy currents in the sensor laminations. Significantly, the current sensor 1302 is positioned in as close a proximity to the interface between the phase busbar 1094 and the phase terminal 1044 as is possible. When configured in this manner, the phase terminals 1044 are disposed radially inwardly of the positive and ground busbars 1090 and 1092, and the current sensors 1300 are disposed radially inwardly of the power semiconductors 1082.

Figure 73:
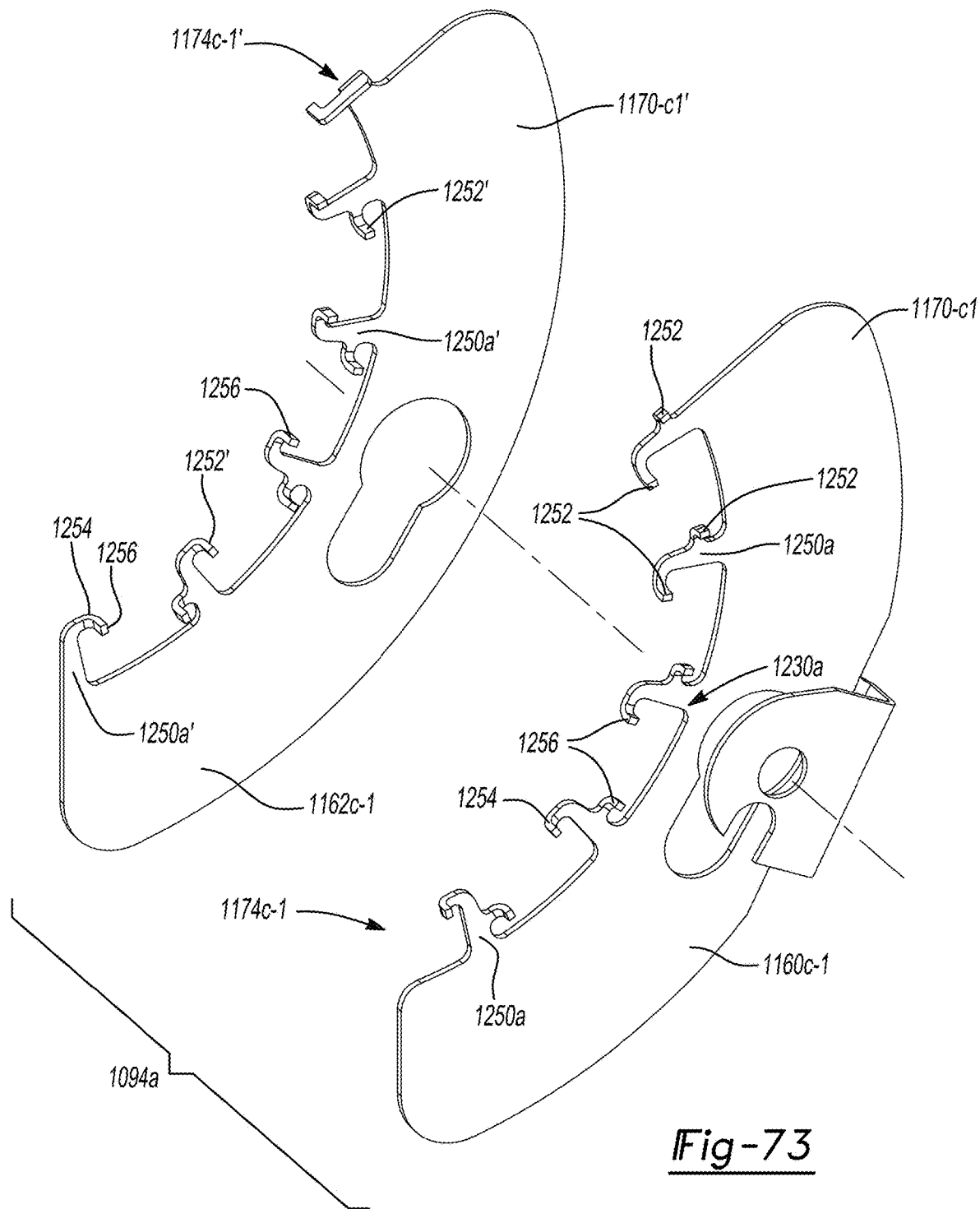
FIG. 73 is an exploded perspective view similar to that of FIG. 71 but depicting an alternately configured phase busbar.

While the inverter 1020 has been illustrated and described as including power semiconductors 1082 that are disposed about an outer perimeter of the several busbars, it will be appreciated that the teachings of the present disclosure have application to inverters that are configured somewhat differently, such as a configuration where the power semiconductors are disposed about an inner perimeter of the several busbars. With reference to FIGS. 73 and 74, an exemplary phase busbar 1094a is illustrated to include first and second busbar portions 1160c-1 and 1162c-1, respectively, that each include sets of fingers 1174c-1 and 1174c-1', respectively that are disposed about an inside perimeter of the bodies 1170c-1 and 1170c-1', respectively, of the first and second busbar portions 1160c-1 and 1162c-1.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electric drive unit comprising:
an electric motor having a stator and a rotor, the stator including a stator core, and a plurality of field windings, the stator core defining a plurality of stator cooling passages that extend longitudinally through the stator core, each of the field windings being associated with a corresponding phase of electrical power, the field windings having a protruding portion that extend from an axial end of the stator core, the rotor being rotatable relative to the stator about a motor axis; and
a housing assembly into which the electric motor is received, the housing assembly having a motor housing and a motor housing cover, the motor housing having an annular wall member that is disposed about the stator core, the motor housing cover being mounted to the motor housing to close an end of the motor housing;

a bearing holder coupled to the motor housing cover;

a bearing received between the bearing holder and the rotor for supporting the rotor for rotation about the motor axis;

an inverter mount having an annular side wall, the annular side wall being coaxially disposed about a portion of the rotor and being received within the housing assembly along the motor axis between the stator core and the motor housing cover, the inverter mount defining a cooling fluid passage that is in fluid communication with the stator cooling passages;

a first seal member received on the bearing holder and forming a seal between the annular side wall and the bearing holder.

2. The electric drive unit of claim 1, further comprising a second seal member disposed between and sealingly engaging the inverter mount and the annular wall.

3. The electric drive unit of claim 2, wherein the inverter mount defines a seal groove into which the second seal member is received.

4. The electric drive unit of claim 1, further comprising a plurality of power semiconductors and a plurality of heat sinks, each of the power semiconductors being mounted to the inverter mount and being disposed about the bearing holder, each of the heat sinks being mounted to a corresponding one of the power semiconductors and being disposed in the coolant chamber.

5. The electric drive unit of claim 4, further comprising plurality of bus bars including a positive bus bar, a negative bus bar and a plurality of phase bus bars, the bus bars being electrically coupled to the power semiconductors, each of the phase bus bars being electrically coupled to an associated one of the field windings, wherein the inverter mount has a base that segregates the coolant chamber from an annular cavity into which the busbars are received.

6. The electric drive unit of claim 4, wherein the power semiconductors are disposed radially outwardly of the protruding portion of the field windings.

7. The electric drive unit of claim 4, wherein an annular field capacitor is disposed radially outwardly of the protruding portion of the field windings.

8. The electric drive unit of claim 1, wherein the inverter mount defines a coolant standpipe through which the cooling fluid passage is formed.

* * * * *